(12) United States Patent
Iida et al.

(10) Patent No.: US 9,240,321 B2
(45) Date of Patent: Jan. 19, 2016

(54) MASK HAVING SEPARATED LINE PATTERNS CONNECTED BY A CONNECTING PATTERN

(71) Applicant: Kabushiki Kaisha Toshiba, Minato-ku (JP)

(72) Inventors: Kazunori Iida, Yokkaichi (JP); Yuji Kobayashi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/096,619

(22) Filed: Dec. 4, 2013

(65) Prior Publication Data

US 2015/0037977 A1 Feb. 5, 2015

Related U.S. Application Data

(60) Provisional application No. 61/862,167, filed on Aug. 5, 2013.

(51) Int. Cl.
*G03F 1/00* (2012.01)
*H01L 21/033* (2006.01)
*H01L 21/311* (2006.01)
*H01L 23/532* (2006.01)

(52) U.S. Cl.
CPC ...... *H01L 21/0337* (2013.01); *H01L 21/31144* (2013.01); *H01L 23/53223* (2013.01); *H01L 23/53238* (2013.01); *H01L 23/53266* (2013.01); *H01L 2924/0002* (2013.01)

(58) Field of Classification Search
CPC .............................. H01L 21/033; H01L 23/532

USPC ................................ 438/666.671, 675; 430/5
See application file for complete search history.

(56) References Cited

U.S. PATENT DOCUMENTS

| 2006/0189147 | A1* | 8/2006 | Shiobara et al. | 438/725 |
|---|---|---|---|---|
| 2007/0026657 | A1* | 2/2007 | Lee | 438/597 |
| 2007/0128526 | A1* | 6/2007 | Wallace et al. | 430/5 |
| 2007/0195295 | A1* | 8/2007 | Fujisawa et al. | 355/53 |
| 2007/0224519 | A1* | 9/2007 | Sivakumar et al. | 430/5 |
| 2007/0281219 | A1* | 12/2007 | Sandhu | 430/5 |
| 2007/0281220 | A1* | 12/2007 | Sandhu et al. | 430/5 |
| 2008/0107974 | A1* | 5/2008 | Douzaka et al. | 430/5 |
| 2008/0261395 | A1* | 10/2008 | Blawid et al. | 438/666 |
| 2009/0029559 | A1* | 1/2009 | Kang | 438/735 |
| 2010/0159617 | A1* | 6/2010 | Kobayashi | 438/7 |
| 2010/0187658 | A1* | 7/2010 | Wei | 257/618 |
| 2010/0291476 | A1* | 11/2010 | Liu | 430/5 |

(Continued)

FOREIGN PATENT DOCUMENTS

| JP | 2006-156657 | 6/2006 |
|---|---|---|
| JP | 2012-204358 | 10/2012 |
| JP | 2012-204453 | 10/2012 |

*Primary Examiner* — Caleb Henry
(74) *Attorney, Agent, or Firm* — Oblon, McClelland, Maier & Neustadt, L.L.P

(57) ABSTRACT

According to one embodiment, a mask includes a line-and-space mask pattern. The mask has a separation portion separating a line pattern in a predetermined region within the line-and-space mask pattern. The mask also includes a connection pattern arranged in a crossing direction crossing the extending direction of the line pattern connecting the separated line patterns. The connection pattern is arranged on a position where the end of the line pattern, which is separated by the separation portion, projects from the connection pattern.

7 Claims, 65 Drawing Sheets

(56) References Cited

U.S. PATENT DOCUMENTS

| | | |
|---|---|---|
| 2011/0111330 A1* | 5/2011 | Schultz et al. .................... 430/5 |
| 2011/0318672 A1* | 12/2011 | Ogadhoh et al. ................. 430/5 |
| 2012/0244696 A1 | 9/2012 | Nagashima |
| 2013/0052835 A1* | 2/2013 | Kobayashi ................... 438/758 |
| 2014/0030894 A1* | 1/2014 | Shin ............................... 438/703 |
| 2014/0065822 A1* | 3/2014 | Kobayashi ................... 438/671 |
| 2014/0065833 A1* | 3/2014 | Iida et al. ...................... 438/703 |
| 2014/0087563 A1* | 3/2014 | Sant et al. ..................... 438/702 |
| 2014/0255829 A1* | 9/2014 | Chang et al. ..................... 430/5 |
| 2015/0031198 A1* | 1/2015 | Miyoshi et al. ............... 438/594 |

\* cited by examiner

MASK HAVING SEPARATED LINE PATTERNS CONNECTED BY A CONNECTING PATTERN

CROSS-REFERENCE TO RELATED APPLICATIONS

This application is based upon and claims the benefit of priority from U.S. Provisional Application No. 61/862,167, filed on Aug. 5, 2013; the entire contents of which are incorporated herein by reference.

FIELD

Embodiments described herein relate generally to a mask and a pattern forming method.

BACKGROUND

A pattern having a resolution higher than a resolution limit of lithography is recently required due to scaling of a semiconductor memory. A sidewall transfer process has been proposed for a NAND flash memory, in particular, for solving this problem. By using this process, a pitch of the pattern, which is exposed at first, is reduced to a half, whereby a pattern with a pitch higher than the resolution limit of an exposure device can be formed.

Conventionally, the sidewall transfer process is applied to a damascene metal wiring formation process. In order to separate only a desired region of a line-and-space metal wiring formed by the sidewall transfer process, a cover pattern is formed to cover the region that is to be separated after the formation of the sidewall pattern, and then, a film to be processed is processed by using the sidewall pattern and the cover pattern as a mask. Thus, a channel for forming the metal wiring separated on the desired position is formed. A metal wiring is formed by embedding a metal into the channel for forming the metal wiring.

In this case, if the region to be separated includes only the line and space, a margin for the positional deviation during the lithography process is small, so that a cover pattern might cover an unnecessary region for separating the metal wiring.

BRIEF DESCRIPTION OF THE DRAWINGS

FIGS. 2A to 10A are top views illustrating one example of a pattern forming method according to the first embodiment;

FIGS. 2B to 10B are cross-sectional views of FIGS. 2A to 10A taken along a line A-A;

FIGS. 2C to 10C are cross-sectional views of FIGS. 2A to 10A taken along a line B-B;

FIGS. 2D to 10D are cross-sectional views of FIGS. 2A to 10A taken along a line C-C;

FIGS. 14A to 18A are top views illustrating one example of a pattern forming method according to a second embodiment;

FIGS. 14B to 18B are cross-sectional views of FIGS. 14A to 18A taken along a line D-D;

FIGS. 14C to 18C are cross-sectional views of FIGS. 14A to 18A taken along a line E-E;

FIGS. 14D to 18D are cross-sectional views of FIGS. 14A to 18A taken along a line F-F;

FIGS. 19A to 25A are top views illustrating one example of a pattern forming method according to a third embodiment;

FIGS. 19B to 25B are cross-sectional views of FIGS. 19A to 25A taken along a line D-D;

FIGS. 19C to 25C are cross-sectional views of FIGS. 19A to 25A taken along a line E-E;

FIGS. 19D to 25D are cross-sectional views of FIGS. 19A to 25A taken along a line F-F;

FIGS. 27A to 34A are top views illustrating one example of a pattern forming method according to the fourth embodiment;

FIGS. 27B to 34B are cross-sectional views of FIGS. 27A to 34A taken along a line G-G; and FIGS. 27C to 34C are cross-sectional views of FIGS. 27A to 34A taken along a line H-H.

DETAILED DESCRIPTION

In general, according to one embodiment, a mask having a mask pattern forming a line-and-space pattern on a subject to be processed is provided. The mask has a line-and-space mask pattern. The mask has a separation portion separating a line pattern in a predetermined region within the line-and-space mask pattern. The mask also includes a connection pattern arranged in a crossing direction crossing the extending direction of the line pattern connecting the separated line patterns. The connection pattern is arranged on a position where the end of the line pattern, which is separated by the separation portion, projects from the connection pattern.

Exemplary embodiments of the mask and the pattern forming method will be explained below in detail with reference to the accompanying drawings. The present invention is not limited to the following embodiments. The cross-sectional views of a wiring layer used in the following embodiments are schematic, and the relationship between the thickness and width of the layer and a ratio of a thickness of each layer might be different from the actual ones.

(First Embodiment)

Figure 1:
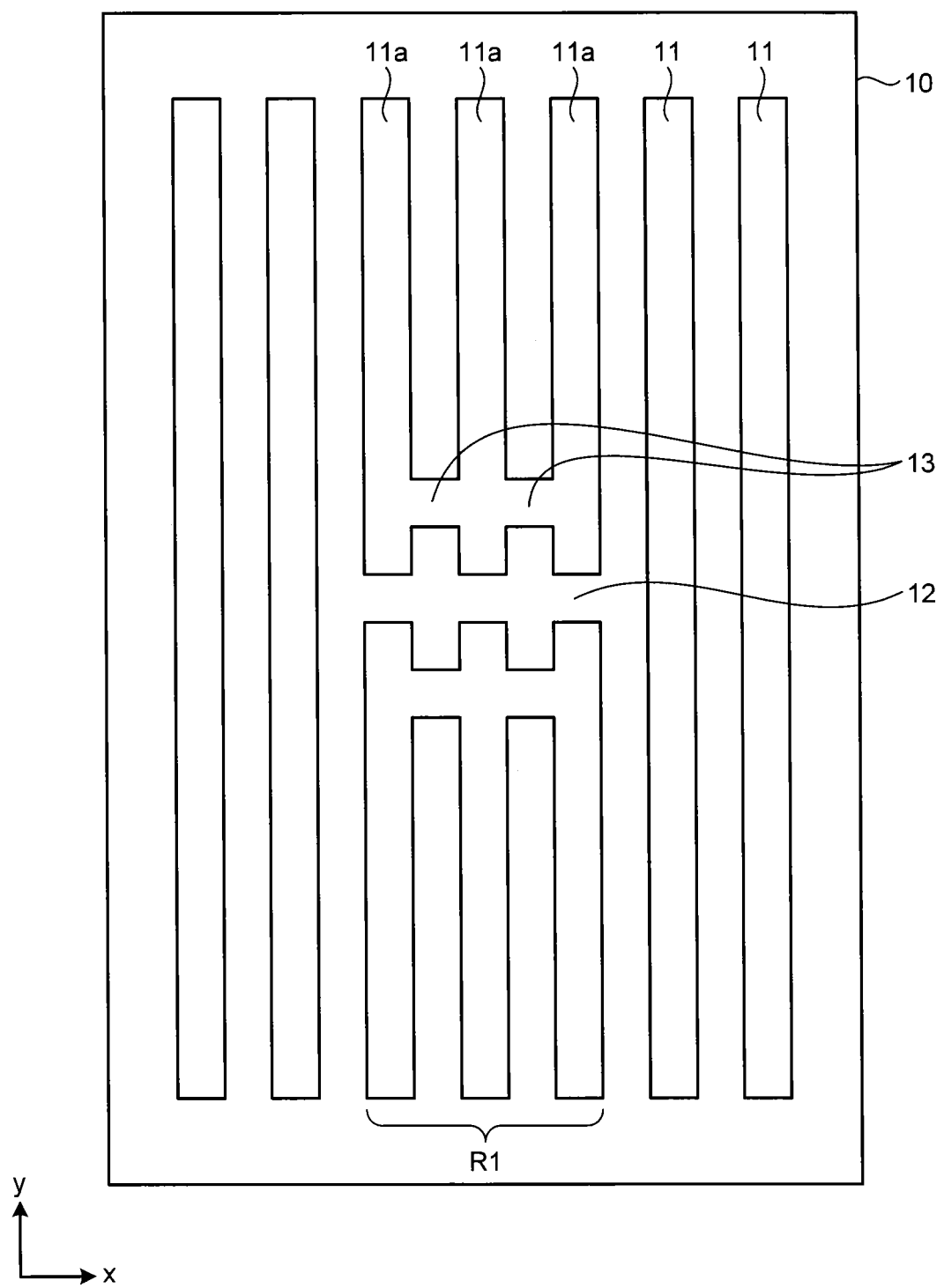
FIG. 1 is a plan view schematically illustrating one example of a mask according to a first embodiment.

FIG. 1 is a plan view schematically illustrating one example of a mask according to a first embodiment. The mask has a pattern for forming a line-and-space pattern by a sidewall transfer process. An extending direction of a line pattern 11 in a mask substrate 10 is defined as y direction, and a direction perpendicular to the y direction is defined as x direction. FIG. 1 is a schematic view for describing the embodiment, and does not illustrate an actual mask structure.

On the mask substrate 10, a plurality of line patterns 11 and 11a extending in the y direction is arranged in the x direction with a pitch substantially equal to the width of each of the line patterns 11 and 11a. The line pattern 11a arranged in a region R1 is separated into two on a predetermined position of the line pattern 11 in the y direction by a separation portion 12. The line patterns 11a that are adjacent to each other in the x direction and are separated by the separation portion 12 are connected by a connection pattern 13. The connection pattern 13 is not formed on the end of the line pattern 11a close to the separation portion 12, but is formed on the inward region opposite to the separation portion 12 with a predetermined distance from the end of the line pattern 11a. Specifically, the end of the line pattern 11a projects in the y direction with a predetermined amount from the connection pattern 13 connecting the separated multiple line patterns 11a in the x direction.

The separation portion 12 and the connection pattern 13 are formed on the line pattern 11 on the region on which a wiring pattern finally formed on a subject to be processed is to be separated. The separated line patterns 11 are three in this embodiment. However, the number of the separated line patterns is not limited thereto. The mask described above is particularly effective for the case where the half pitch of the line-and-space pattern transferred by a lithography process is not more than 80 nm.

Next, a pattern forming method according to the first embodiment will be described. FIGS. 2A to 10A are top views illustrating one example of the pattern forming method according to the first embodiment, FIGS. 2B to 10B are cross-sectional views of FIGS. 2A to 10A taken along a line A-A, FIGS. 2C to 10C are cross-sectional views of FIGS. 2A to 10A taken along a line B-B, and FIGS. 2D to 10D are cross-sectional views of FIGS. 2A to 10A taken along a line C-C. The method of forming a metal wiring layer by using a damascene process will be described here.

As illustrated in FIGS. 2A to 2D, an interlayer insulating film 22 serving as a film to be processed is formed on a semiconductor substrate 21, such as a silicon substrate, on which an active element such as a memory cell and a transistor or a passive element such as a capacitor is integrally formed. A TEOS (Tetraethoxysilane) film that is a silicon oxide film can be used as the interlayer insulating film 22. A contact hole for connecting the elements formed on the semiconductor substrate 21 and a metal wiring that is to be formed later is formed on the interlayer insulating film 22.

Then, a sacrifice film 23 is formed on the interlayer insulating film 22. Examples of the sacrifice film 23 include a TEOS film, an amorphous Si (hereinafter referred to as a-Si) film, a CVD (Chemical Vapor Deposition)—Carbon film, and a coated Carbon film. The sacrifice film 23 forms a core pattern upon forming a sidewall pattern later.

Figure 2A:
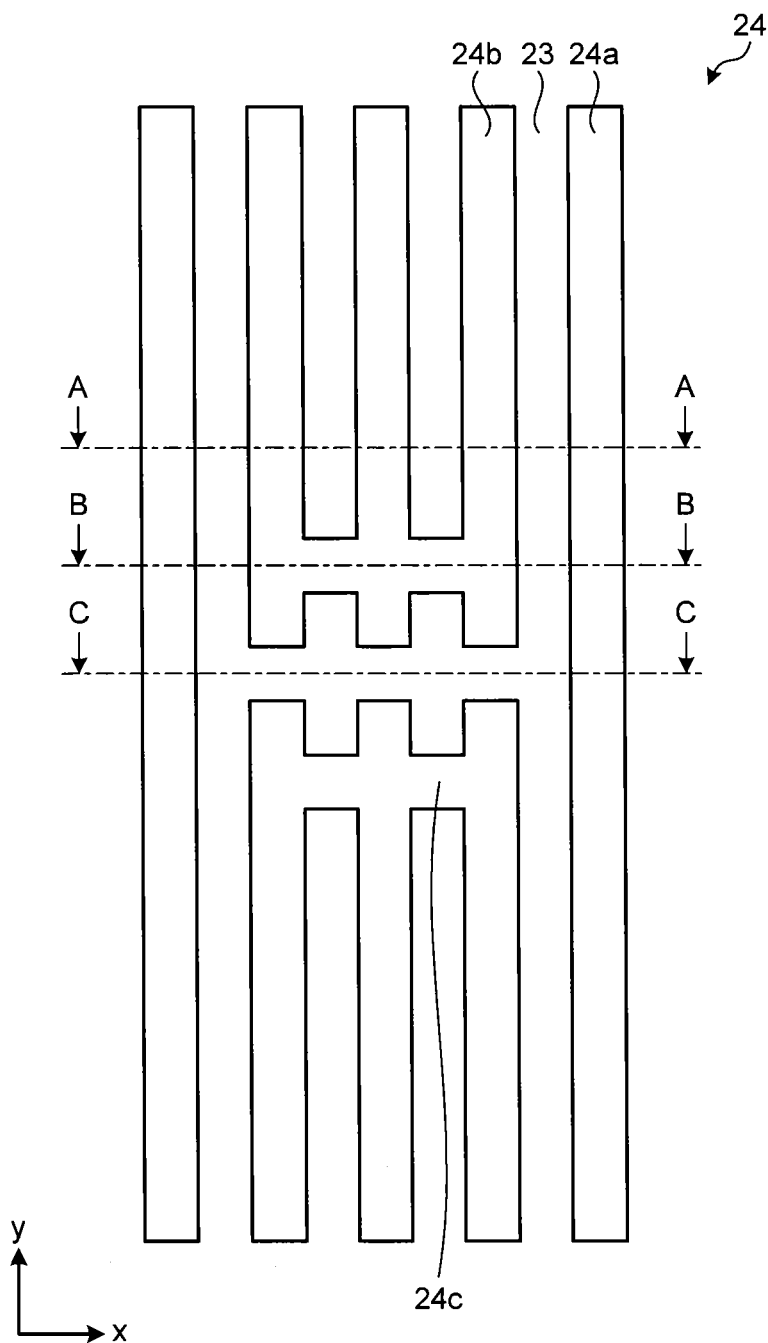
Figure 2B:
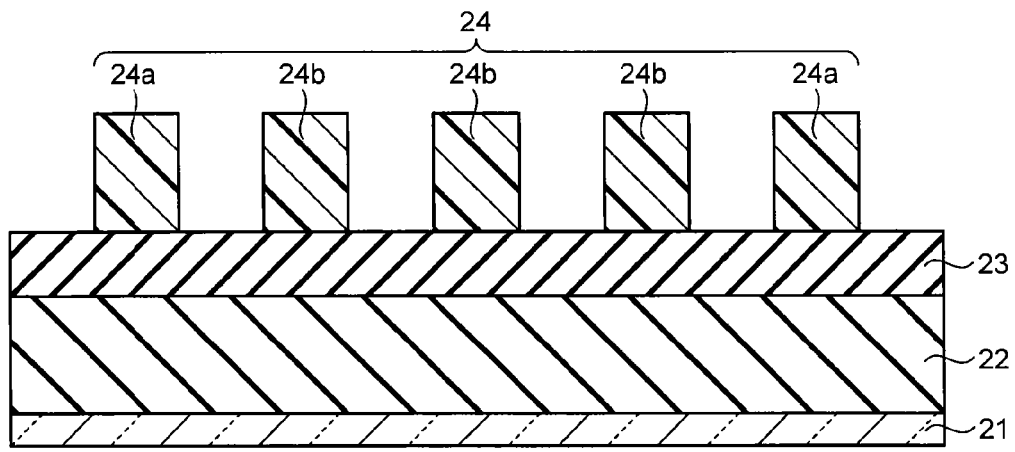
Figure 2C:
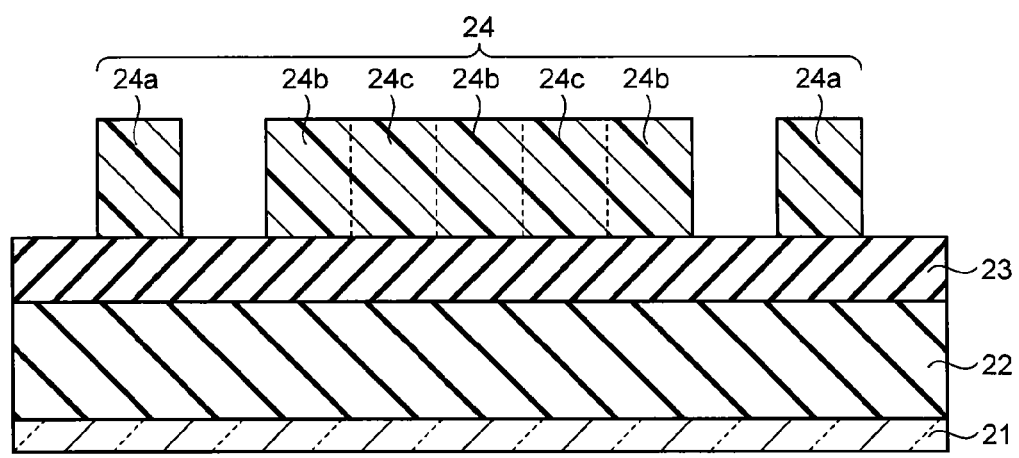
Figure 2D:
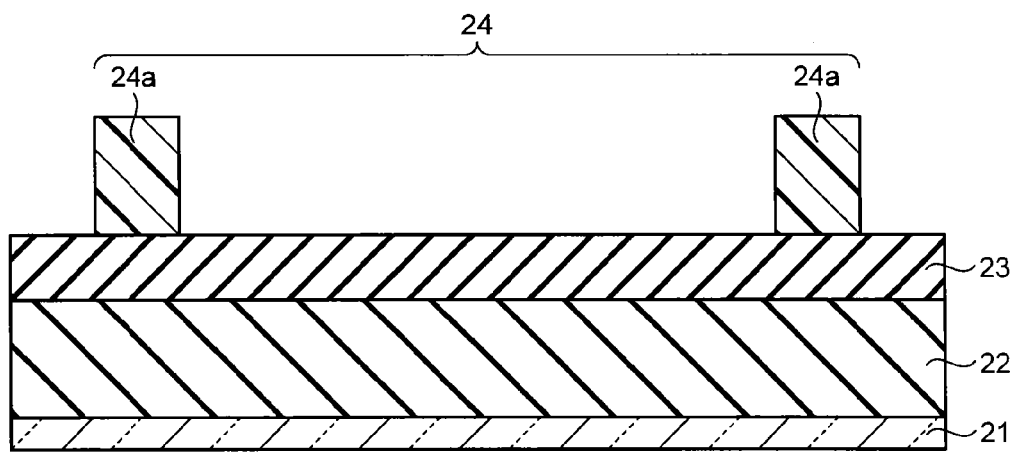
Figure 3A:
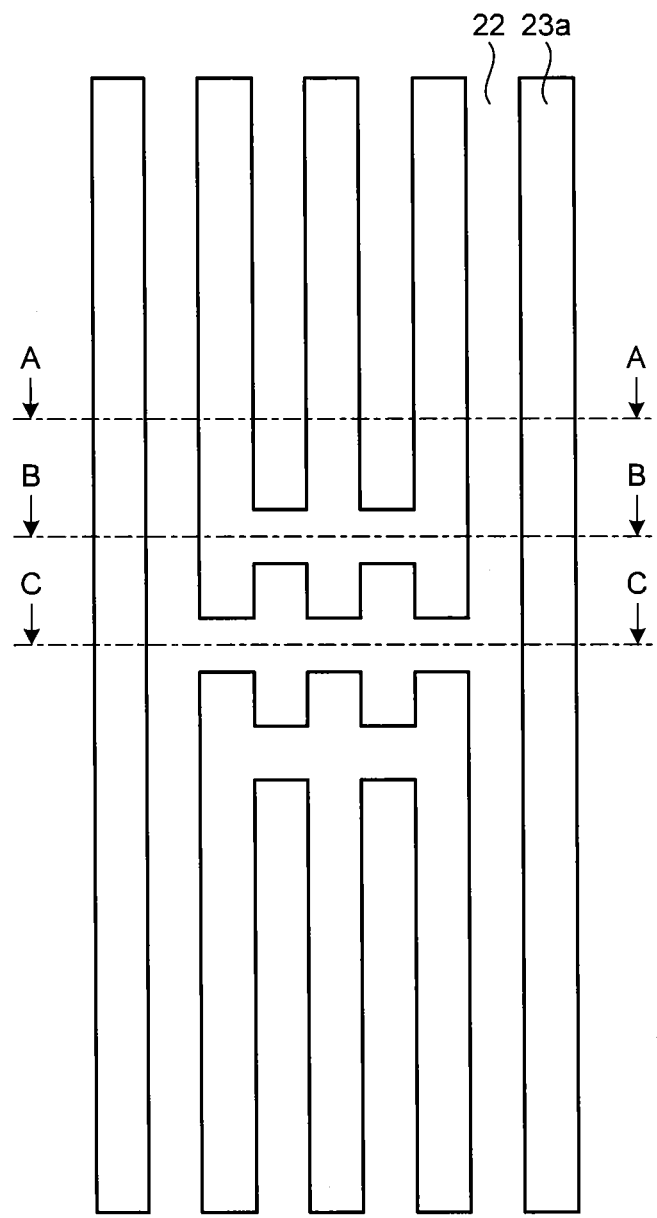
Figure 3B:
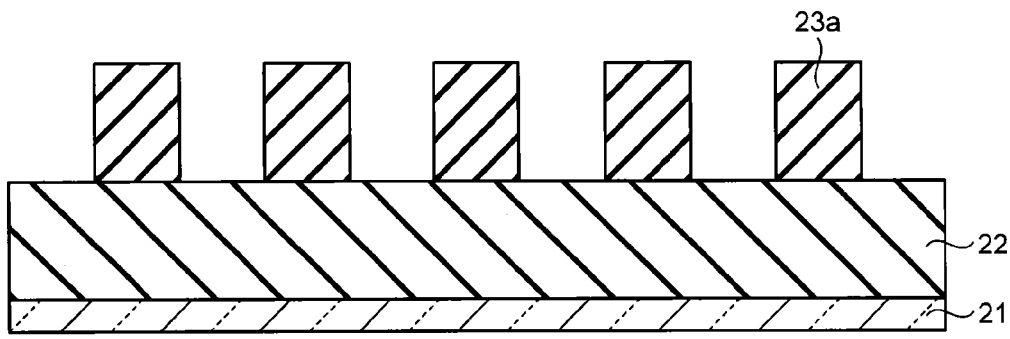
Figure 3C:
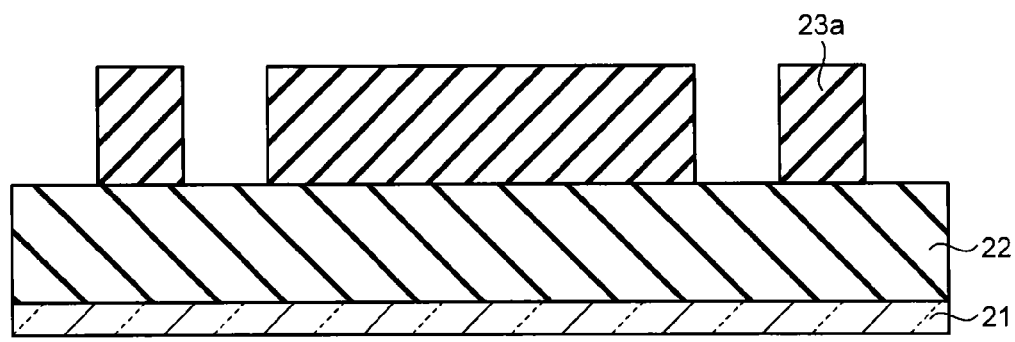
Figure 3D:
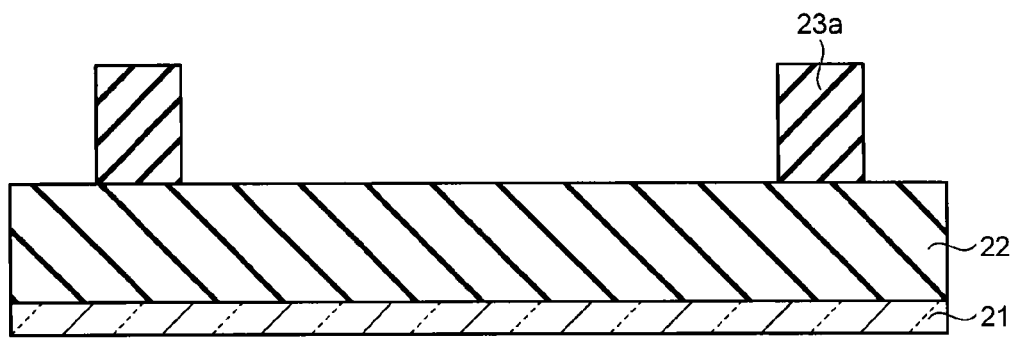
Figure 4A:
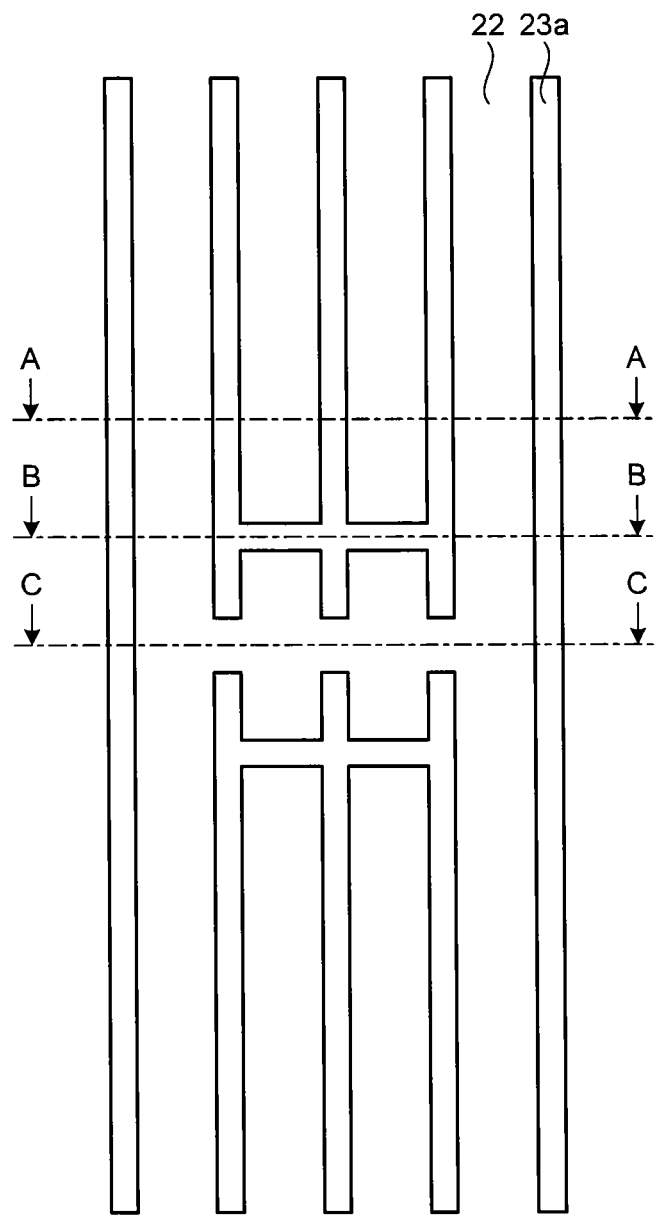
Figure 4B:
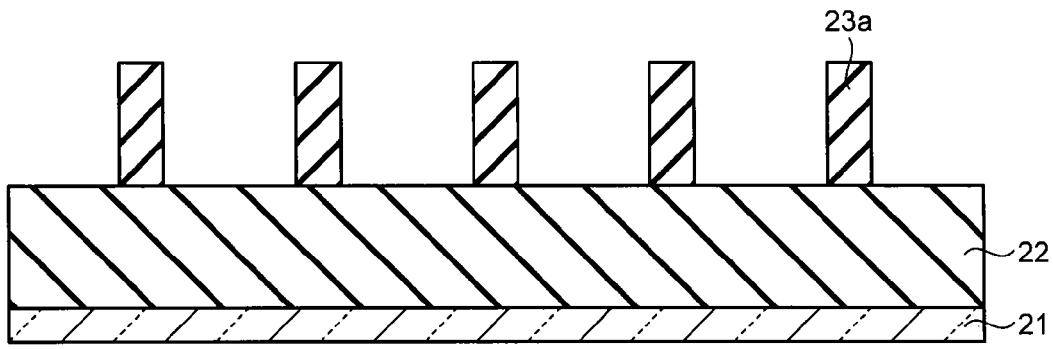
Figure 4C:
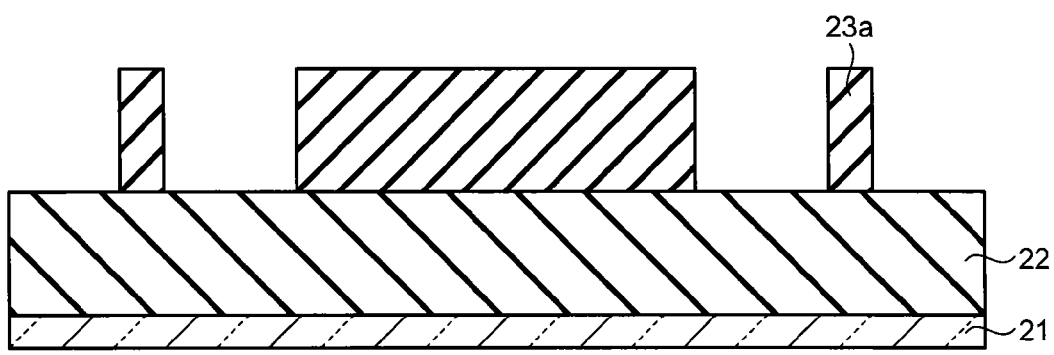
Figure 4D:
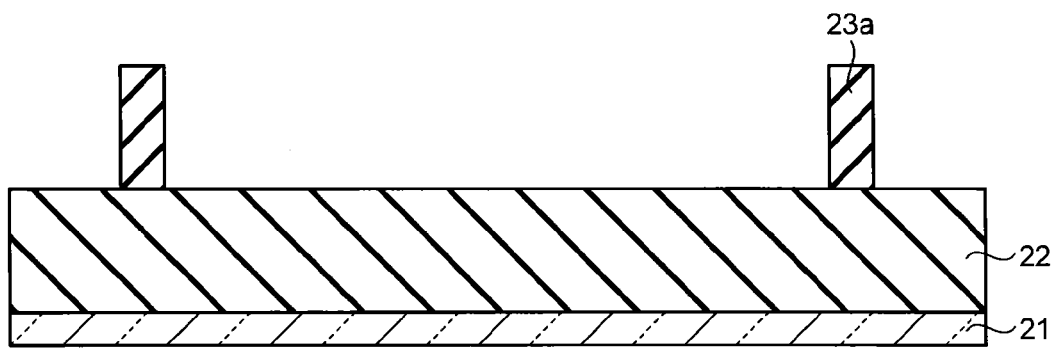
Figure 5A:
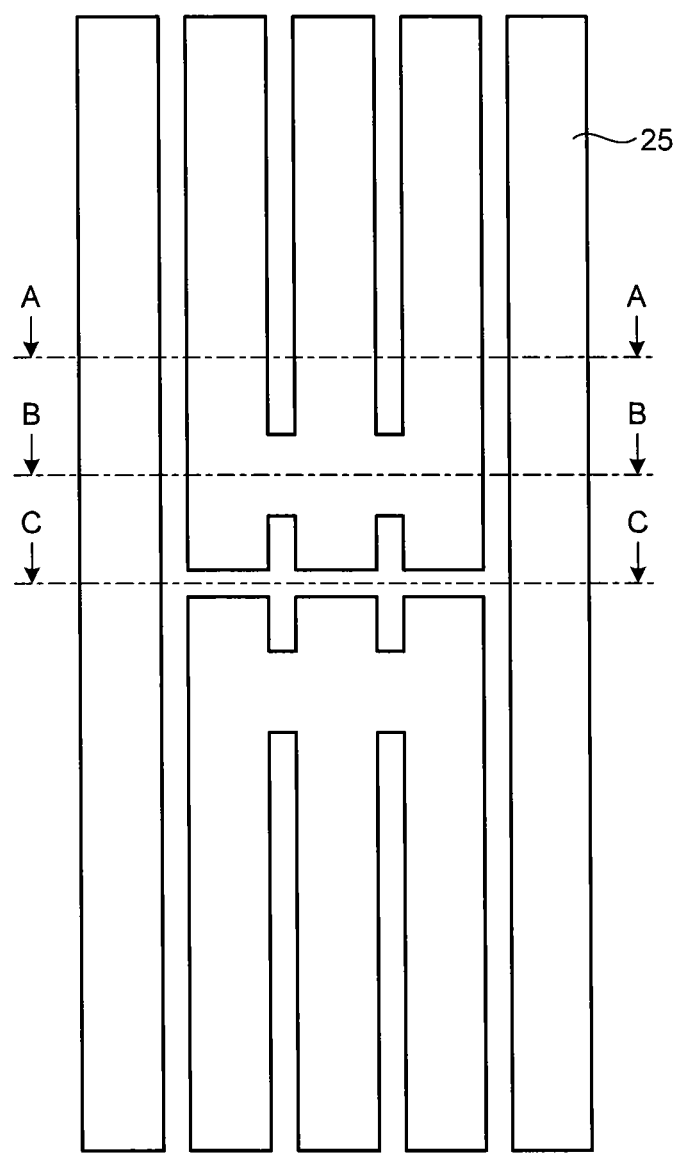
Figure 5B:
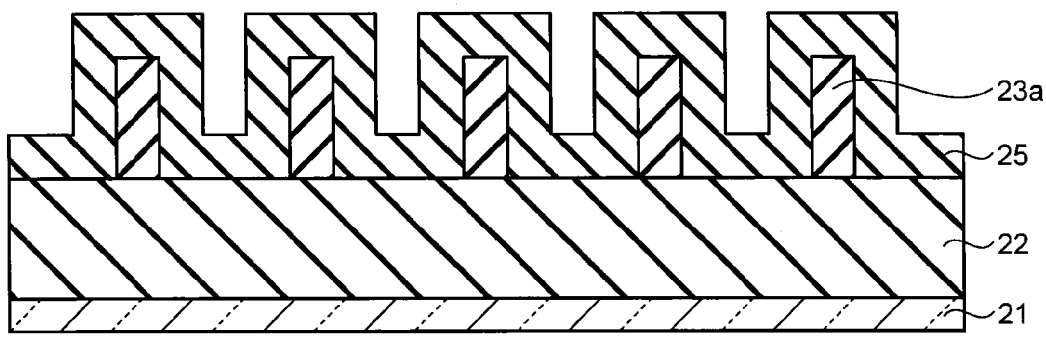
Figure 5C:
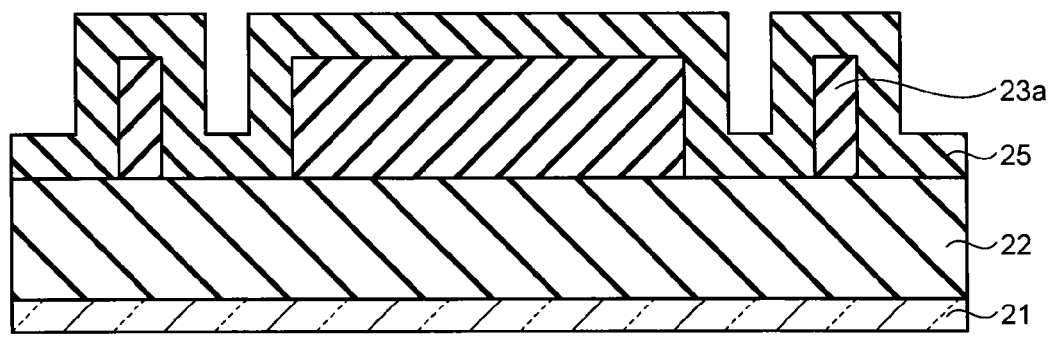
Figure 5D:
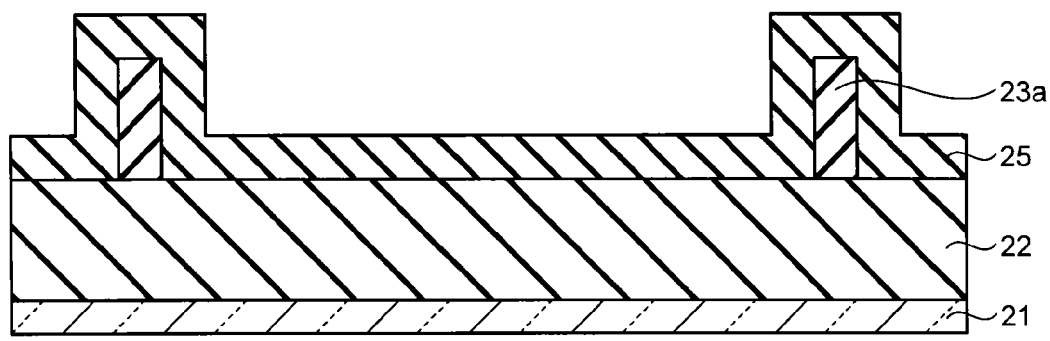
Figure 6A:
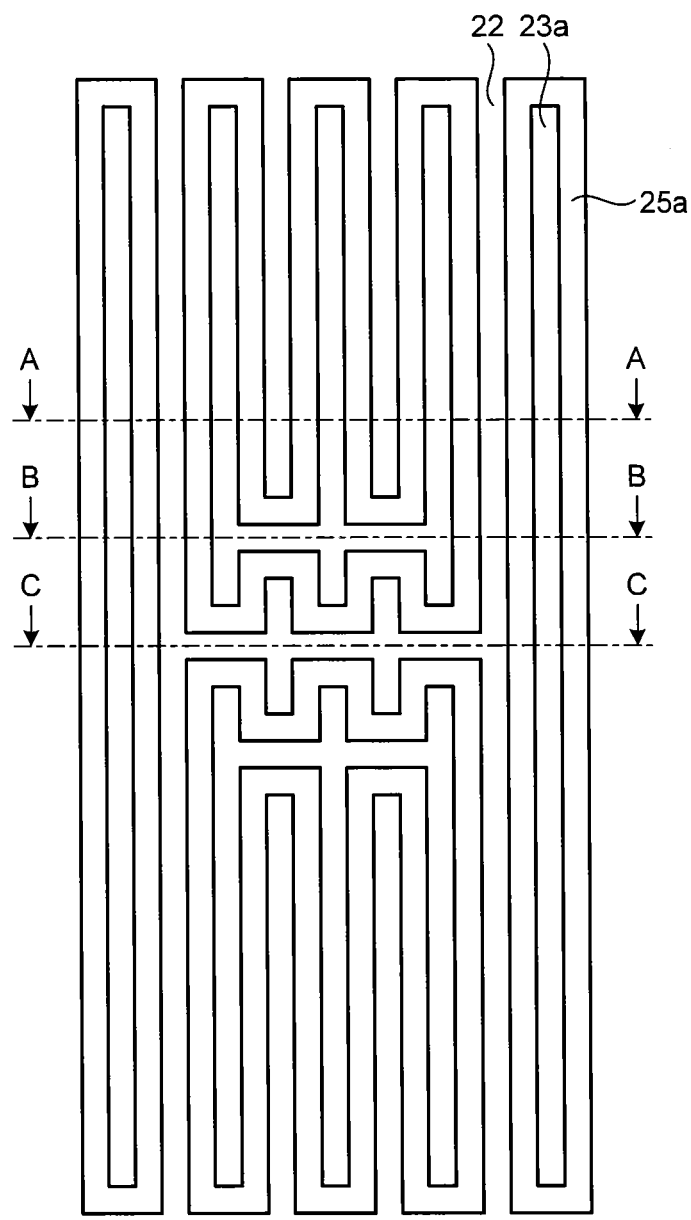
Figure 6B:
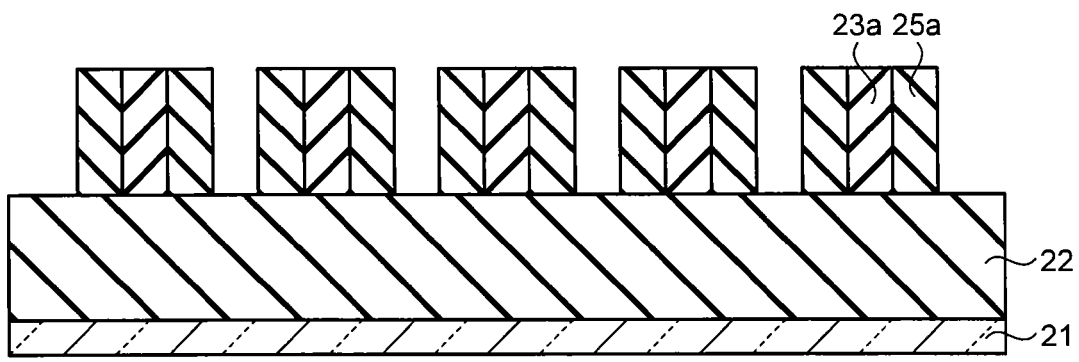
Figure 6C:
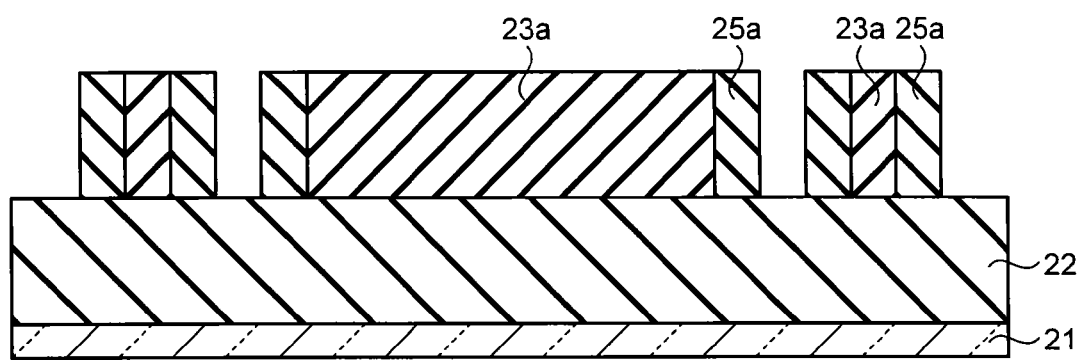
Figure 6D:
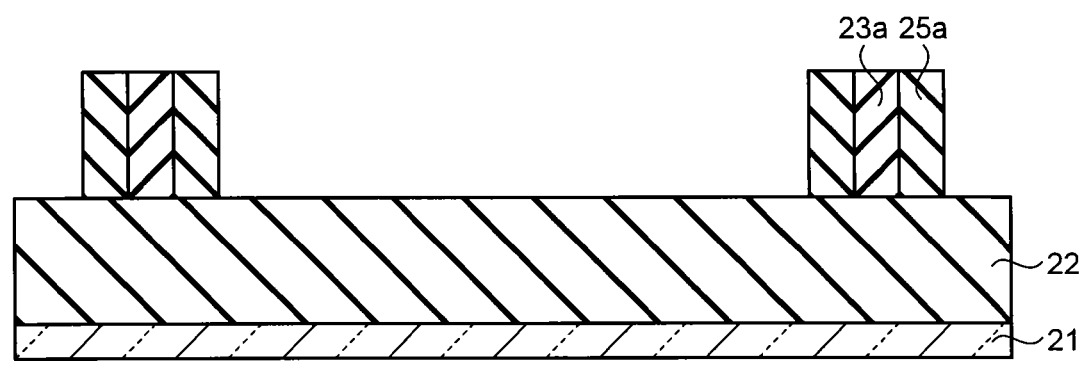
Figure 7A:
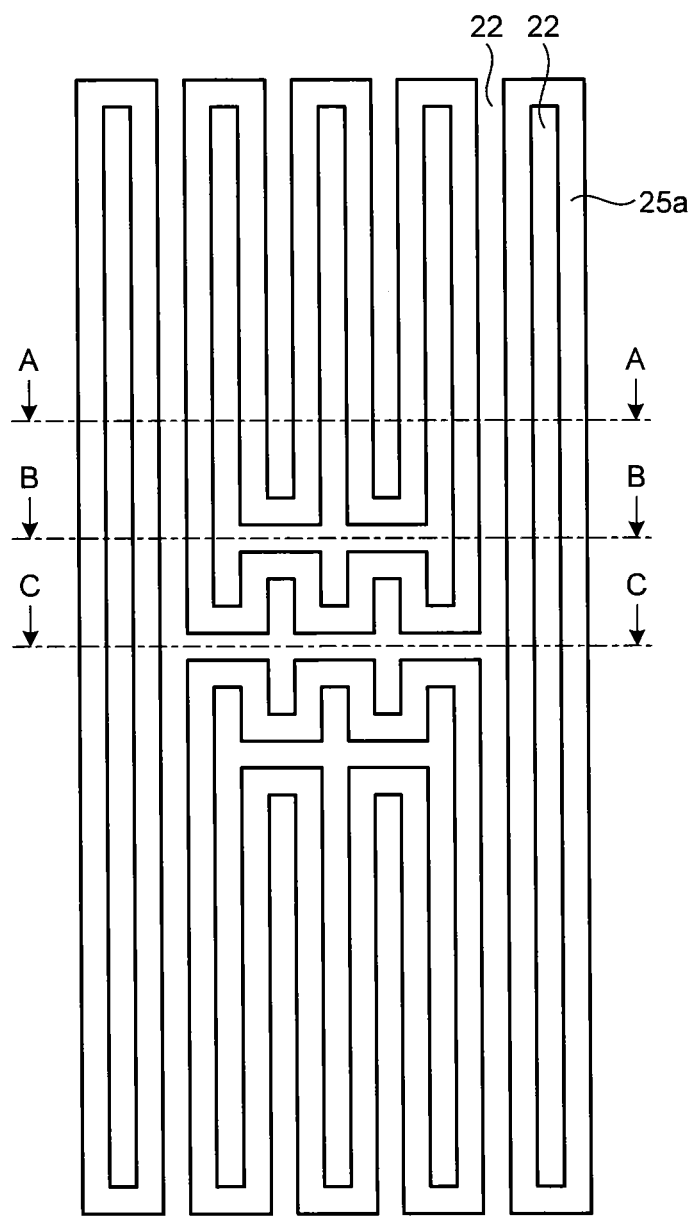
Figure 7B:
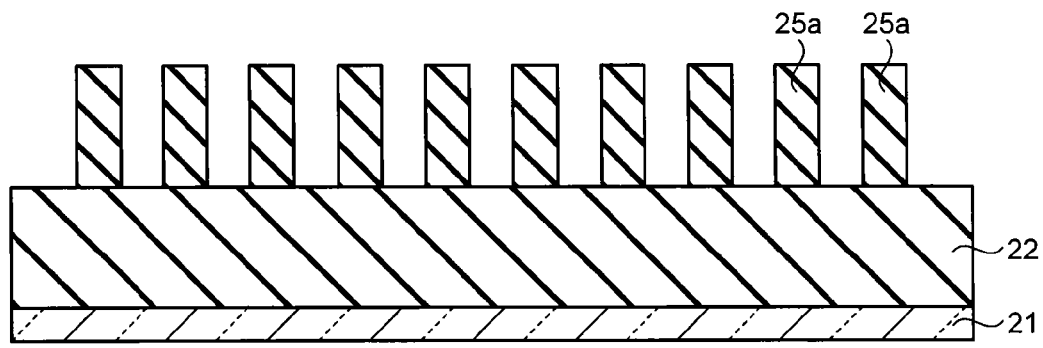
Figure 7C:
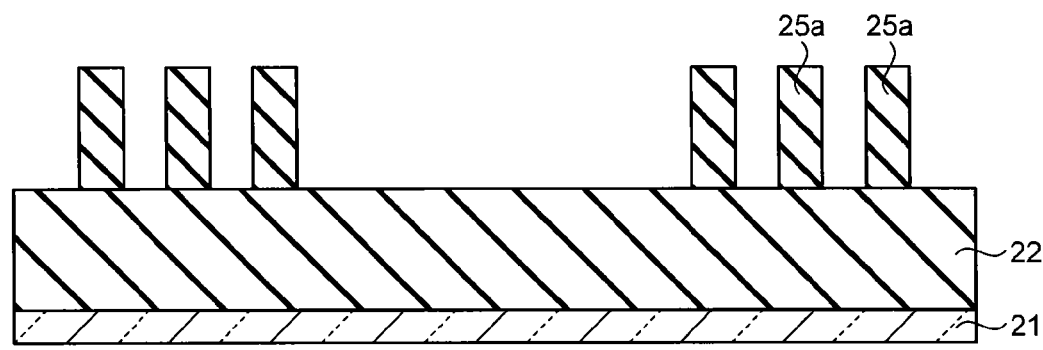
Figure 7D:
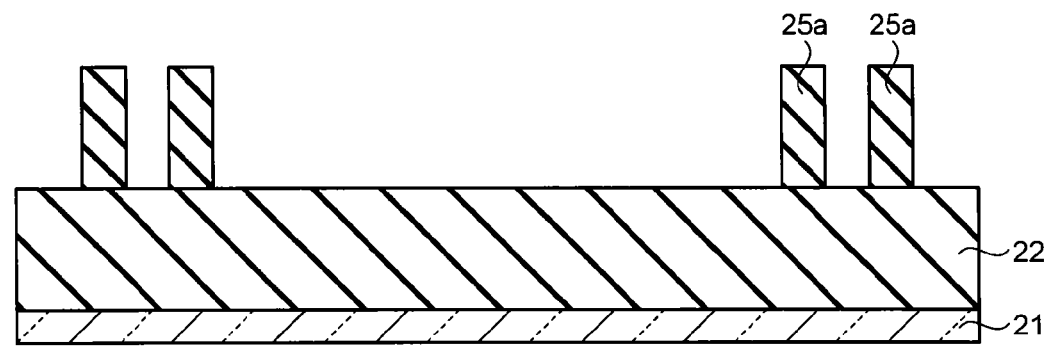
Figure 8A:
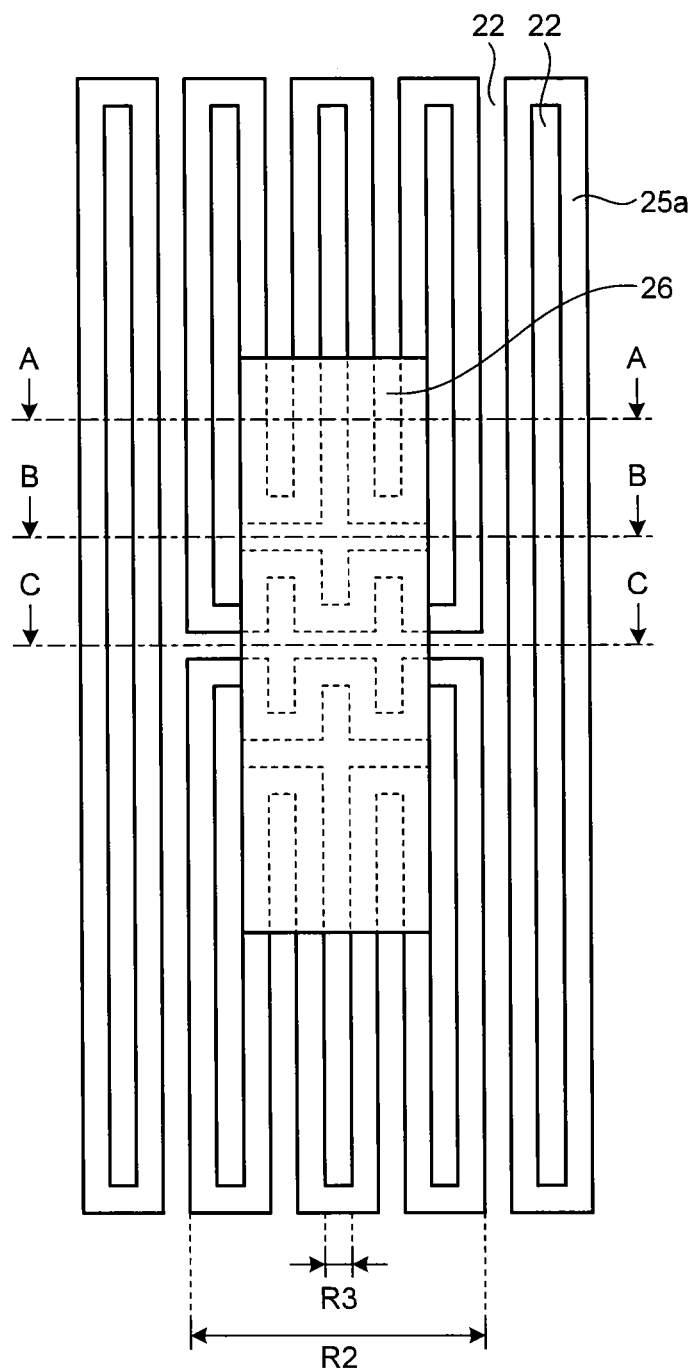
Figure 8B:
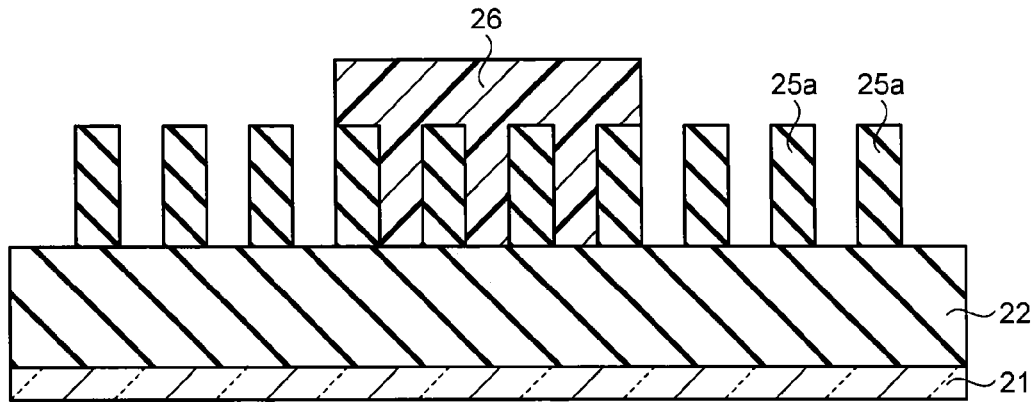
Figure 8C:
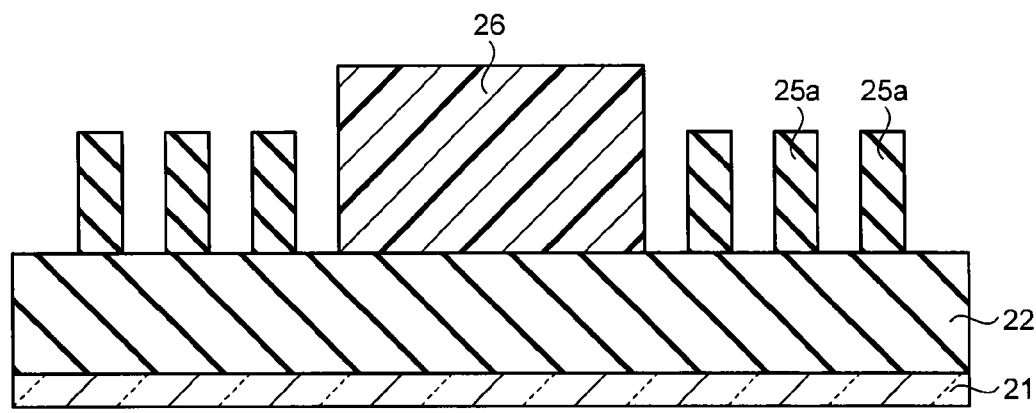
Figure 8D:
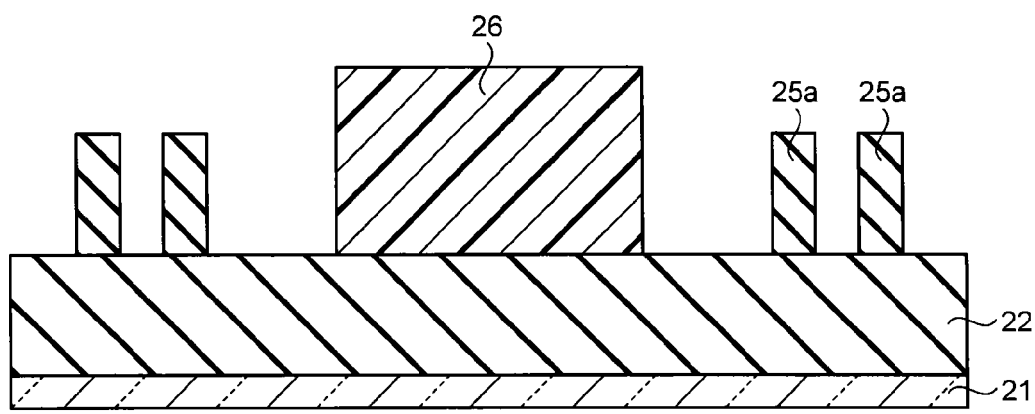
Figure 9A:
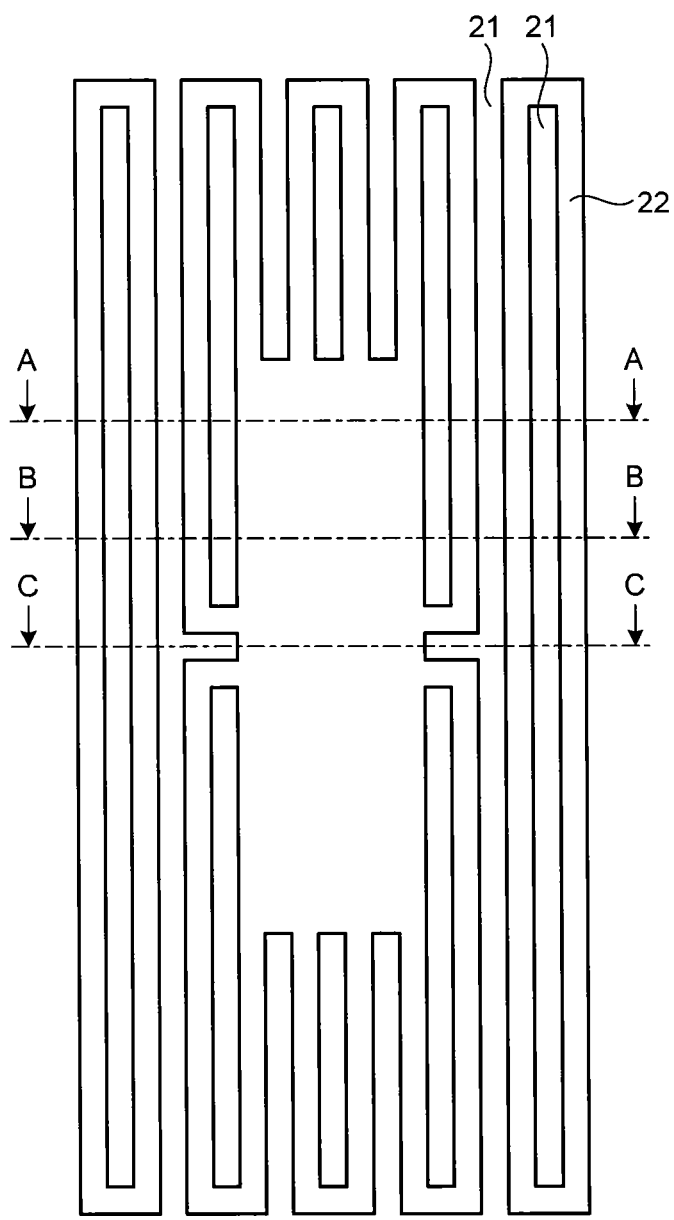
Figure 9B:
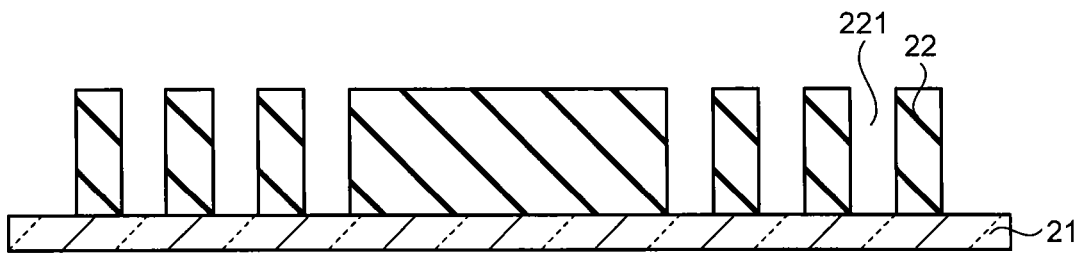
Figure 9C:
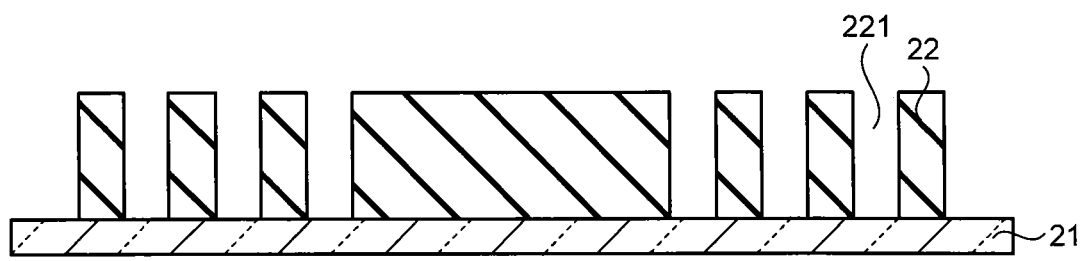
Figure 9D:
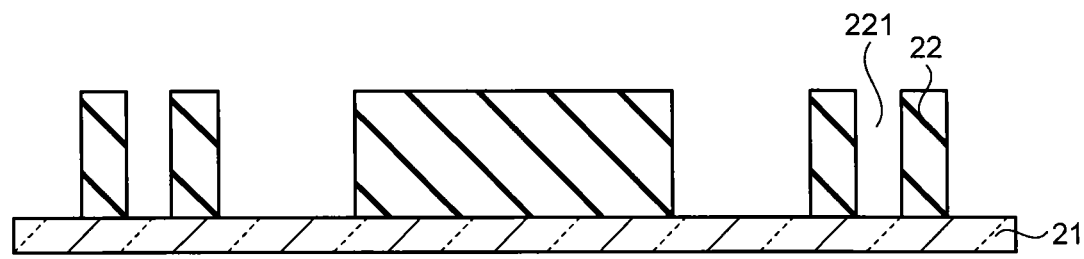
Figure 10A:
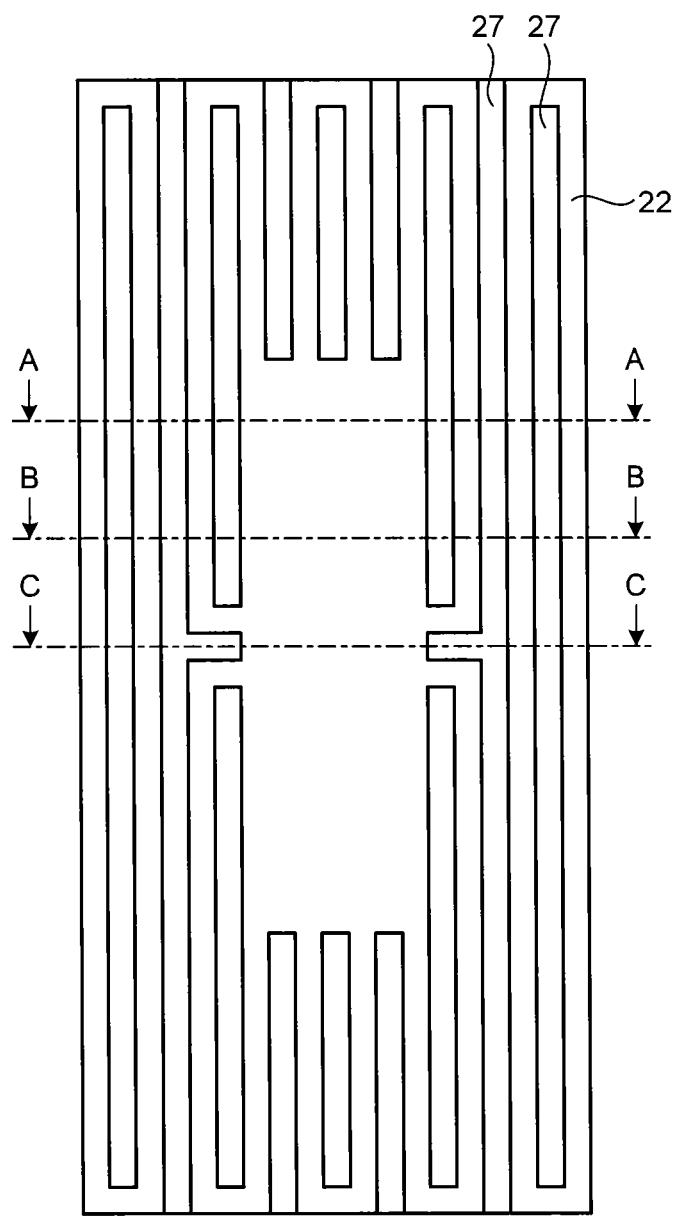
Figure 10B:
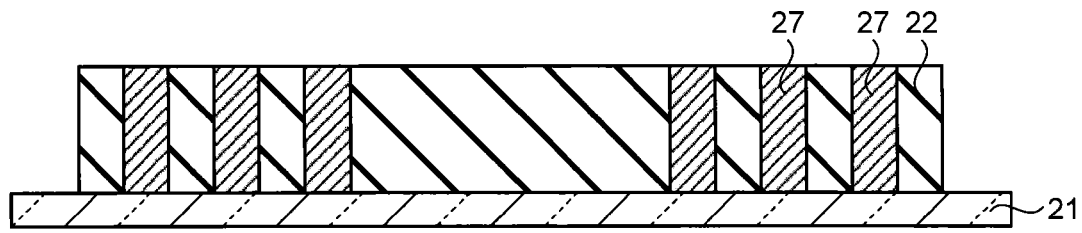
Figure 10C:
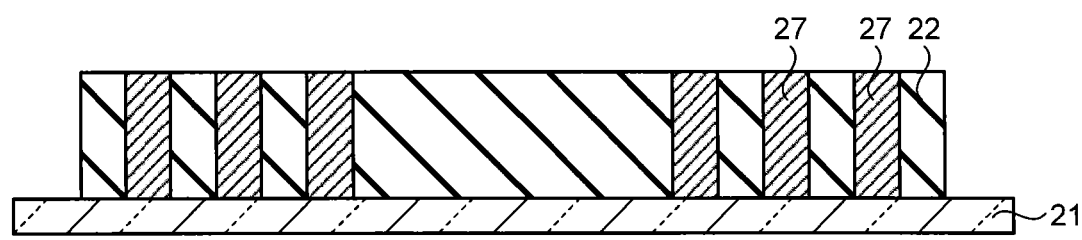
Figure 10D:
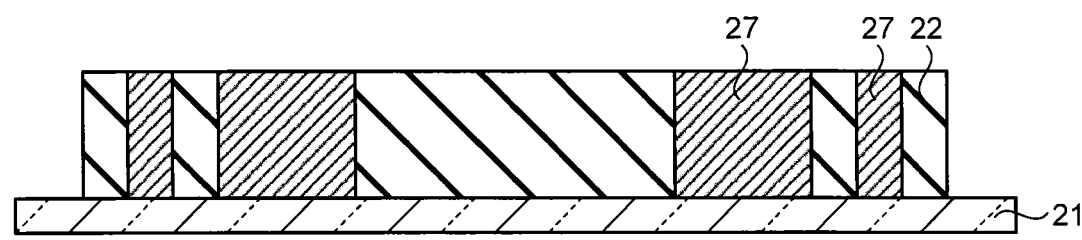

Thereafter, a resist film is applied on the sacrifice film 23, and then, an exposure process using the mask illustrated in FIG. 1 according to the lithography process and a development process are performed. Thus, a line-and-space resist pattern 24 is formed, wherein some line patterns are separated, and connected by a connection pattern. As illustrated in FIG. 2B, line patterns 24a are arranged with a predetermined space in the x direction on A-A portion, while on B-B portion, a connection pattern 24c connecting three line patterns 24b, except for the outside line patterns 24a, in the x direction is formed as illustrated in FIG. 2C. As illustrated in FIG. 2D, the line pattern 24b is not formed between the outside line patterns 24a on C-C portion. Specifically, the connection pattern 24c extending in the x direction connects the separated line patterns 24b, and the side end of the separated line pattern 24b close to the connection pattern 24c projects in the y direction from the connection pattern 24c.

Next, as illustrated in FIGS. 3A to 3D, the sacrifice film 23 is etched by an anisotropic etching technique such as a RIE (Reactive Ion Etching) process by using the resist pattern as a mask. According to this process, a sacrifice film pattern 23a is formed. The sacrifice film pattern 23a is formed to have the resist pattern 24 transferred thereon.

Thereafter, as illustrated in FIGS. 4A to 4D, a slimming process is performed until the width of the sacrifice film pattern 23a in the x direction becomes substantially a half by the etching. The usable etching process includes a WET etching process, a RIE process, and an Asher process, according to the type of the used sacrifice film 23.

Next, as illustrated in FIGS. 5A to 5D, a sidewall film 25 is formed on the entire surface of the interlayer insulating film 22. The sidewall film 25 is formed to conformally coat the sacrifice film pattern 23a formed on the interlayer insulating film 22. A film different from the sacrifice film 23 and the interlayer insulating film 22 is used for the sidewall film 25. Here, an SiN film can be used. The thickness can be set to be almost equal to the width of the sacrifice film 23 in the x direction. When the sacrifice film 23 is the CVD-Carbon film or the coated Carbon film, a film that can be formed at room temperature, such as a low-temperature oxide film or a low-temperature nitride film, is used.

Then, as illustrated in FIGS. 6A to 6D, the formed sidewall film 25 is etched back until the top surface of the sacrifice film pattern 23a and the top surface of the interlayer insulating film 22 are exposed by the anisotropic etching such as the RIE process. According to this process, the top surface of the sacrifice film pattern 23a and the top surface of the interlayer insulating film 22 are exposed, and a sidewall pattern 25a that is a loop-shaped sidewall film 25 is left around the sacrifice film pattern 23a.

Then, as illustrated in FIGS. 7A to 7D, the sacrifice film pattern 23a is removed by the etching process. Thus, the loop-shaped sidewall pattern 25a is left on the interlayer insulating film 22. As the method of removing the sacrifice film 23, the wet etching process, the RIE process, or the Asher process can be used according to the type of the used sacrifice film 23.

Then, as illustrated in FIGS. 8A to 8D, a resist film is applied on the interlayer insulating film 22 on which the sidewall pattern 25a is formed, an exposure process is performed by the lithography technique, and a development process is performed. Thus, a resist pattern 26 is formed to cover the pattern on the separated portion. The resist pattern 26 covers the separated pattern to cover the portion that is to become a metal wiring portion, whereby the metal wiring can be separated.

When the pattern layout having the separation portion illustrated in FIG. 1 is used, a margin can be secured, even if misalignment occurs upon forming the cover pattern (resist pattern 26) during the lithography process.

Figure 11:
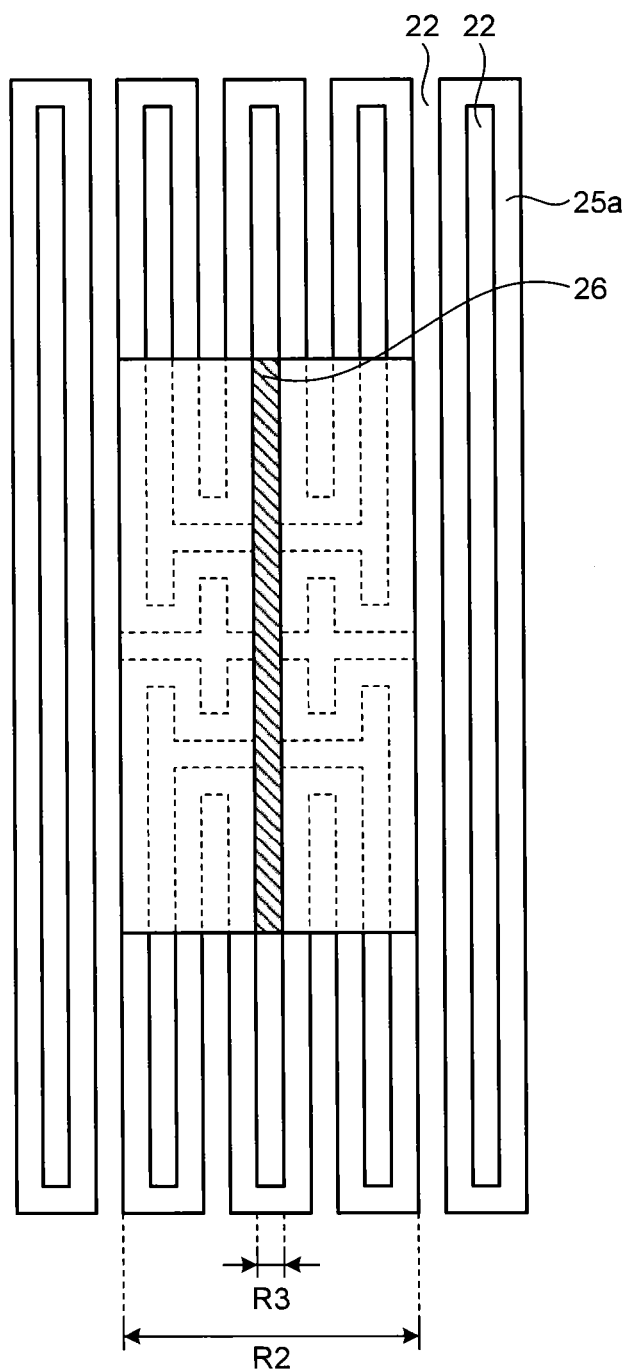
FIGS. 11 and 12 are top views illustrating one example of a cover pattern.
Figure 12:
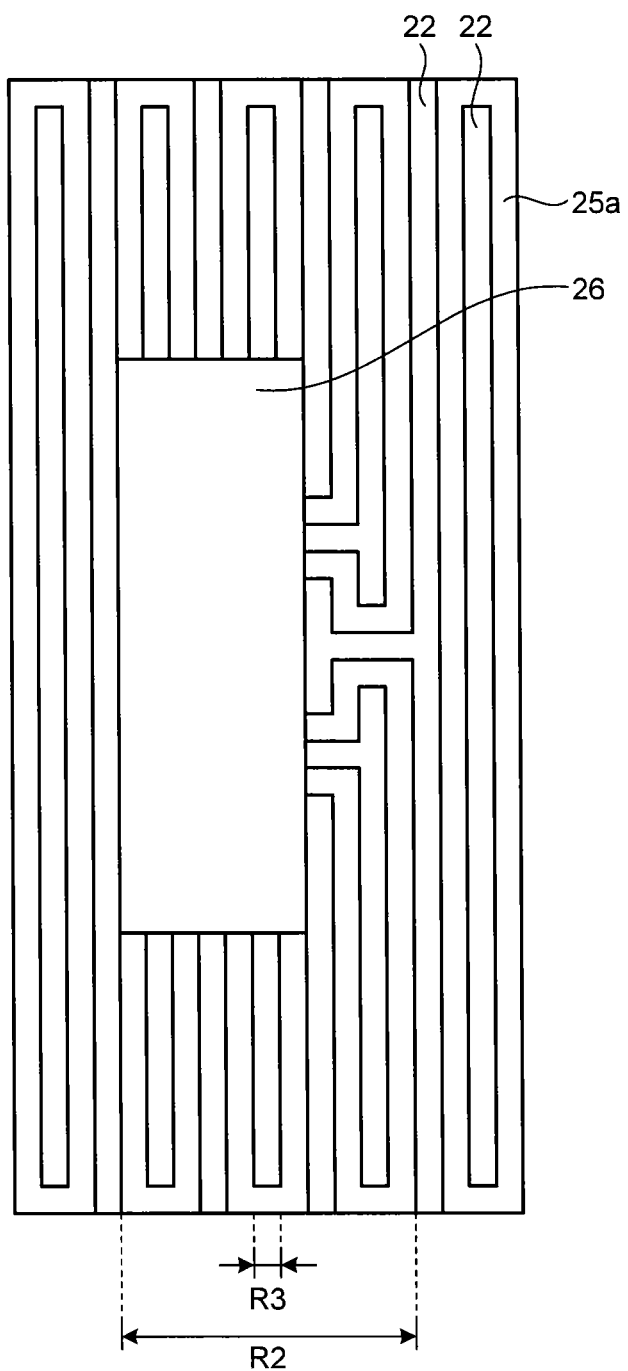

FIGS. 11 and 12 are top views illustrating one example of the cover pattern. In the pattern illustrated in FIG. 8A, if a central region R3 in a region R2 where the line patterns are separated can be covered by the resist pattern 26 as illustrated in FIG. 11, the wiring pattern formed on the interlayer insulating film 22 can ideally be separated by the resist pattern 26. In this case, the margin corresponding to three sidewalls can be secured, whereby a marginal process can be constructed.

Even when the resist pattern 26 is arranged on the leftmost side within the region R2 where the line patterns are separated as illustrated in FIG. 12, the central region R3 is covered in the region R2, wherein the metal wiring that is to be formed later can surely be separated. In this case, the margin for the positional deviation corresponding to three sidewalls can be secured.

Next, as illustrated in FIGS. 9A to 9D, the interlayer insulating film 22 is etched by using the sidewall pattern 25a and the resist pattern 26 as a mask. According to this process, a wiring-forming channel 221 is formed on the region of the interlayer insulating film 22 not covered by the sidewall pattern 25a and the resist pattern 26.

As illustrated in FIGS. 10A to 10D, a barrier metal film for preventing the diffusion of the metal that is to become the metal wiring and a seed film serving as a conductive layer upon a plating process are formed in the wiring-forming channel 221, and then, a metal film is formed by the plating process. Cu, Al, or W can be used as the metal film. The top surface of the metal film is higher than the top surface of the interlayer insulating film 22. Therefore, a metal wiring 27 is formed by an etch-back process so that the metal film is embedded into the wiring-forming channel 221. As described above, the pattern forming method according to the first embodiment is finished.

The pattern on which the pattern in the mask illustrated in FIG. 1 or the pattern in the mask illustrated in FIG. 2 is transferred is only one example. Any pattern can be used by changing the number of the line patterns for separating the metal wiring 27 and the position where the resist pattern 26 is formed in FIGS. 8A to 8D.

Figure 13A:
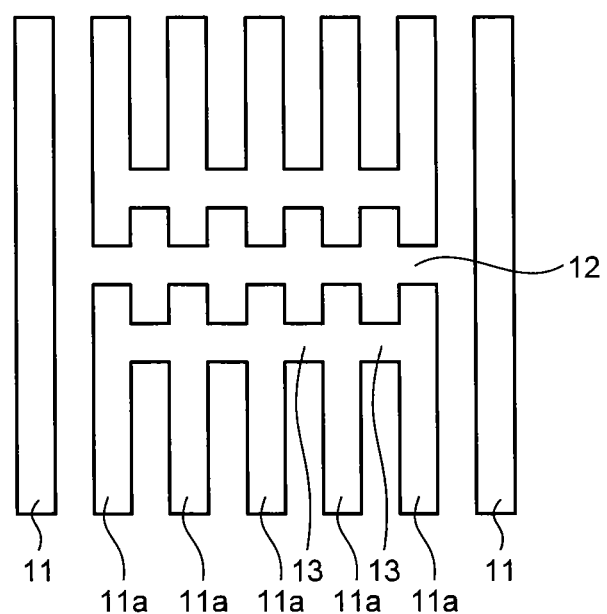
FIGS. 13A to 13E are schematically illustrating one example of a structure of a mask including a pattern separating a line pattern according to the first embodiment.

FIGS. 13A to 13E are views schematically illustrating one example of a structure of a mask including a pattern separating a line pattern according to the first embodiment. FIG. 13A illustrates the mask in which the number of lines to be separated is larger than the mask in FIG. 1. In this case, five line patterns 11 are separated by the separation portion 12, and each of the separated line patterns 11a is connected by connection patterns 13 extending in the x direction. The end of the separated line pattern 11a projects from the connection pattern 13.

Figure 13B:
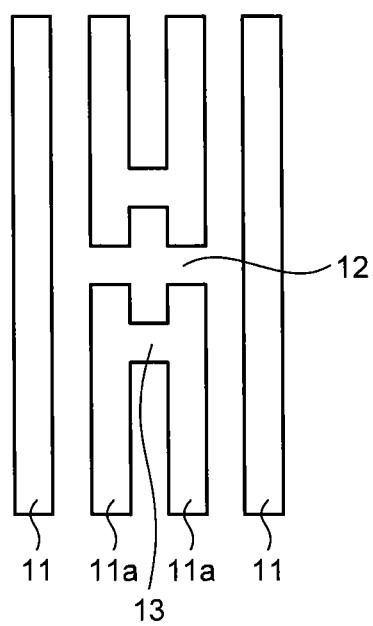
Figure 13C:
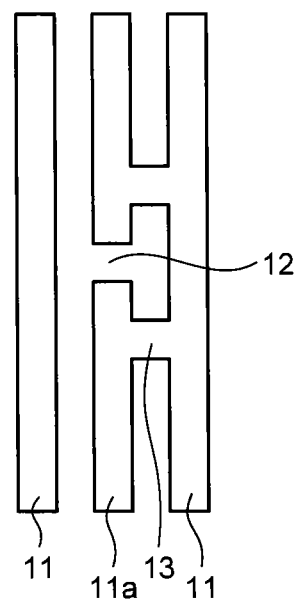

FIGS. 13B and 13C illustrate the case where the number of the lines to be separated is smaller than the mask in FIG. 1. The case in FIG. 13B is the same as the cases in FIGS. 1 and 13A. In FIG. 13C, one line pattern 11 is separated by the separation portion 12. In this case, a connection pattern 13 is provided between the separated line pattern 11a and the line pattern 11 adjacent to the separated line pattern 11a.

Figure 13D:
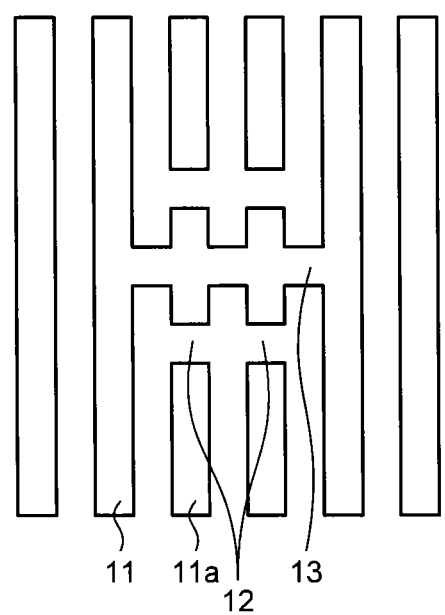

FIG. 13D illustrates the case where the line and space are inverted in the layout in FIG. 1. When a positive resist is used, the layout in FIG. 1 is used, while a negative resist is used, the layout in FIG. 13D is used.

Figure 13E:
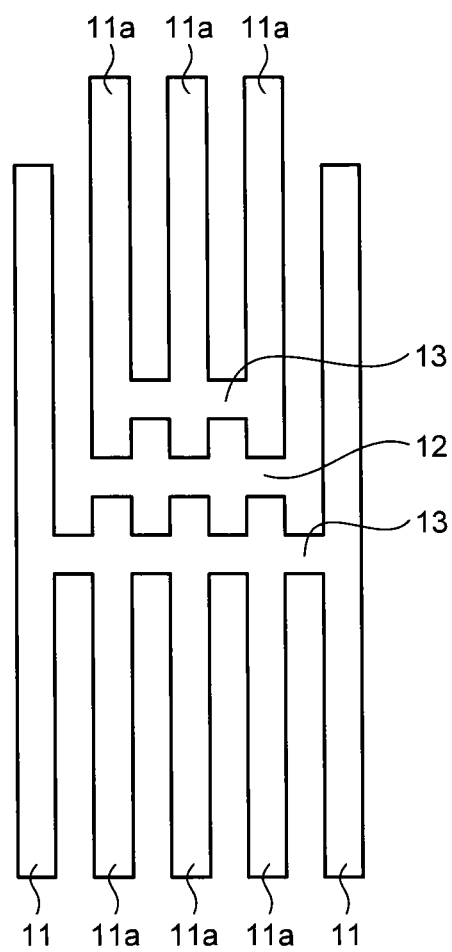

FIG. 13E illustrates the case in which the connection pattern 13 is connected not only to the separated line pattern 11a but also to the line pattern 11 adjacent to the separated line pattern 11a. A marginal positioning can be executed upon the lithography process by using such pattern, as in the case described above.

As described above, in the first embodiment, when the line pattern in the line-and-space pattern is separated, a mask described below is used to form the resist pattern 24. Specifically, in the mask, the line pattern 11 is separated, and the mask has the connection pattern 13 for connecting at least the separated line patterns 11a. The separated end of the separated line pattern 11a is formed to project from the connection pattern 13. This structure can reduce more the region orthogonal to the line pattern 11a than the structure in which the connection pattern 13 is formed to connect the ends of the separated line patterns 11a.

In general, the resist pattern orthogonal to the line-and-space has poor contrast depending upon the illumination condition, so that it is liable to be tapered. When the orthogonal region is wide, in particular, the tapered shape becomes significant. When the sidewall transfer process is applied with the significant tapered shape, the cross-sectional shape of the sidewall pattern is formed obliquely, and when a subject to be processed is processed by using this pattern as a mask, a pattern is lost. As a result, an open defect might occur, when the metal wiring is formed.

On the other hand, in the first embodiment, the pattern described above is formed. Therefore, the region of the resist pattern (connection pattern 13) orthogonal to the line-and-space can be reduced as much as possible, whereby the margin in the lithography is improved. Accordingly, this structure brings an effect of making a process robust. The first embodiment also brings an effect of separating the metal wiring, while securing a margin in the positional deviation of the cover pattern (resist pattern 26) formed to cover the separated pattern during the lithography process.

(Second Embodiment)

In the first embodiment, the resist pattern is formed on the sacrifice film, the pattern is transferred onto the sacrifice film by using the resist pattern as a mask to form the sacrifice film pattern, and the sidewall transfer process is performed to the sacrifice film pattern. In the second embodiment, the resist pattern is formed on a film to be processed, and the sidewall transfer process is performed to this resist pattern.

FIGS. 14A to 18A are top views illustrating one example of the pattern forming method according to the second embodiment, FIGS. 14B to 18B are cross-sectional views of FIGS. 14A to 18A taken along a line D-D, FIGS. 14C to 18C are cross-sectional views of FIGS. 14A to 18A taken along a line E-E, and FIGS. 14D to 18D are cross-sectional views of FIGS. 14A to 18A taken along a line F-F. The method of forming a metal wiring layer by using a damascene process will be described here.

As illustrated in FIGS. 14A to 14D, an interlayer insulating film 22 serving as a film to be processed is formed on a semiconductor substrate 21, such as a silicon substrate, on which an active element such as a memory cell and a transistor or a passive element such as a capacitor is integrally formed. A TEOS film that is a silicon oxide film can be used as the interlayer insulating film 22. A contact hole for connecting the elements formed on the semiconductor substrate 21 and a metal wiring that is to be formed later is formed on the interlayer insulating film 22.

Figure 14A:
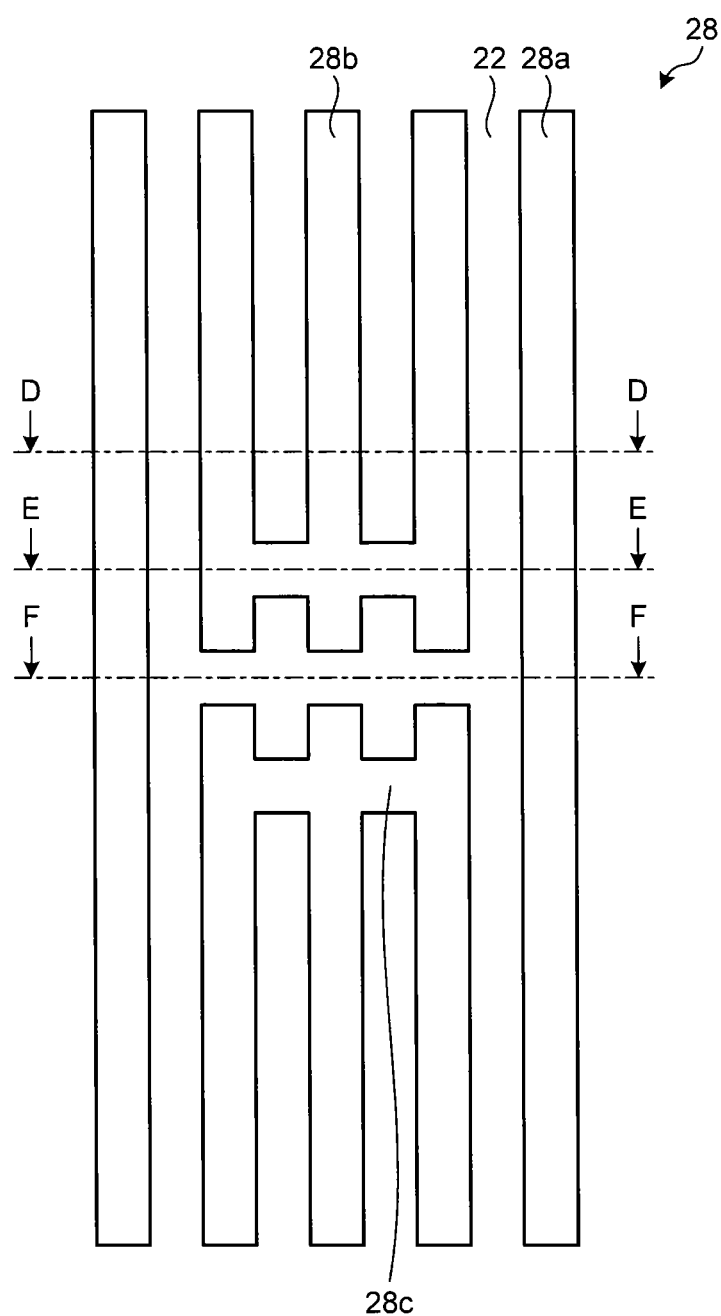
Figure 14B:
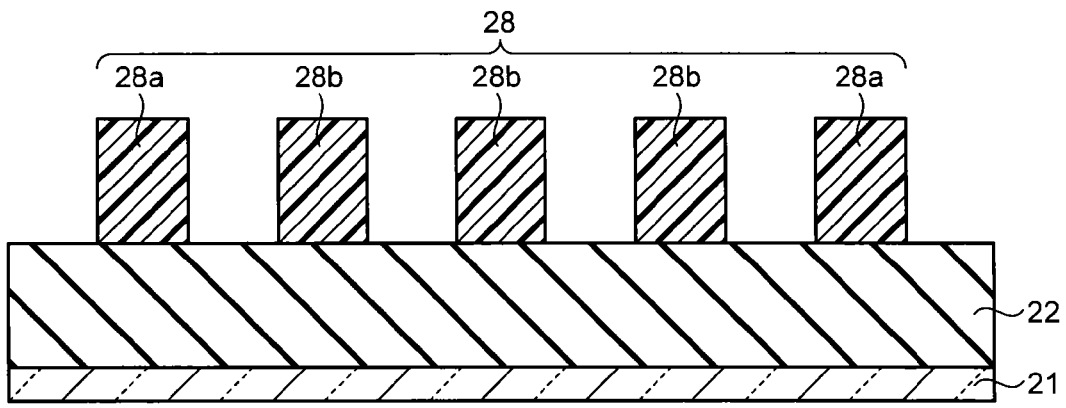
Figure 14C:
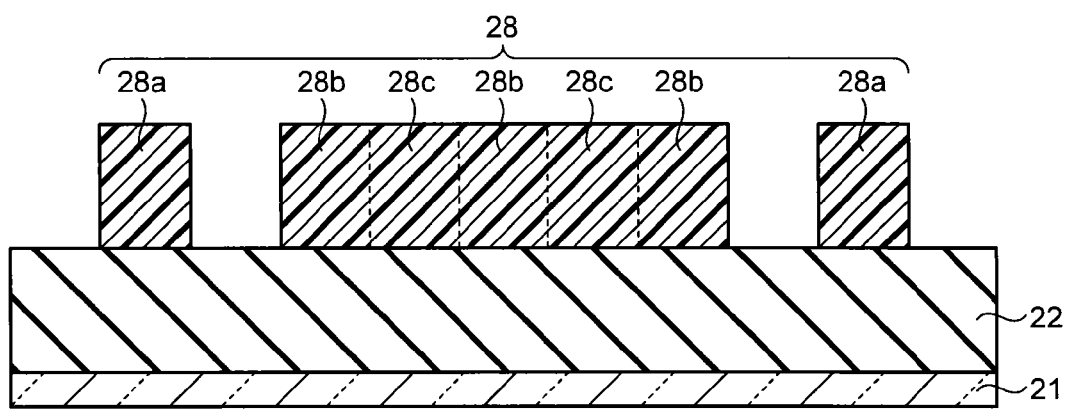
Figure 14D:
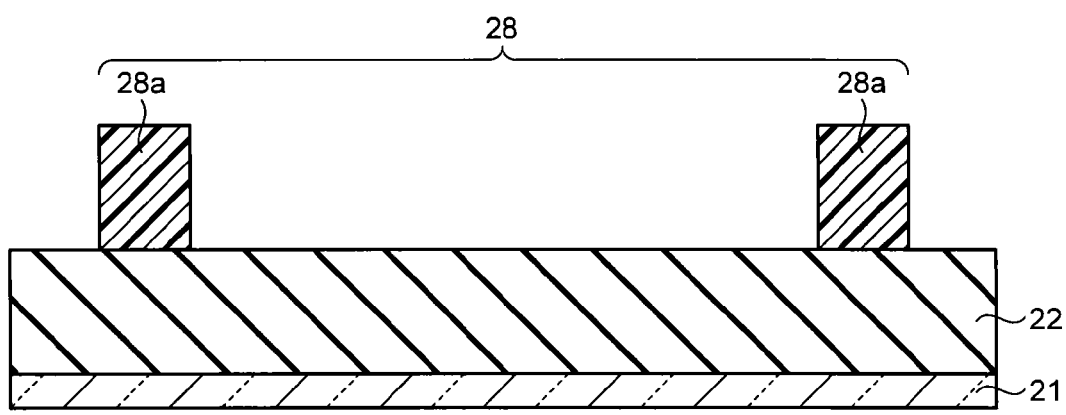
Figure 15A:
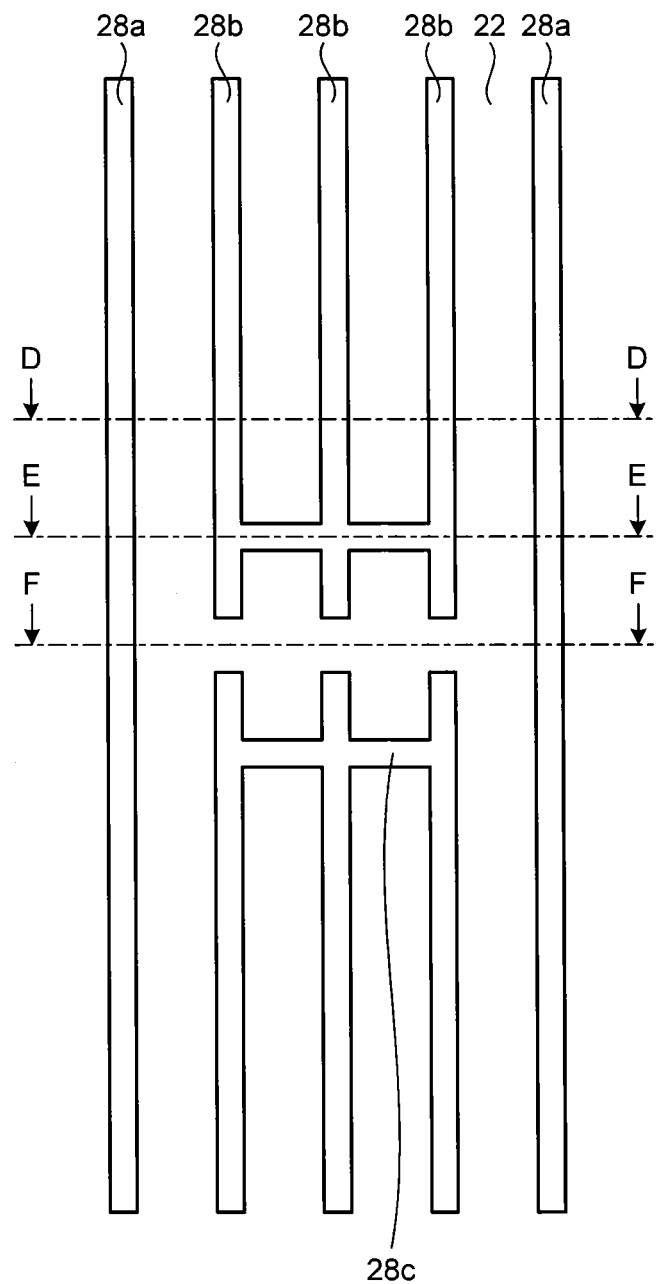
Figure 15B:
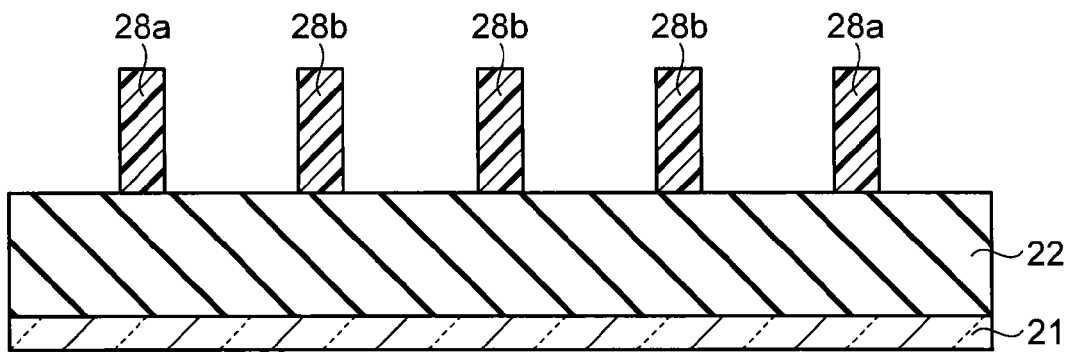
Figure 15C:
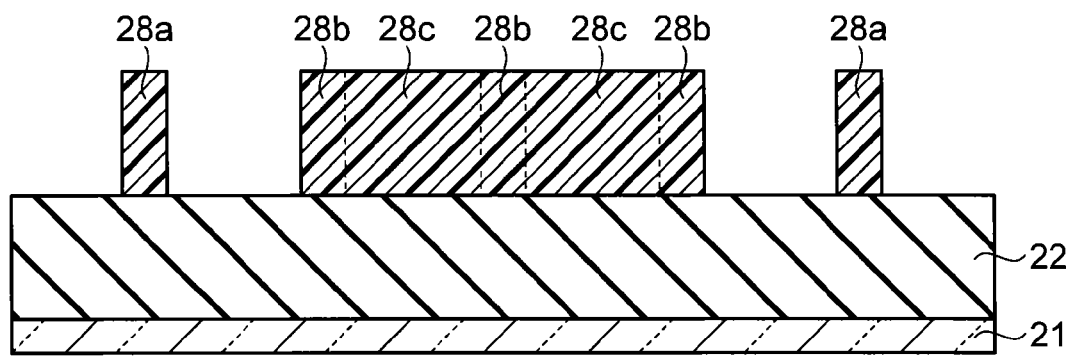
Figure 15D:
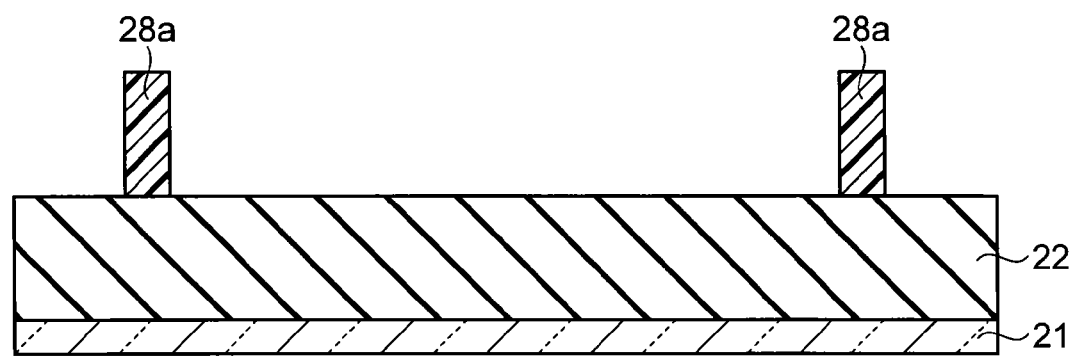
Figure 16A:
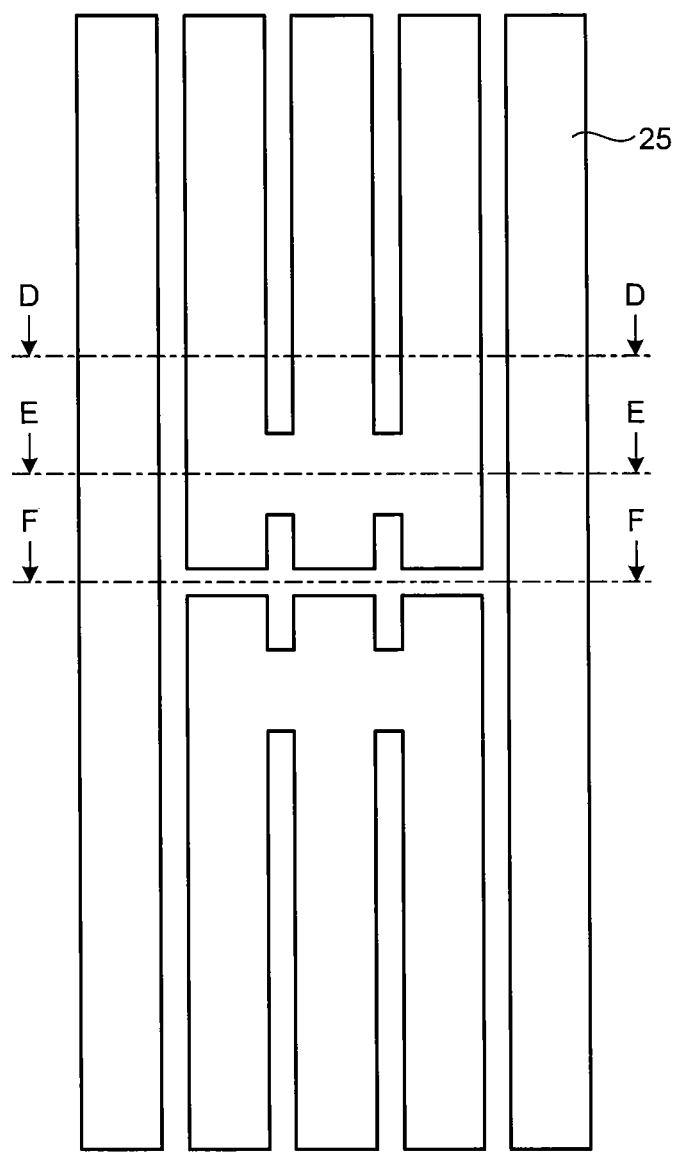
Figure 16B:
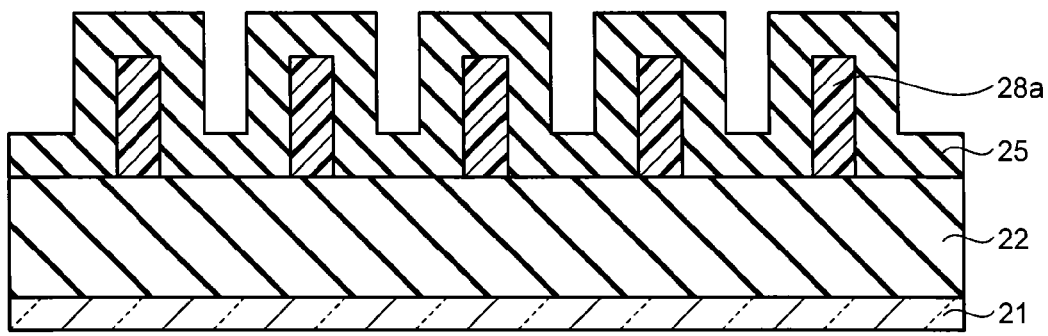
Figure 16C:
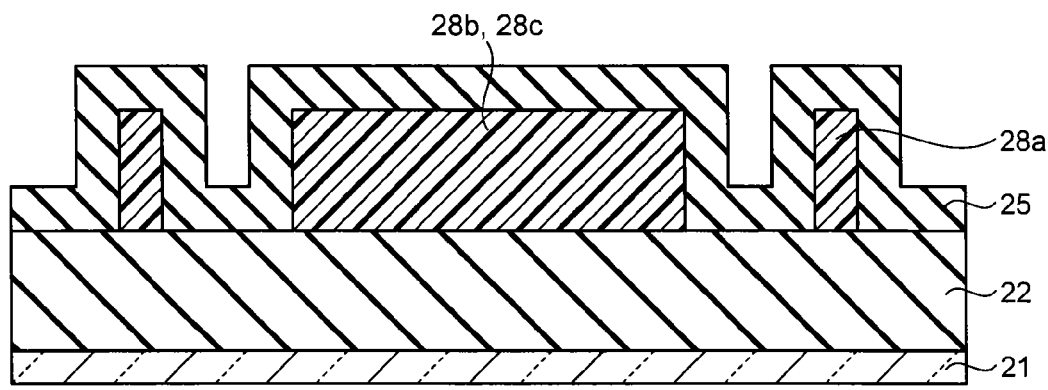
Figure 16D:
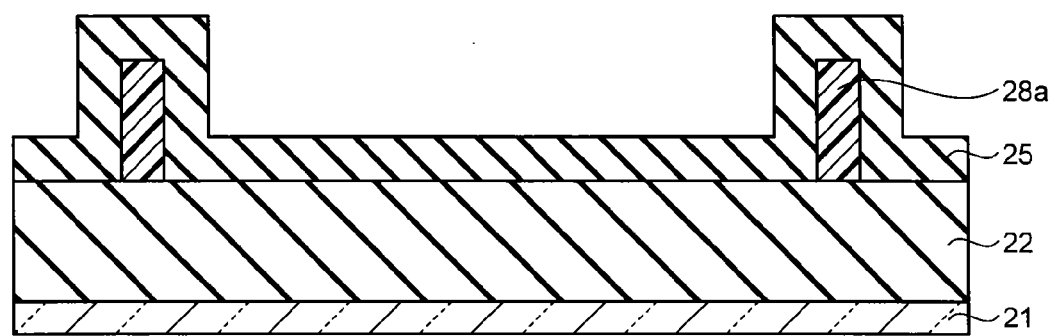
Figure 17A:
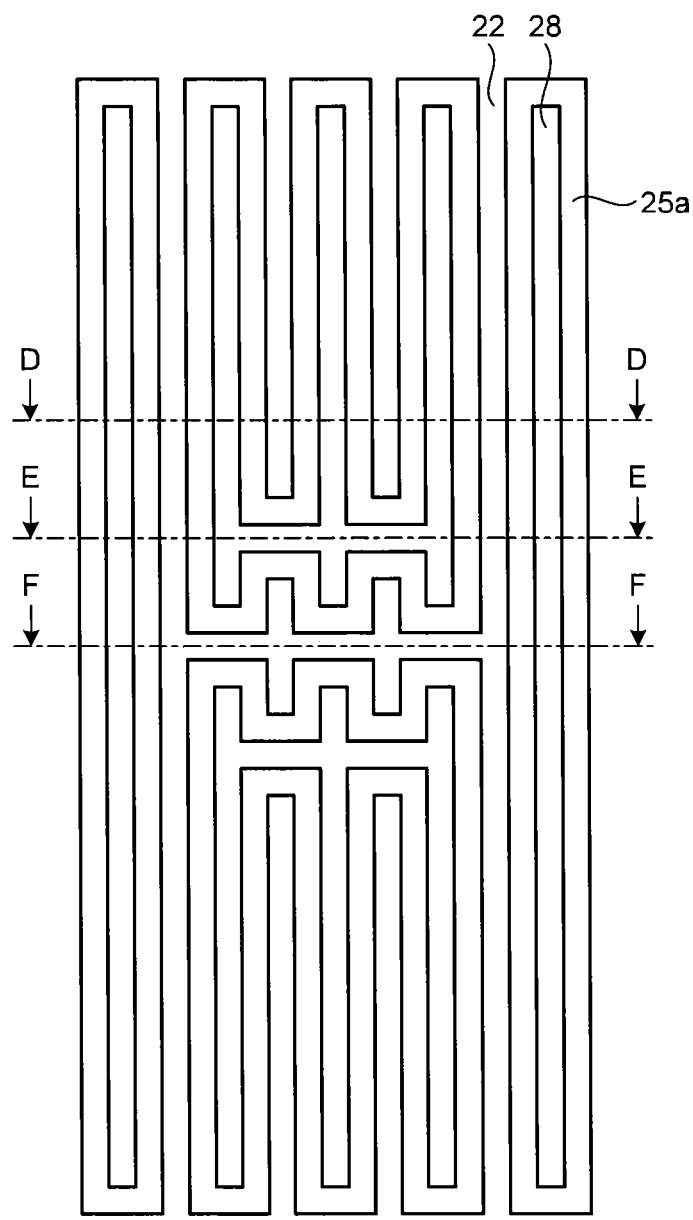
Figure 17B:
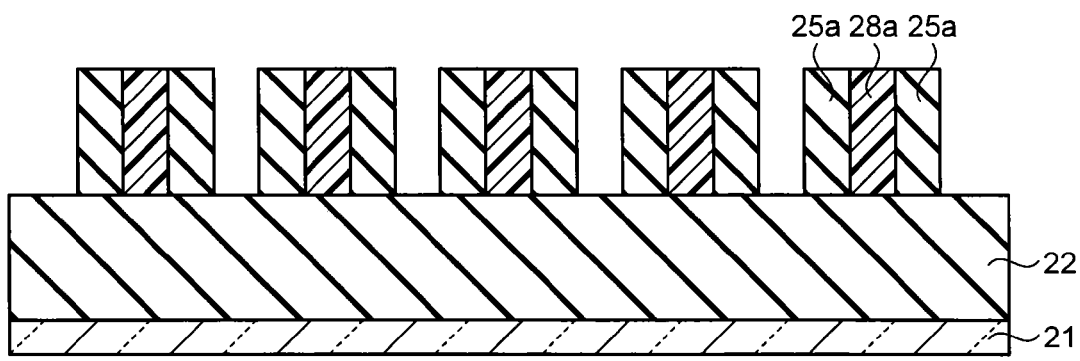
Figure 17C:
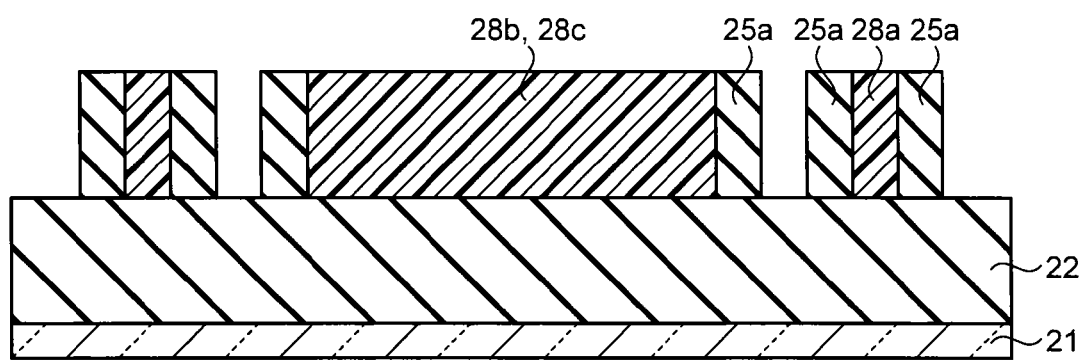
Figure 17D:
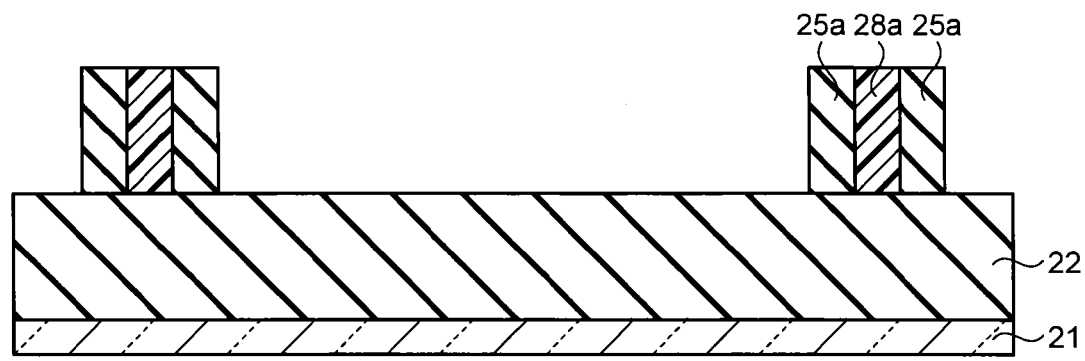
Figure 18A:
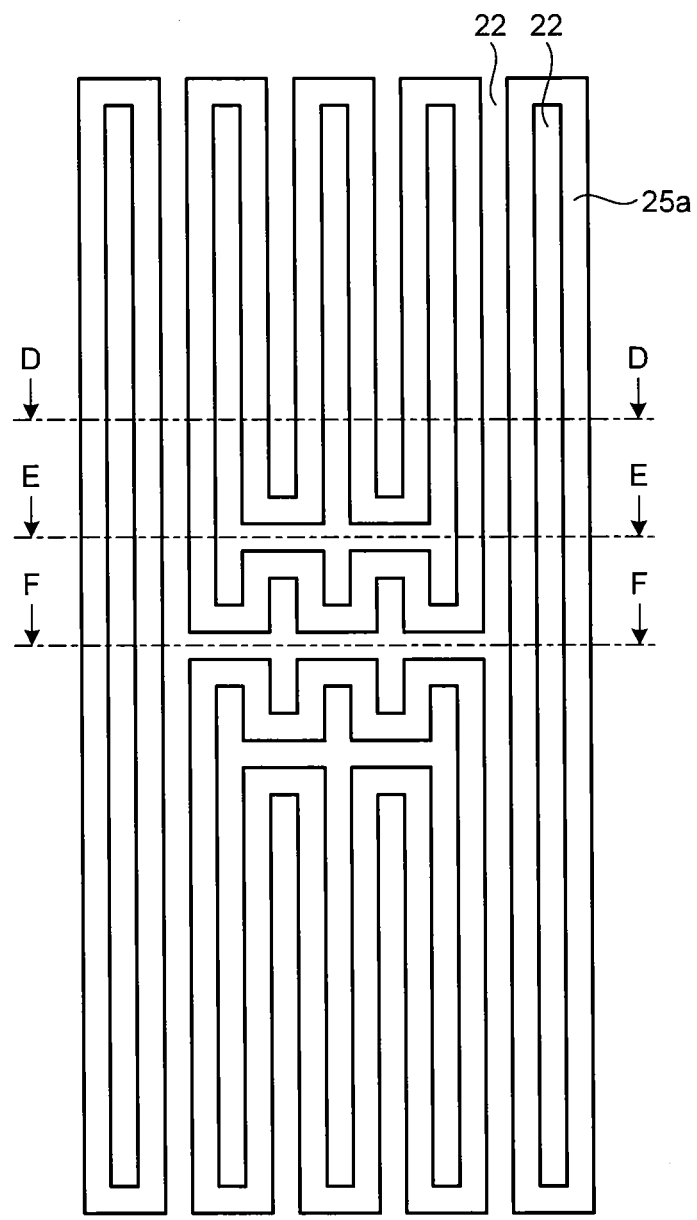
Figure 18B:
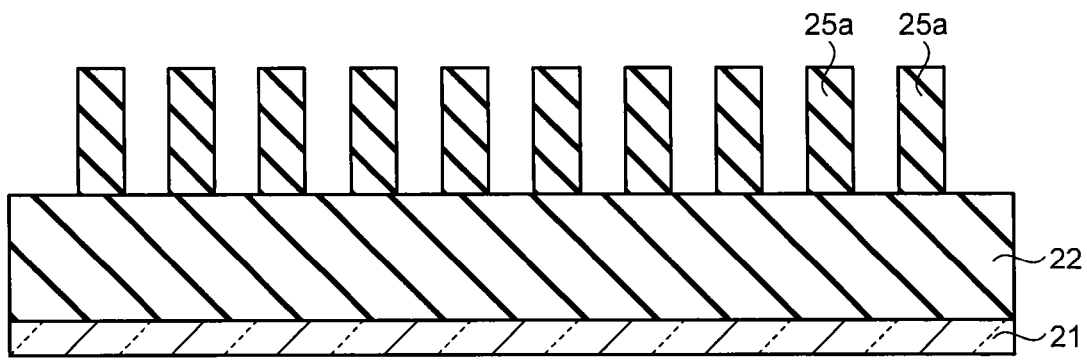
Figure 18C:
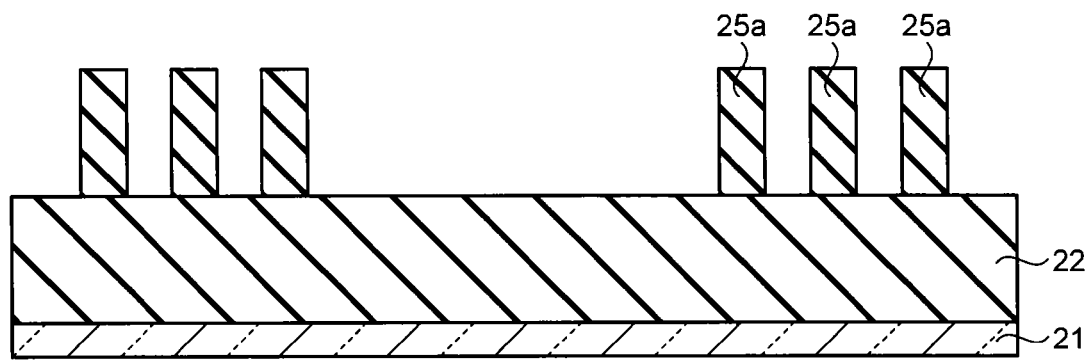
Figure 18D:
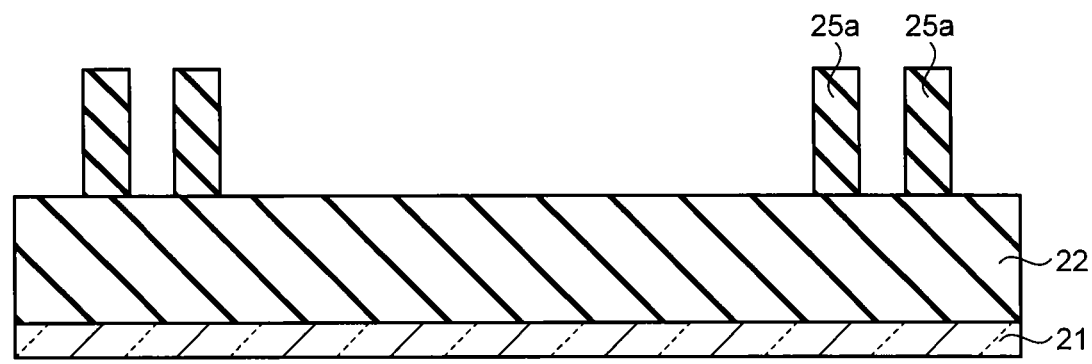
Figure 19A:
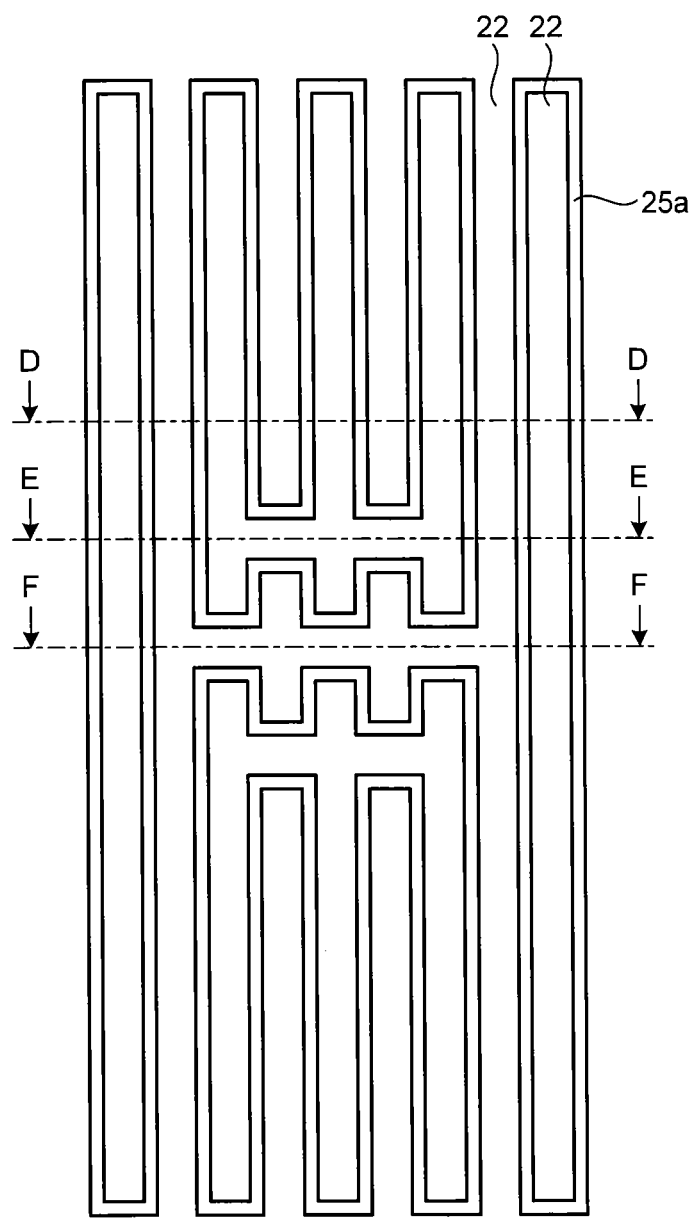
Figure 19B:
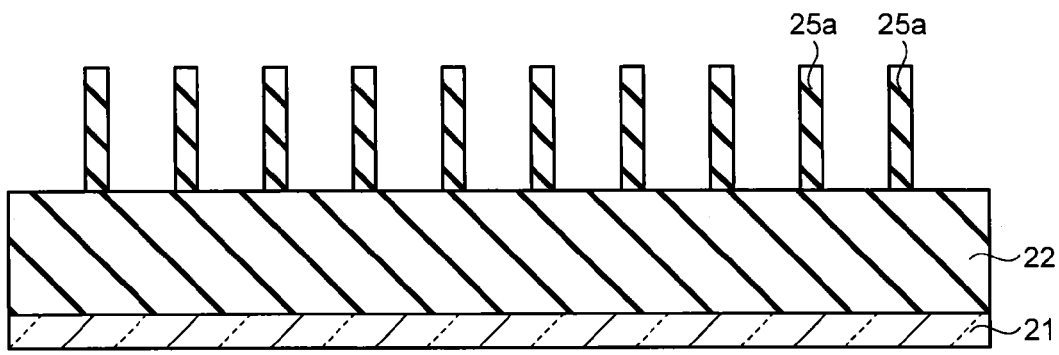
Figure 19C:
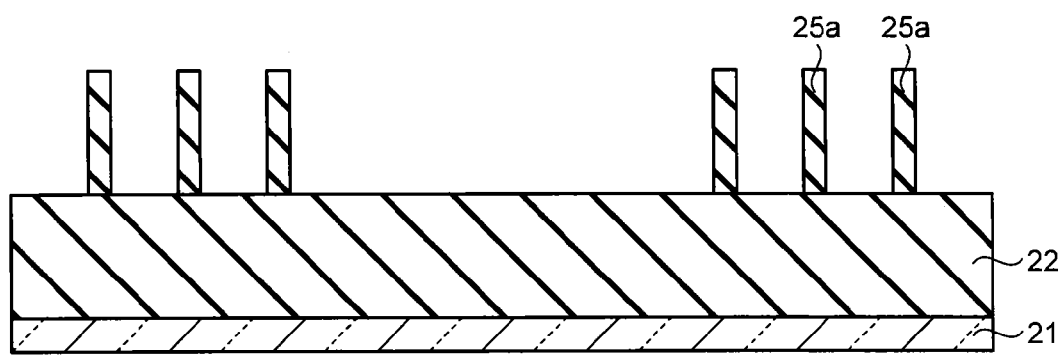
Figure 19D:
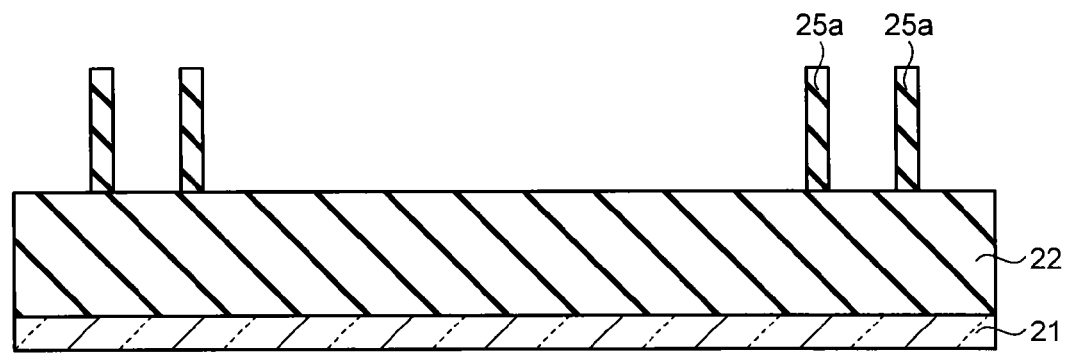
Figure 20A:
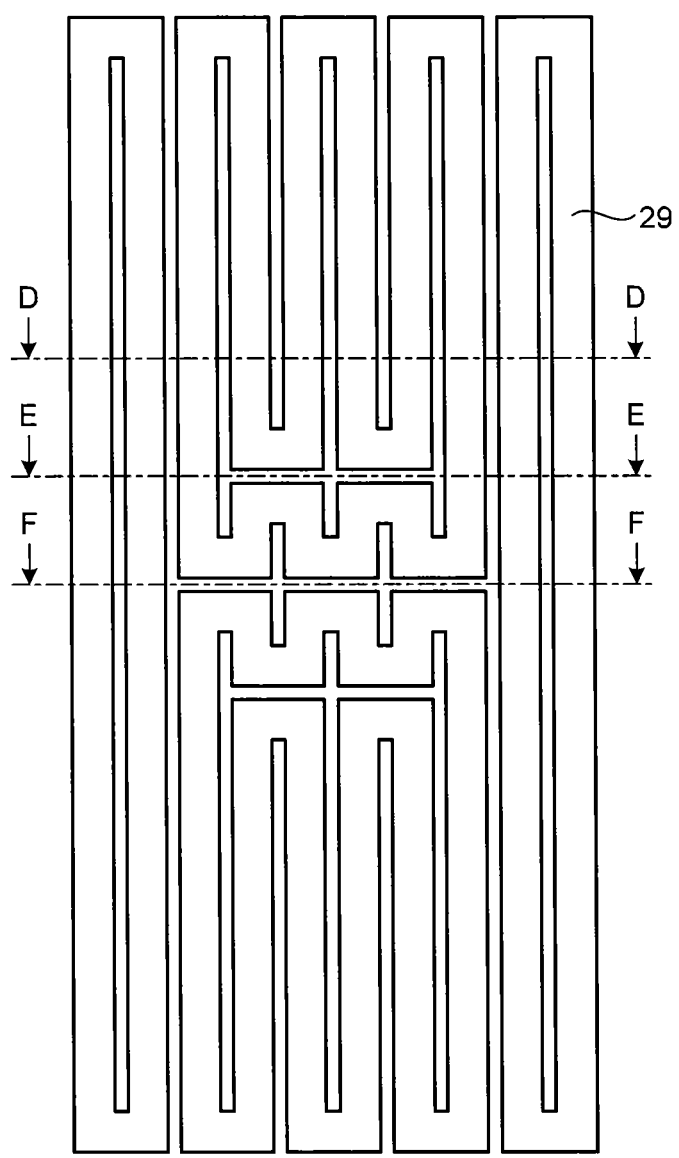
Figure 20B:
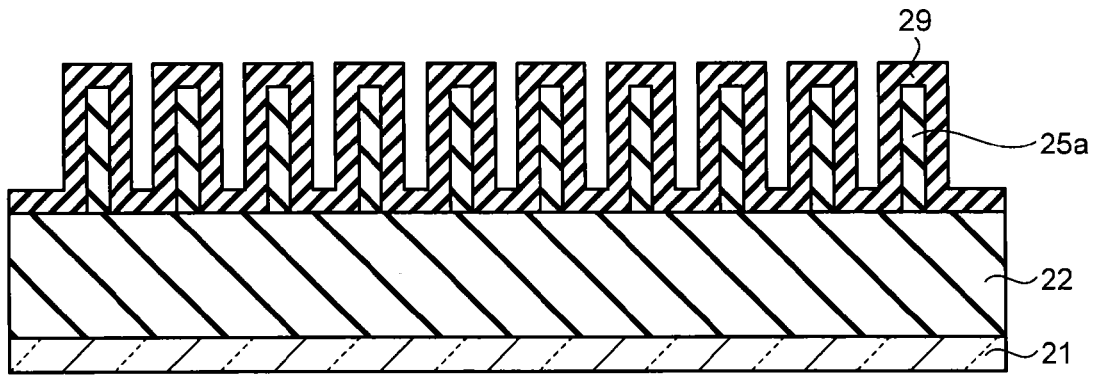
Figure 20C:
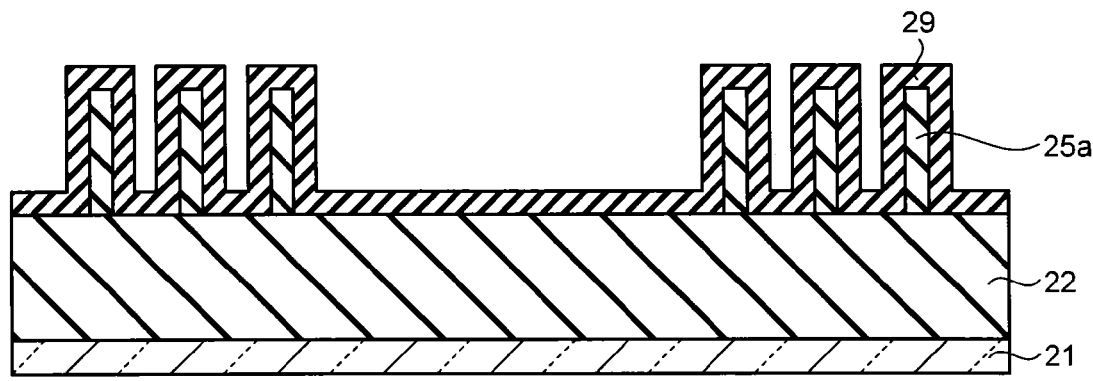
Figure 20D:
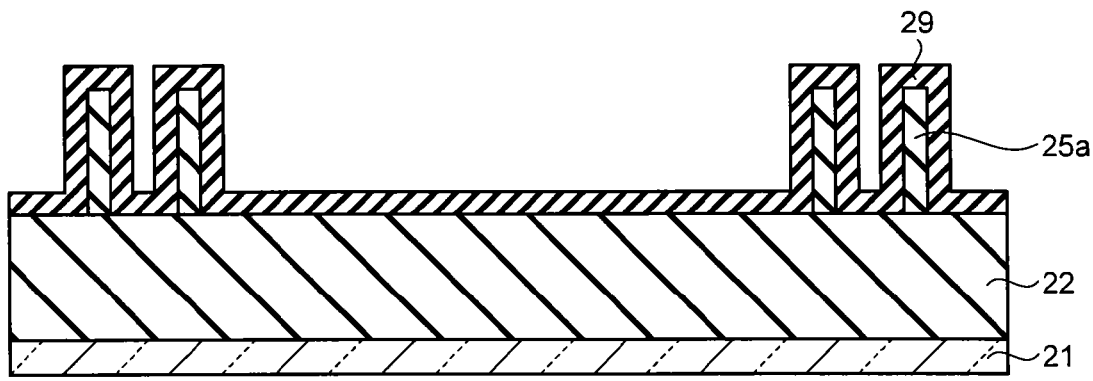
Figure 21A:
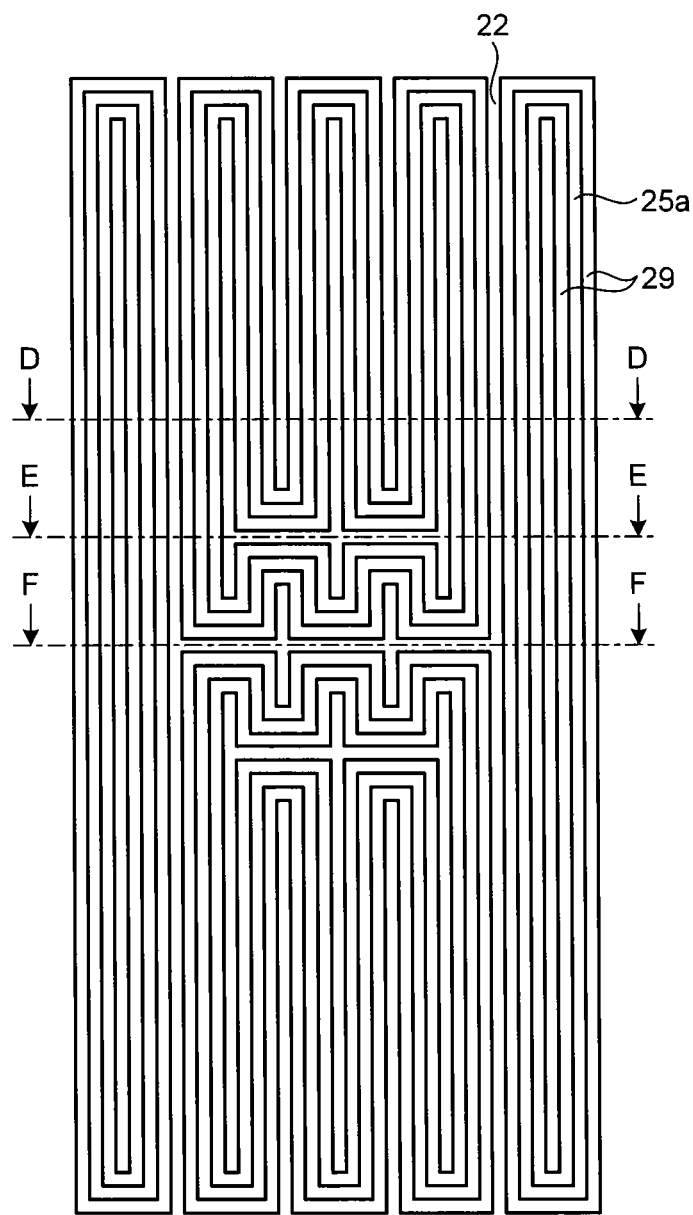
Figure 21B:
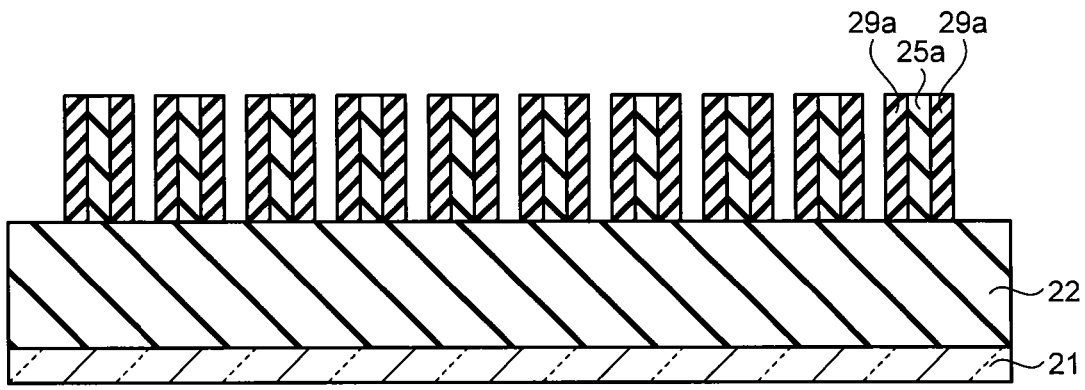
Figure 21C:
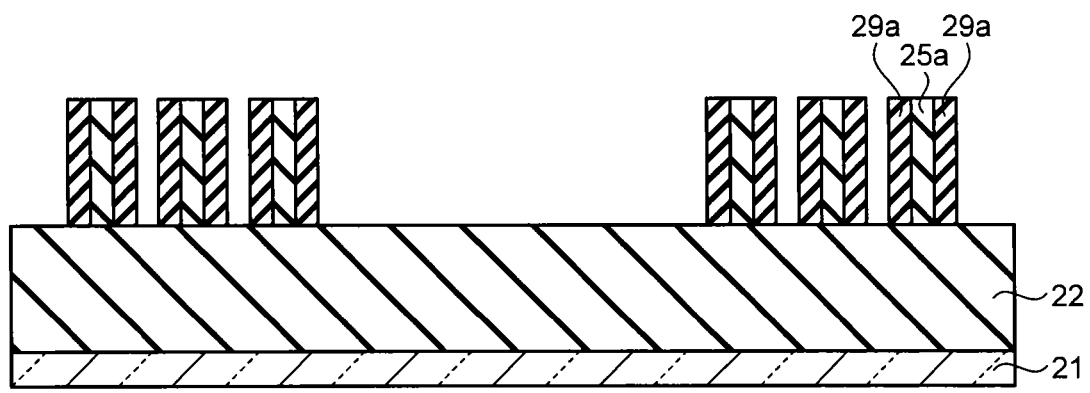
Figure 21D:
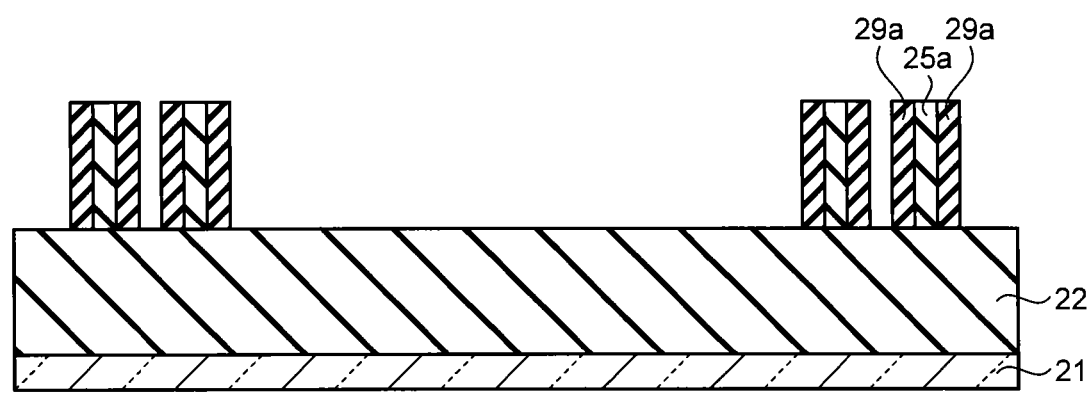
Figure 22A:
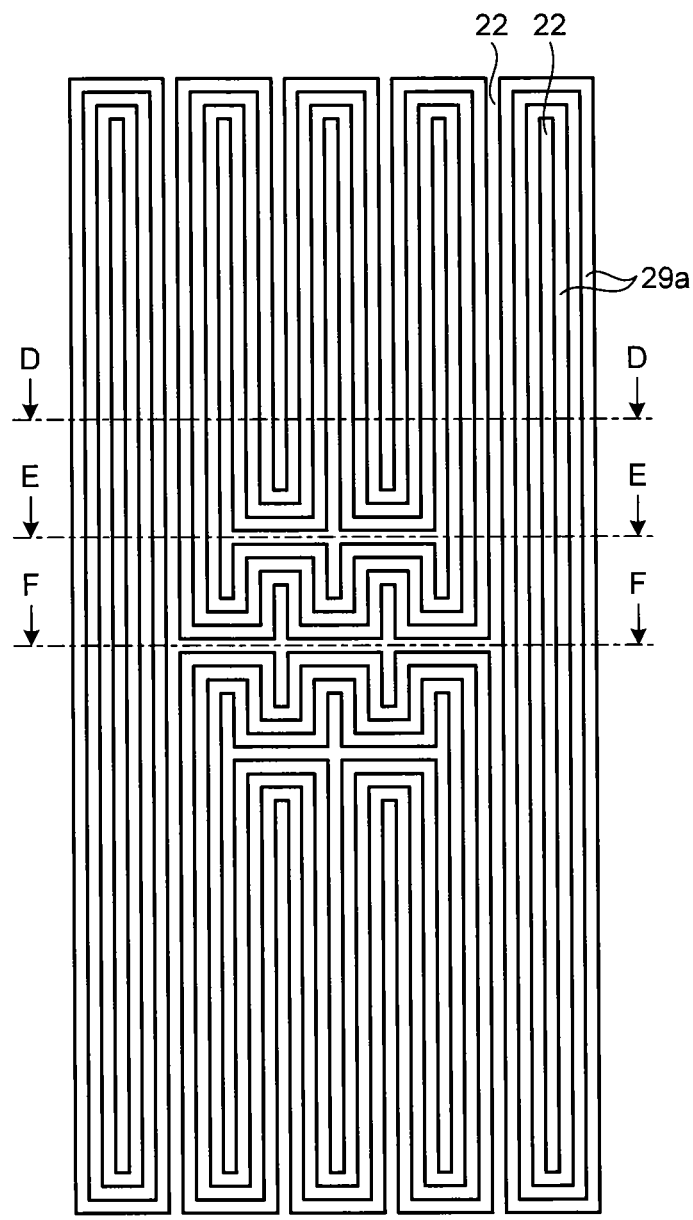
Figure 22B:
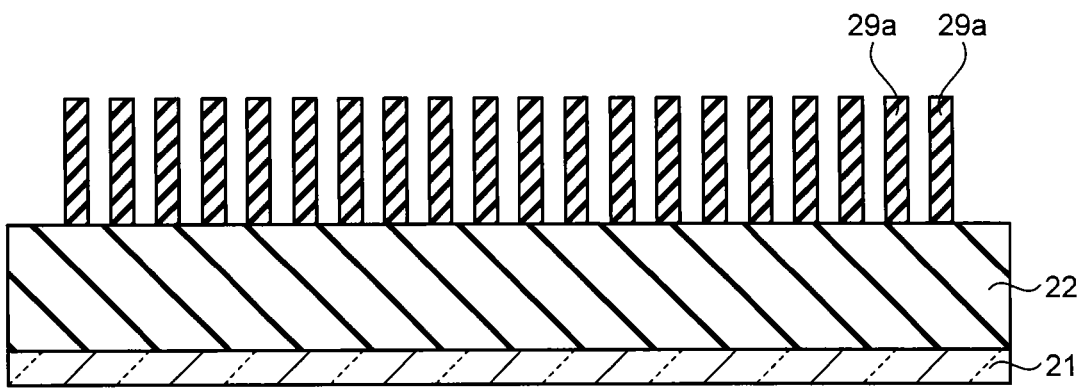
Figure 22C:
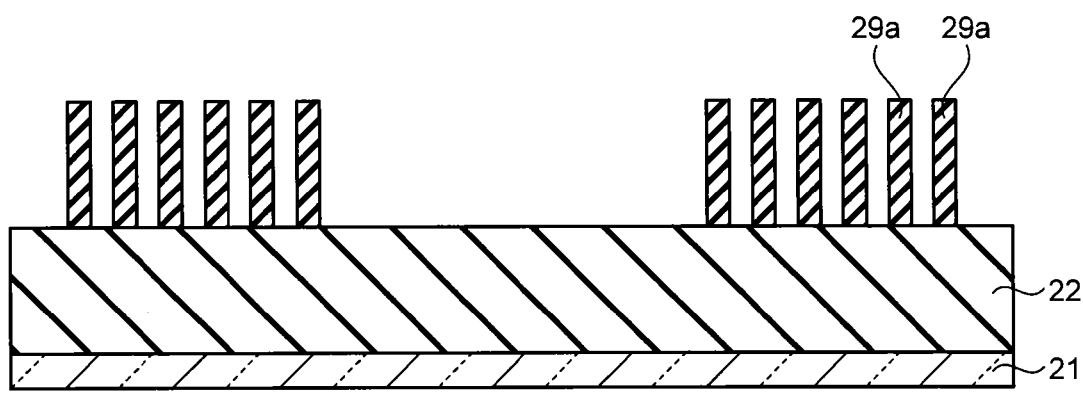
Figure 22D:
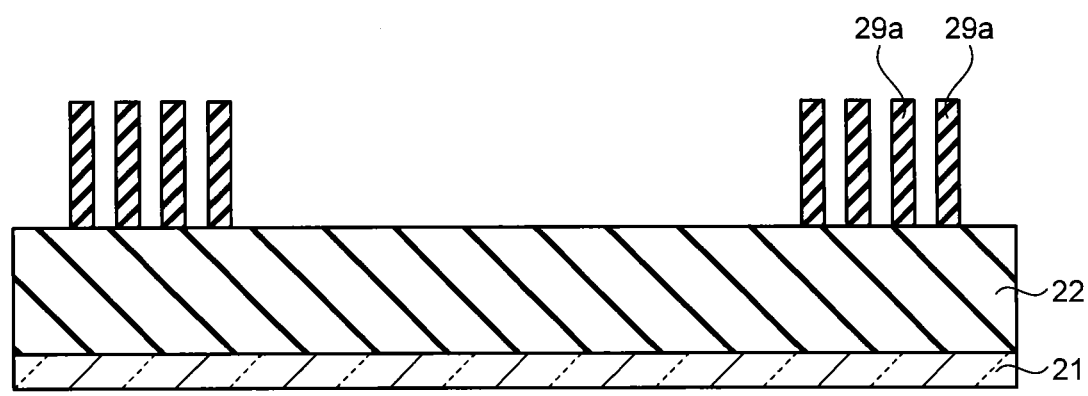

Thereafter, a resist film is applied on the interlayer insulating film 22, and then, an exposure process using the mask illustrated in FIG. 1 according to the lithography process and a development process are performed. Thus, a line-and-space resist pattern 28 is formed, wherein some line patterns are separated, and connected by a connection pattern. As illustrated in FIG. 14B, line patterns 28a and 28b are arranged with a predetermined space in the x direction on D-D portion, while on E-E portion, a connection pattern 28c connecting three line patterns 28b, except for the outside line patterns 28a, in the x direction is formed as illustrated in FIG. 14C. As illustrated in FIG. 14D, the line patterns 28b are not formed between the outside line patterns 28a on F-F portion. Specifically, the connection pattern 28c extending in the x direction connects the separated line patterns 28b, and the side end of the separated line pattern 28b close to the connection pattern 28c projects in the y direction from the connection pattern 28c.

Thereafter, as illustrated in FIGS. 15A to 15D, a slimming process is performed until the width of the resist patterns 28a and 28b in the x direction becomes substantially a half by the etching. The usable etching process includes a WET etching process, a RIE process, and an Asher process.

Next, as illustrated in FIGS. 16A to 16D, a sidewall film 25 is formed on the entire surface of the interlayer insulating film 22. The sidewall film 25 is formed to conformally coat the resist patterns 28a, 28b, and 28c formed on the interlayer insulating film 22. A low-temperature oxide film or a low-temperature nitride film, which can be formed at room temperature different from the resist film and the interlayer insulating film 22, can be used as the sidewall film 25. The thickness can be set to be almost equal to the width of the resist patterns 28a and 28b in the x direction.

Then, as illustrated in FIGS. 17A to 17D, the formed sidewall film 25 is etched back until the top surface of the resist patterns 28a, 28b, and 28c and the top surface of the interlayer insulating film 22 are exposed by the anisotropic etching such as the RIE process. According to this process, the top surface of the resist patterns 28a, 28b, and 28c and the top surface of the interlayer insulating film 22 are exposed, and a sidewall pattern 25a that is a loop-shaped sidewall film 25 is left around the resist patterns 28a, 28b, and 28c.

Then, as illustrated in FIGS. 18A to 18D, the resist patterns 28a, 28b, and 28c are removed by the etching process. Thus, the loop-shaped sidewall pattern 25a is left on the interlayer insulating film 22. As the method of removing the resist patterns 28a, 28b, and 28c, the wet etching process, the RIE process, or the Asher process can be used.

Thereafter, the processes same as the processes illustrated in FIGS. 8A to 10D in the first embodiment are carried out. Specifically, the resist pattern 26 is formed to cover the pattern on the separated portion, the interlayer insulating film 22 is etched by using the sidewall pattern 25a and the resist pattern 26 as a mask to form a wiring-forming channel 221, and a metal wiring 27 is embedded in the wiring-forming channel 221. As described above, the pattern forming method according to the second embodiment is finished.

According to the second embodiment, the resist pattern 28 is formed to have a function as the sacrifice film. Therefore, the used material is decreased more than in the pattern forming method according to the first embodiment. Further, the removal of the resist pattern 28 can be simplified. Consequently, the second embodiment brings an effect of simplifying the process of the pattern forming method.

(Third Embodiment)

In the first and second embodiments, the metal wiring with the width ½ the size of the pattern formed by using the mask is formed. In the third embodiment, a pattern forming method will be described, wherein a metal wiring with a width ¼ the size of a pattern formed by using a mask can be formed.

FIGS. 19A to 25A are top views illustrating one example of the pattern forming method according to the third embodiment, FIGS. 19B to 25B are cross-sectional views of FIGS. 19A to 25A taken along a line D-D, FIGS. 19C to 25C are cross-sectional views of FIGS. 19A to 25A taken along a line E-E, and FIGS. 19D to 25D are cross-sectional views of FIGS. 19A to 25A taken along a line F-F. The processes in FIGS. 14A to 18D in the second embodiment are employed in the third embodiment, so that the redundant description will not be repeated.

After the loop-shaped sidewall pattern 25a is formed in FIGS. 18A to 18D in the second embodiment, a slimming process is carried out by the etching until the width of the sidewall pattern 25a in the x direction becomes substantially a half as illustrated in FIGS. 19A to 19D. The usable etching process includes a WET etching process, a RIE process, and an Asher process.

Next, as illustrated in FIGS. 20A to 20D, a sidewall film 29 is formed on the entire surface of the interlayer insulating film 22. The sidewall film 29 is formed to conformally coat the sidewall pattern 25a formed on the interlayer insulating film 22. A film different from the sidewall film 25 and the interlayer insulating film 22 can be used as the sidewall film 29. For example, an oxide film or a nitride film can be used. The thickness can be set to be almost equal to the width of the sidewall pattern 25a in the x direction.

Then, as illustrated in FIGS. 21A to 21D, the formed sidewall film 29 is etched back until the top surface of the sidewall pattern 25a and the top surface of the interlayer insulating film 22 are exposed by the anisotropic etching such as the RIE process. According to this process, the top surface of the sidewall pattern 25a and the top surface of the interlayer insulating film 22 are exposed, and a sidewall pattern 29a that is a loop-shaped sidewall film 29 is left around the sidewall pattern 25a.

Then, as illustrated in FIGS. 22A to 22D, the sidewall pattern 25a is removed by the etching process. Thus, the loop-shaped sidewall pattern 29a is left on the interlayer insulating film 22. As the method of removing the sidewall pattern 25a, the RIE process, or the wet etching process can be used.

Then, as illustrated in FIGS. 23A to 23D, a resist film is applied on the interlayer insulating film 22 on which the sidewall pattern 29a is formed, an exposure process is performed by the lithography technique, and a development process is performed. Thus, a resist pattern 30 is formed to cover the pattern on the separated portion. The resist pattern 30 covers the separated pattern to cover the portion that is to become a metal wiring portion, whereby the metal wiring, which is to be formed later, can be separated.

When the pattern layout having the separation portion is used, a margin can be secured, even if misalignment occurs upon forming the cover pattern (resist pattern 30) during the lithography process.

Figure 23A:
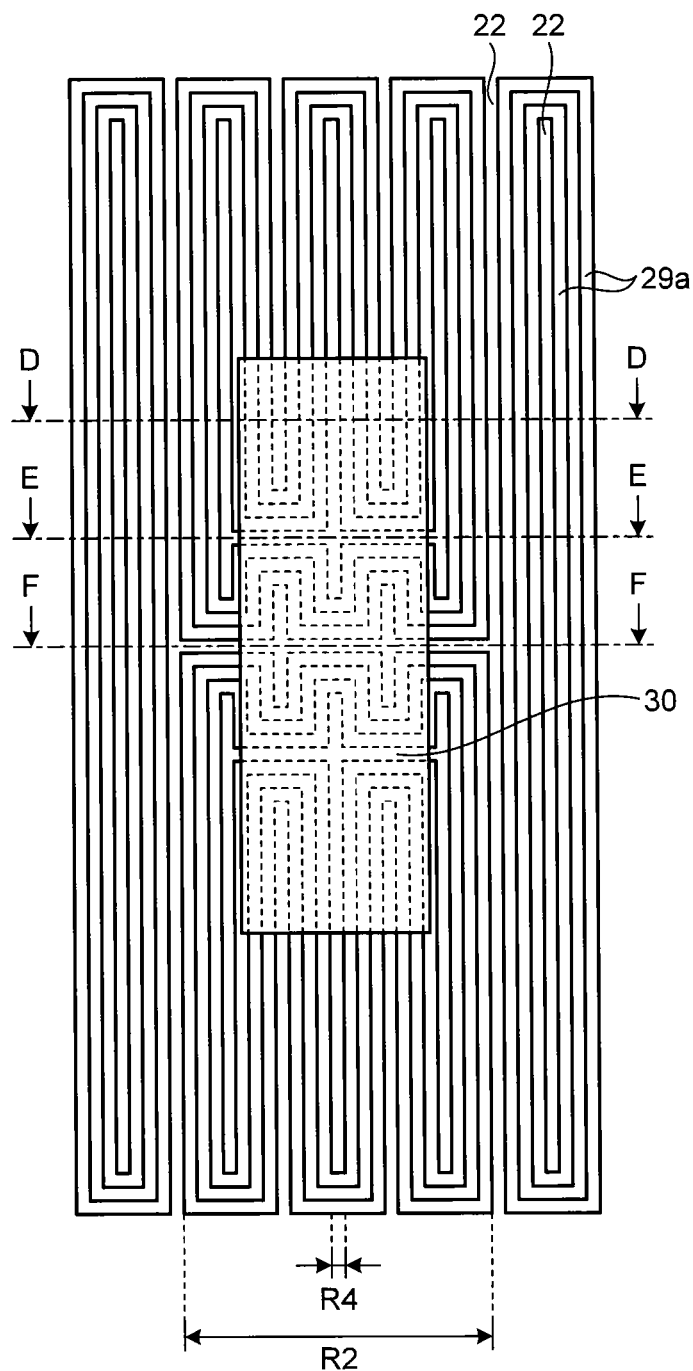
Figure 23B:
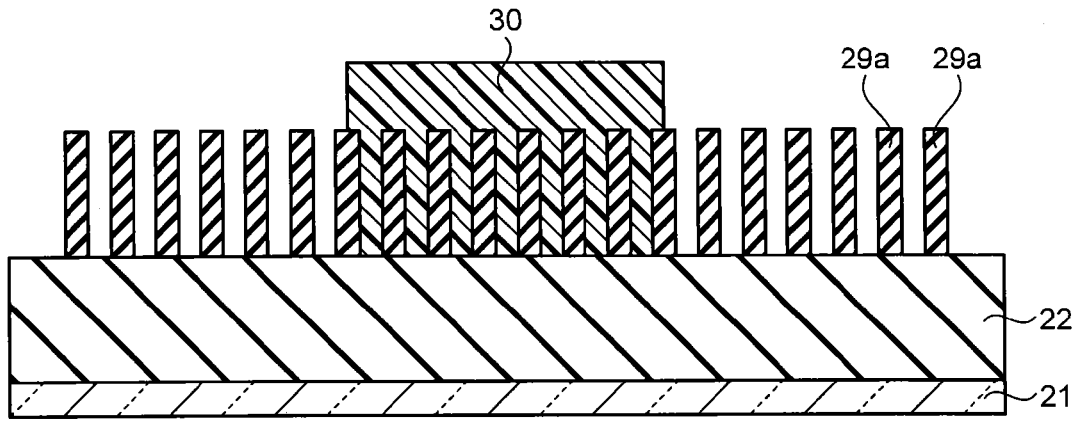
Figure 23C:
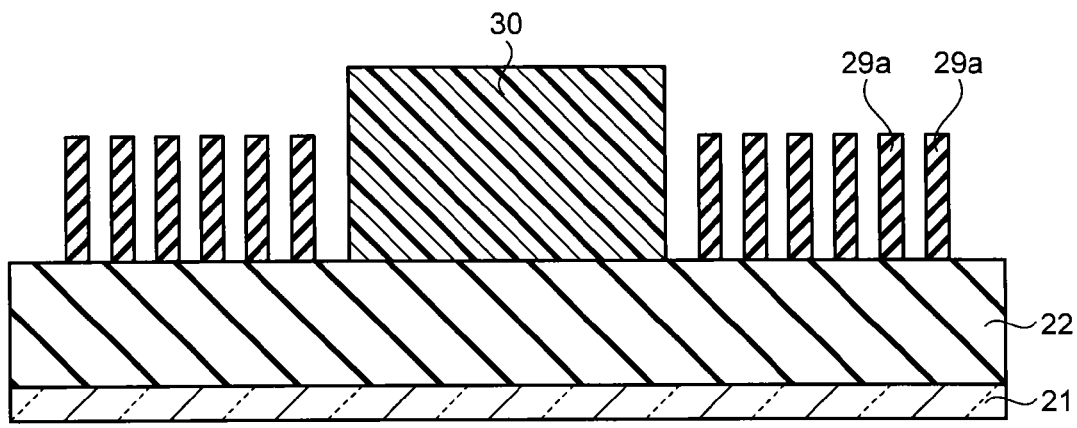
Figure 23D:
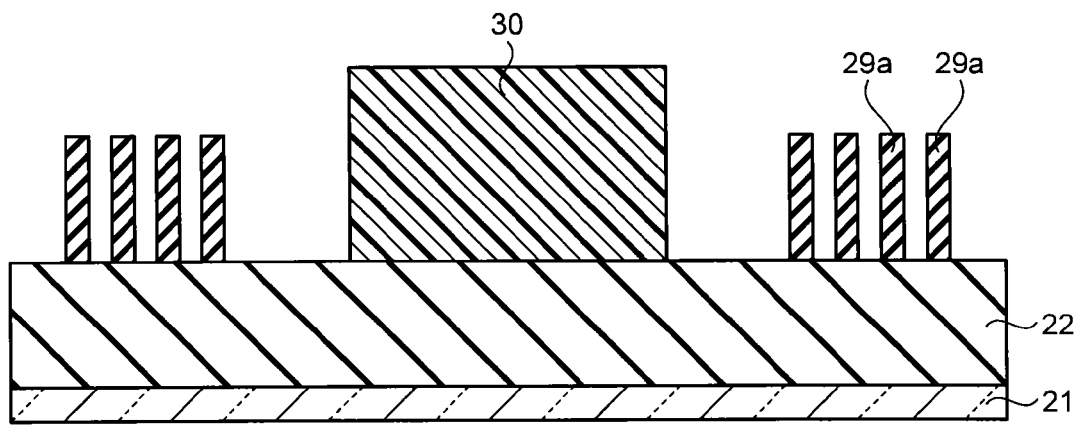
Figure 24A:
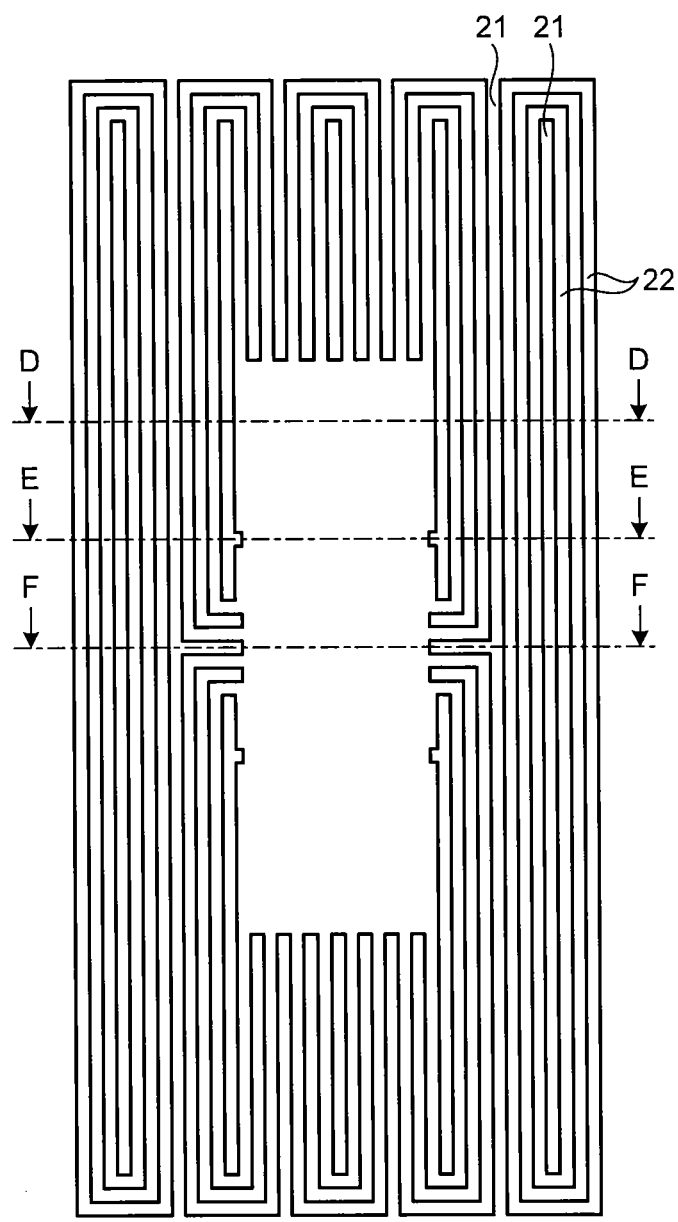
Figure 24B:
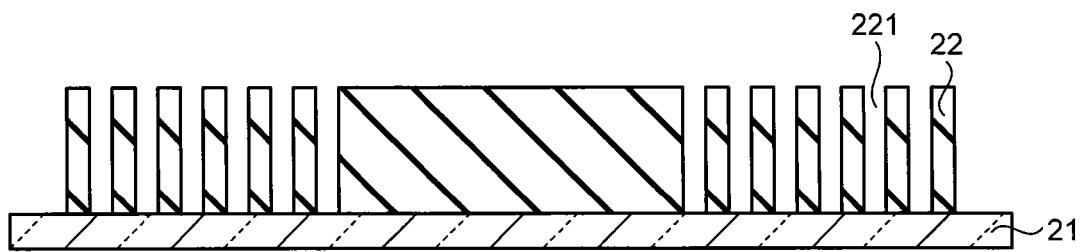
Figure 24C:
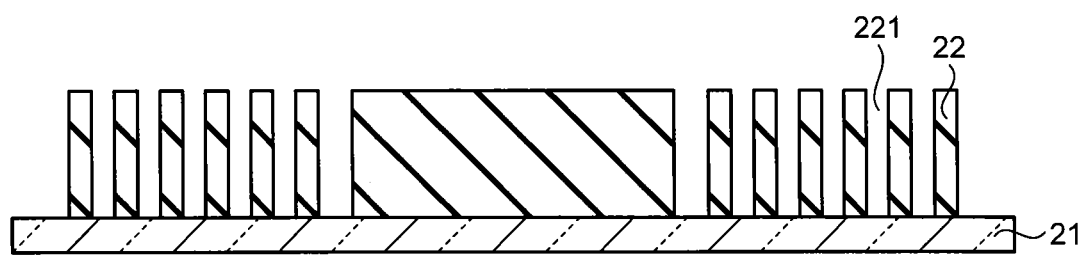
Figure 24D:
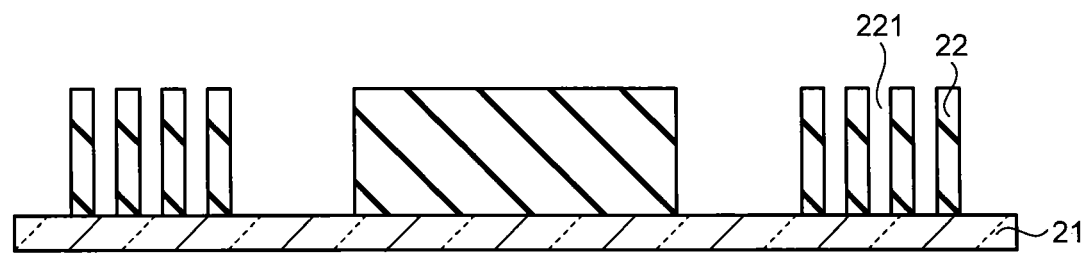
Figure 25A:
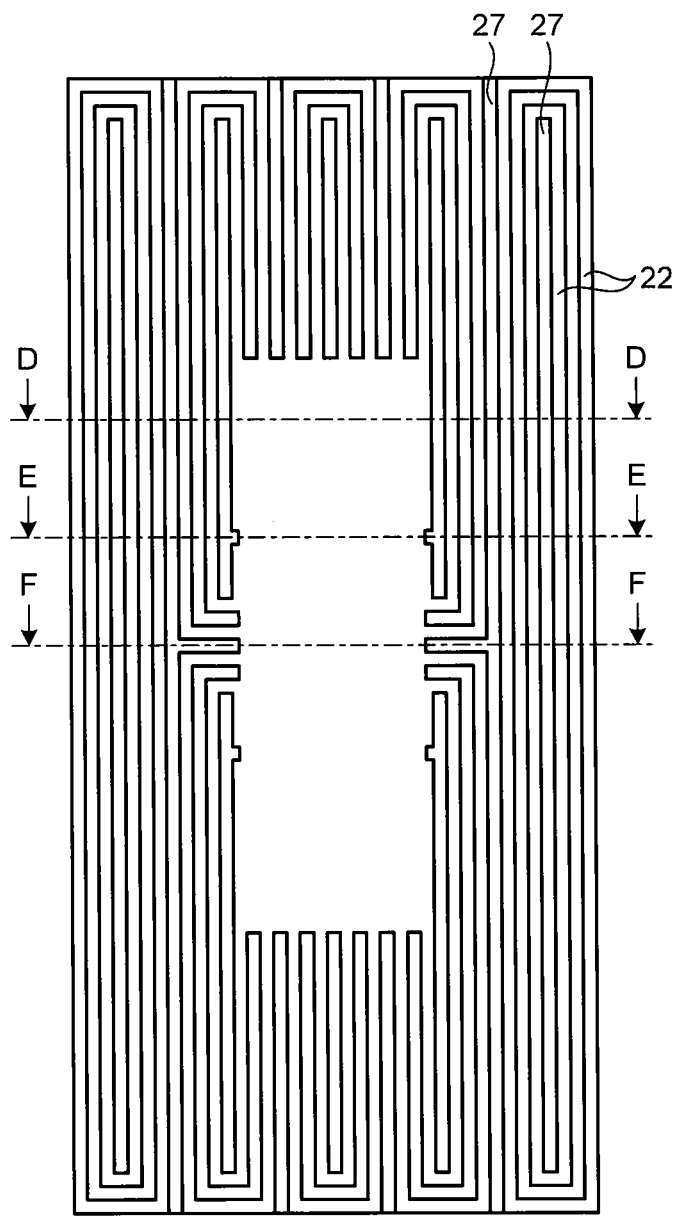
Figure 25B:
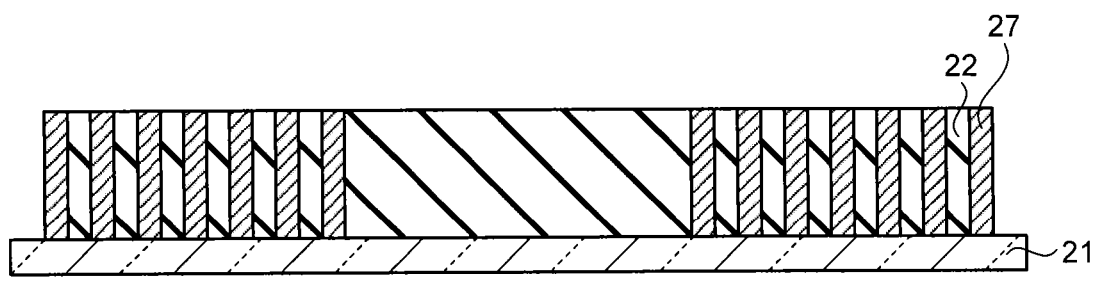
Figure 25C:
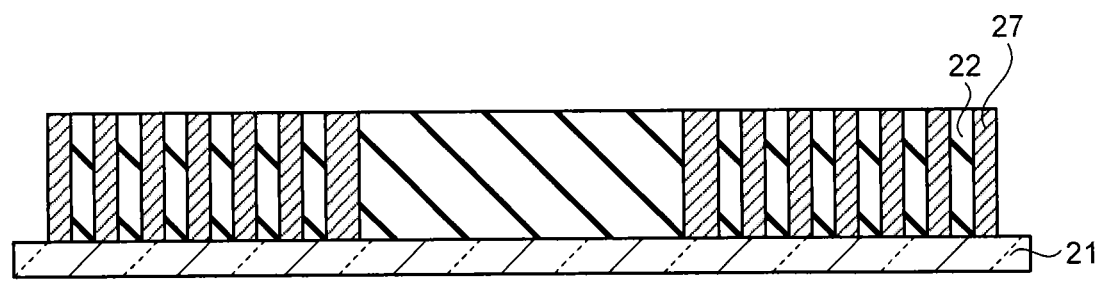
Figure 25D:
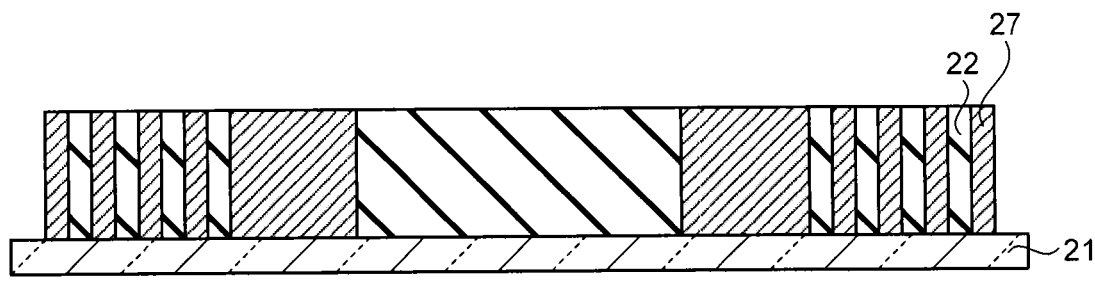

In the pattern illustrated in FIG. 23A, if a central region R4 in a region R2 where the line patterns are separated can be covered by the resist pattern 30, the wiring pattern formed on the interlayer insulating film 22 can ideally be separated by the resist pattern 30. In this case, the margin corresponding to six sidewalls can be secured, whereby a marginal process can be constructed.

Next, as illustrated in FIGS. 24A to 24D, the interlayer insulating film 22 is etched by using the sidewall pattern 29a and the resist pattern 30 as a mask. According to this process, a wiring-forming channel 221 is formed on the interlayer insulating film 22.

As illustrated in FIGS. 25A to 25D, a barrier metal film for preventing the diffusion of the metal that is to become the metal wiring and a seed film serving as a conductive layer upon a plating process are formed in the wiring-forming channel 221, and then, a metal film is formed by the plating process. Cu, Al, or W can be used as the metal film. Thereafter, a metal wiring 27 is formed by an etch-back process so that the metal film is embedded into the wiring-forming channel 221. As described above, the pattern forming method according to the third embodiment is finished.

In the description above, the pattern forming method according to the third embodiment is employed subsequent to the pattern forming method according to the second embodiment. However, the pattern forming method according to the third embodiment can also be applied subsequent to the pattern forming method according to the first embodiment.

As described above, the third embodiment can bring an effect of forming the line pattern with the width ¼ the width of the line pattern formed first, in addition to the effects of the first and second embodiments. The effect of the third embodiment can be attained by the process in which the sidewall forming process is applied by using the sidewall pattern formed in the first sidewall forming process as the sacrifice film.

(Fourth Embodiment)

In the first to third embodiments, the line patterns on the position where the wiring is to be separated are separated by the separation portion, and the separated line patterns are connected by the connection pattern. In the fourth embodiment, a mask for separating only the line patterns located on both ends of the region, where the wiring is to be separated, in the direction vertical to the extending direction of the wiring, and a pattern forming method using the mask will be described.

Figure 26:
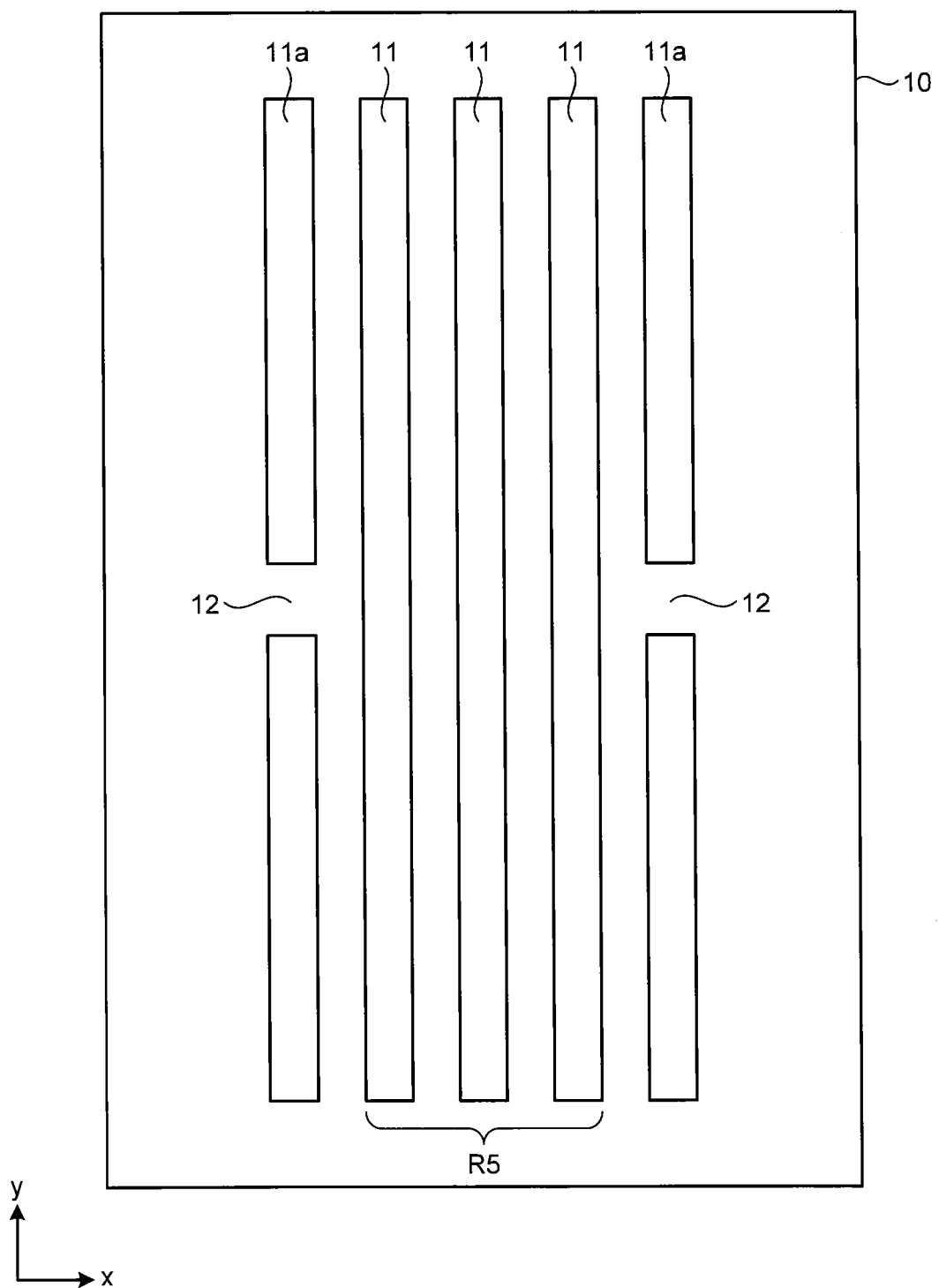
FIG. 26 is a plan view schematically illustrating one example of a mask according to a fourth embodiment.

FIG. 26 is a plan view schematically illustrating one example of a mask according to the fourth embodiment. The mask has a pattern for forming a line-and-space pattern by a sidewall transfer process.

On the mask substrate 10, a plurality of line patterns 11 and 11a extending in the y direction is arranged in the x direction with a pitch almost equal to the width of each of the line patterns 11 and 11a. The line patterns 11 arranged in a region R5 are separated upon forming a metal wiring. In the fourth embodiment, a separation portion 12 is provided on a predetermined position in the y direction of the line patterns 11, located on both ends of the region R5 in the x direction. Specifically, the line patterns 11 sandwiched between a pair of the line patterns 11a having separation portions 12 are those to be separated.

Next, a pattern forming method according to the fourth embodiment will be described. FIGS. 27A to 34A are top views illustrating one example of the pattern forming method according to the fourth embodiment, FIGS. 27B to 34B are cross-sectional views of FIGS. 27A to 34A taken along a line G-G, and FIGS. 27C to 34C are cross-sectional views of FIGS. 27A to 34A taken along a line H-H. The method of forming a metal wiring layer by using a damascene process will be described here.

Figure 27A:
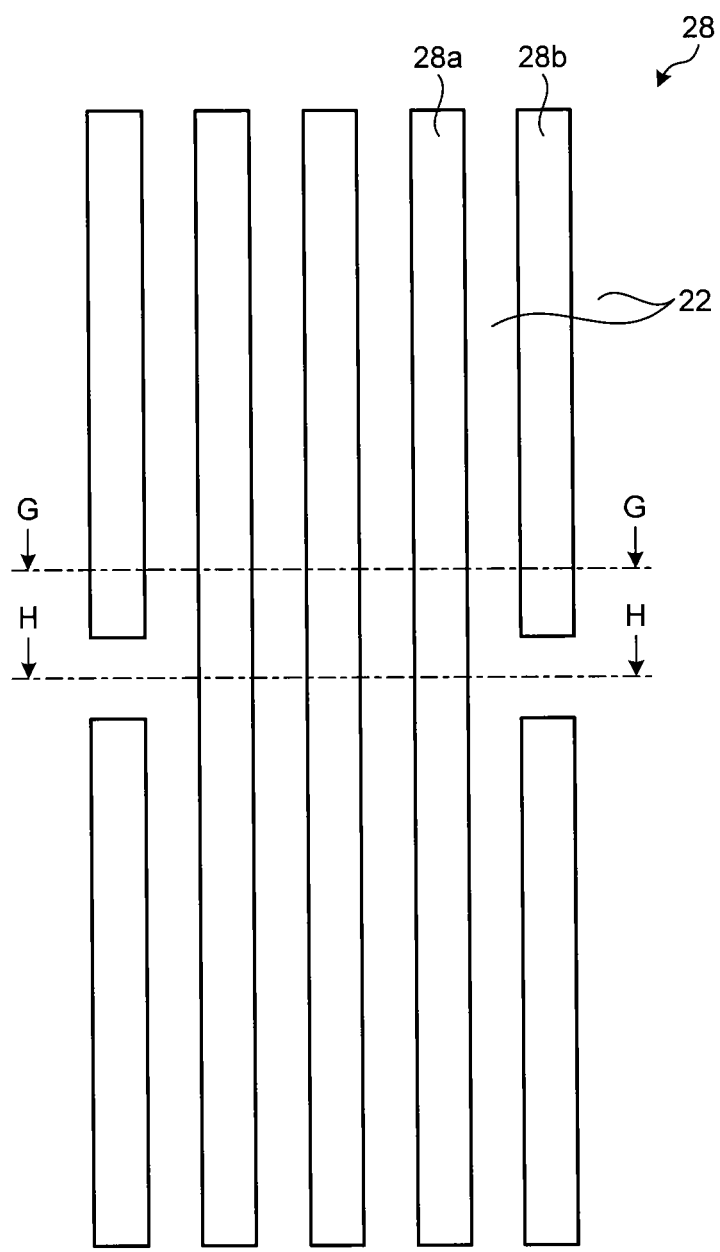
Figure 27B:
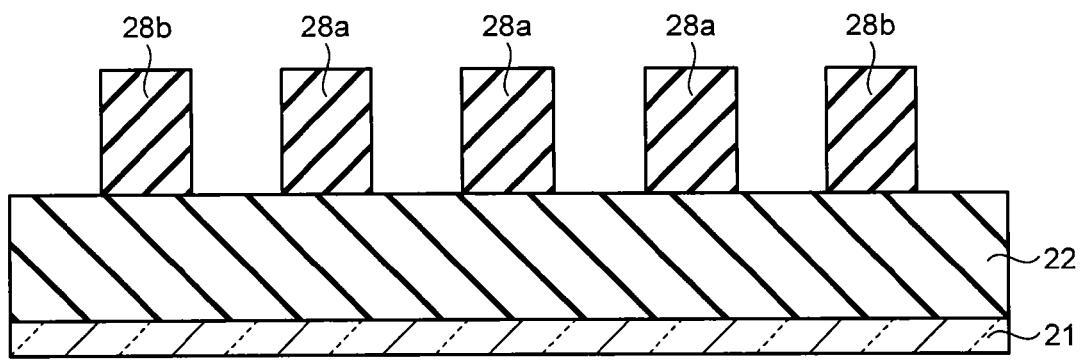
Figure 27C:
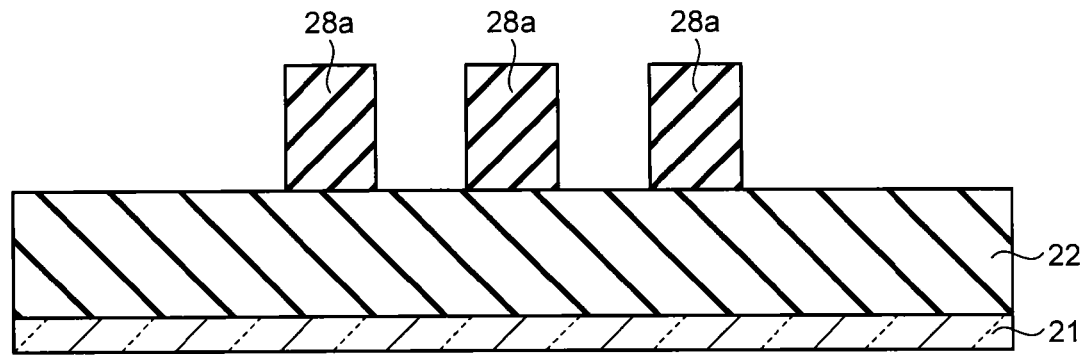

As illustrated in FIGS. 27A to 27C, an interlayer insulating film 22 serving as a film to be processed is formed on a semiconductor substrate 21, such as a silicon substrate, on which an active element such as a memory cell and a transistor or a passive element such as a capacitor is integrally formed. A TEOS film that is a silicon oxide film can be used as the interlayer insulating film 22. A contact hole for connecting the elements formed on the semiconductor substrate 21 and a metal wiring that is to be formed later is formed on the interlayer insulating film 22.

Thereafter, a resist film is applied on the interlayer insulating film 22, and then, an exposure process using the mask illustrated in FIG. 26 according to the lithography process and a development process are performed. Thus, a line-and-space resist pattern 28 is formed, wherein some line patterns are separated, and connected by a connection pattern. As illustrated in FIG. 27B, line patterns 28a and 28b are arranged with a predetermined space in the x direction on G-G portion, while on H-H portion, three line patterns 28a, except for the outside line patterns 28b, are formed as illustrated in FIG. 27C. The outermost line patterns 28b are separated into two in the y direction in the vicinity of H-H portion.

Figure 28A:
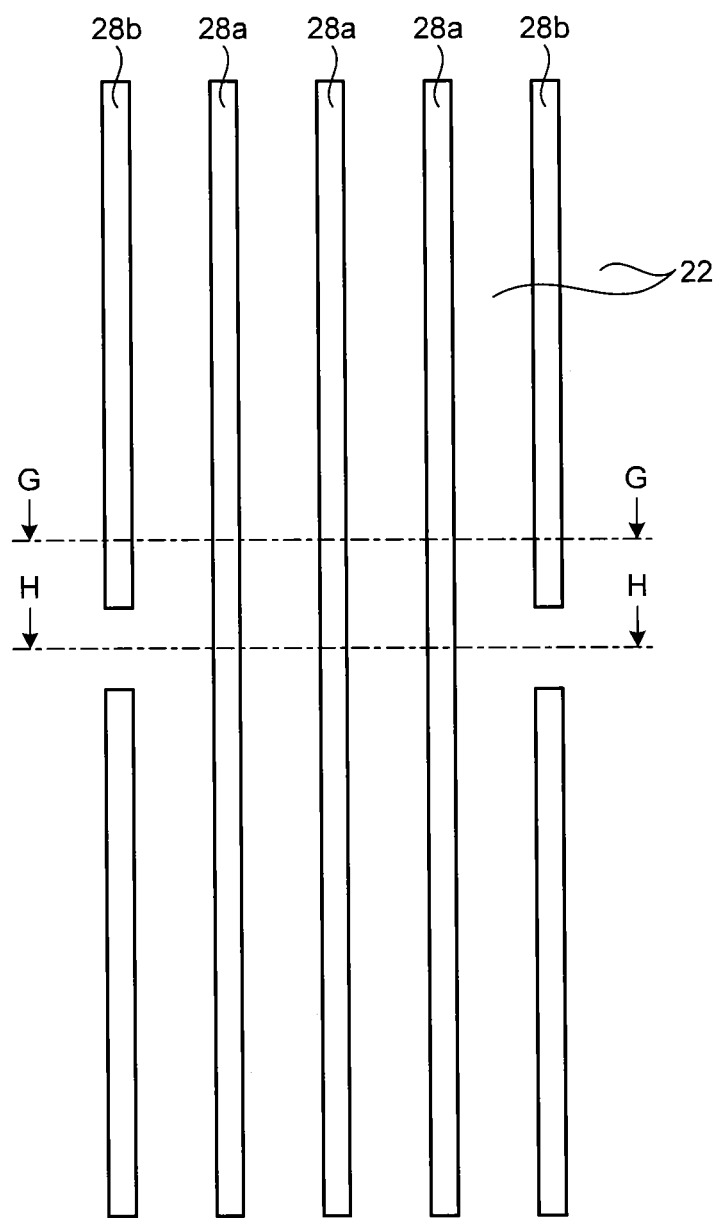
Figure 28B:
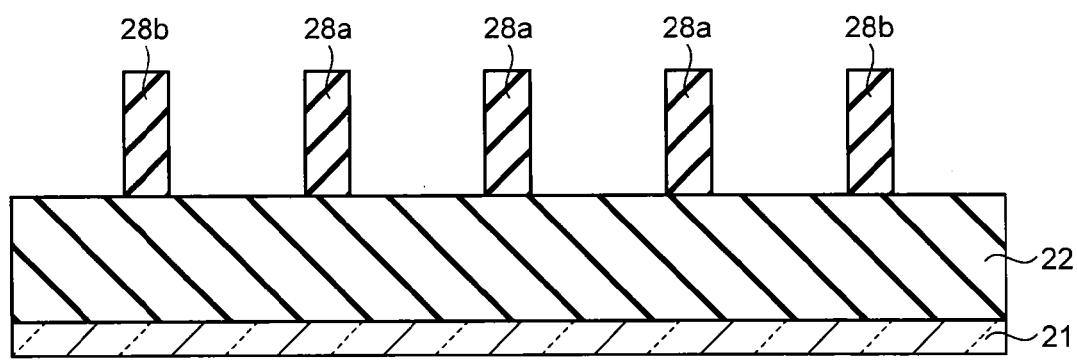
Figure 28C:
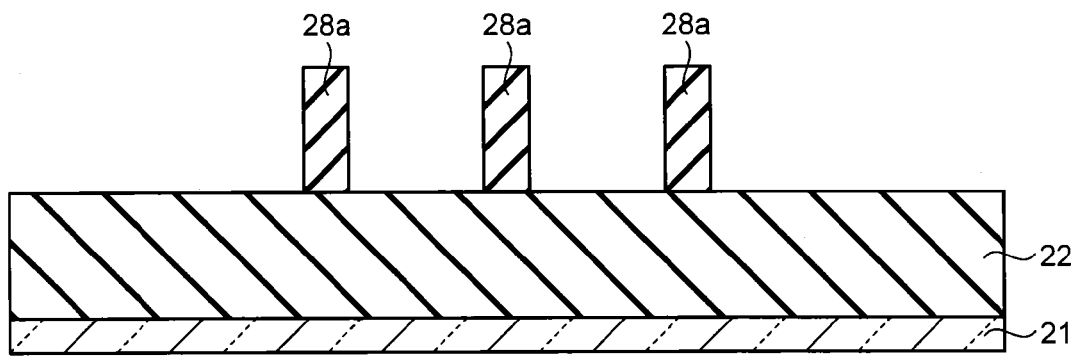

Thereafter, as illustrated in FIGS. 28A to 28C, a slimming process is performed until the width of the resist patterns 28a and 28b in the x direction becomes substantially a half by the etching. The usable etching process includes a WET etching process, a RIE process, and an Asher process.

Figure 29A:
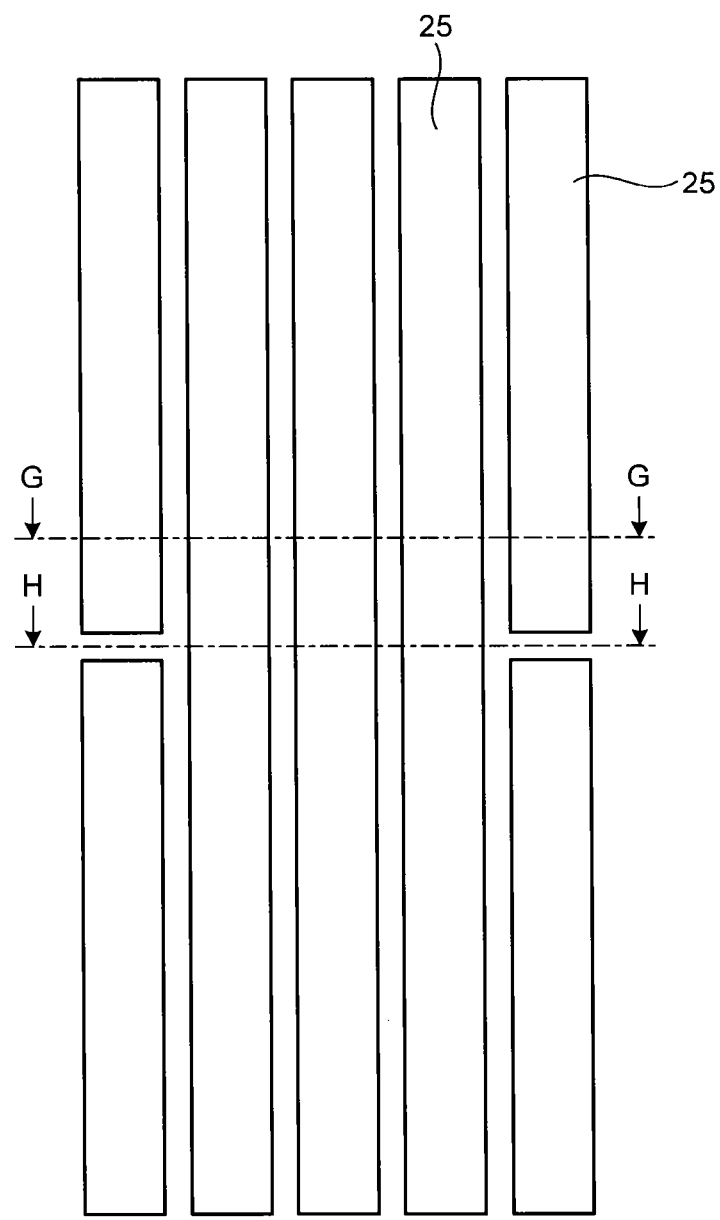
Figure 29B:
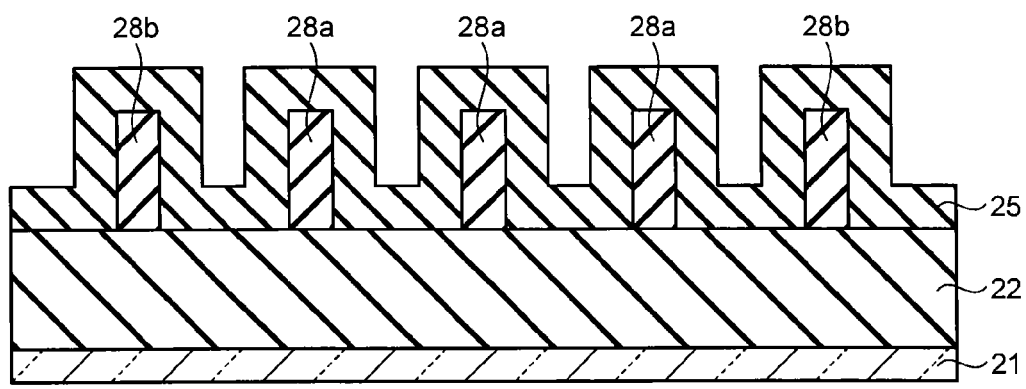
Figure 29C:
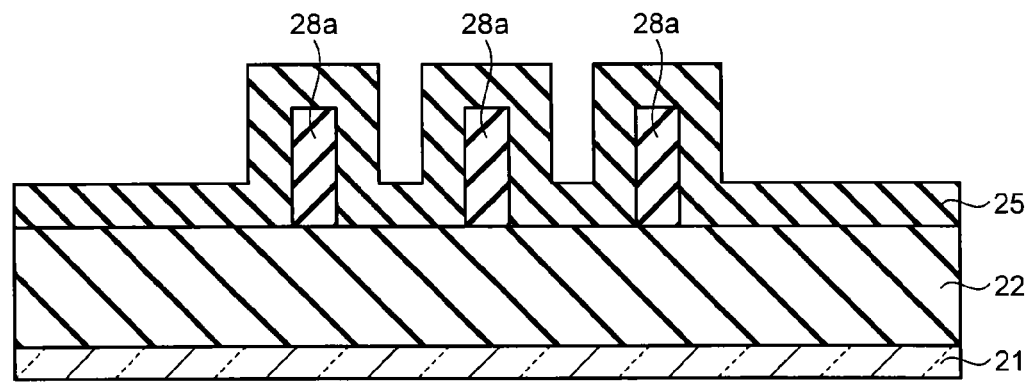

Next, as illustrated in FIGS. 29A to 29C, a sidewall film 25 is formed on the entire surface of the interlayer insulating film 22. The sidewall film 25 is formed to conformally coat the resist patterns 28a and 28b formed on the interlayer insulating film 22. A low-temperature oxide film or a low-temperature nitride film, which can be formed at room temperature different from the resist pattern 28 and the interlayer insulating film 22, can be used as the sidewall film 25. The thickness can be set to be almost equal to the width of the resist pattern 28 in the x direction.

Figure 30A:
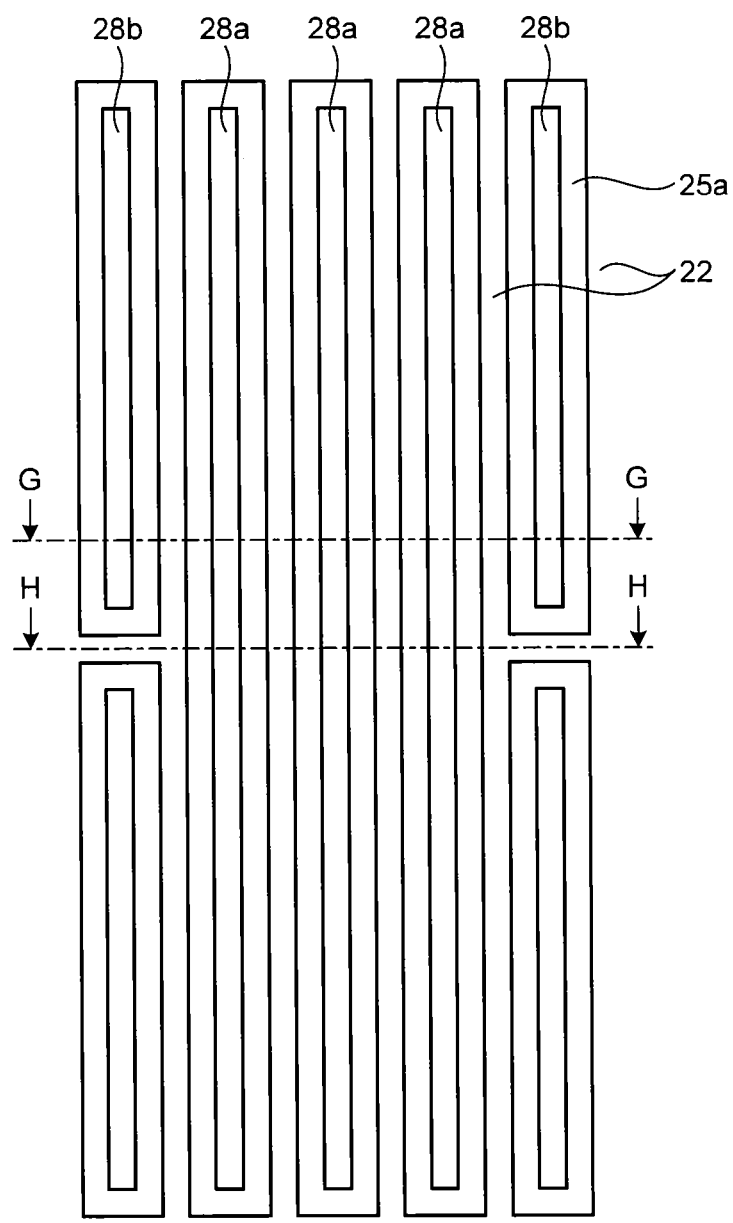
Figure 30B:
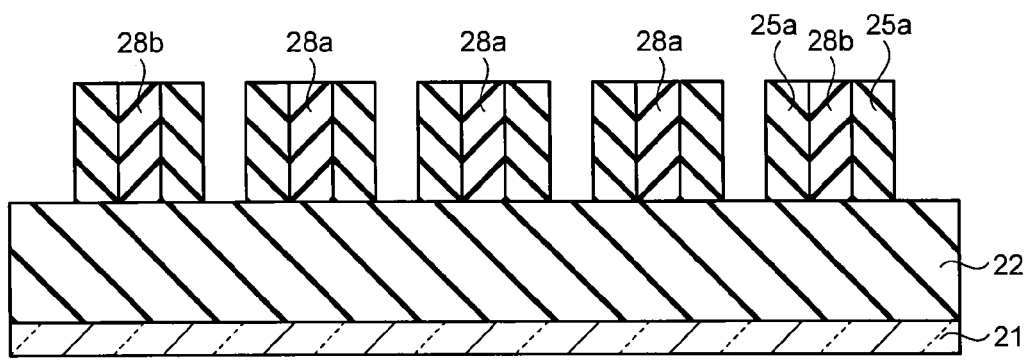
Figure 30C:
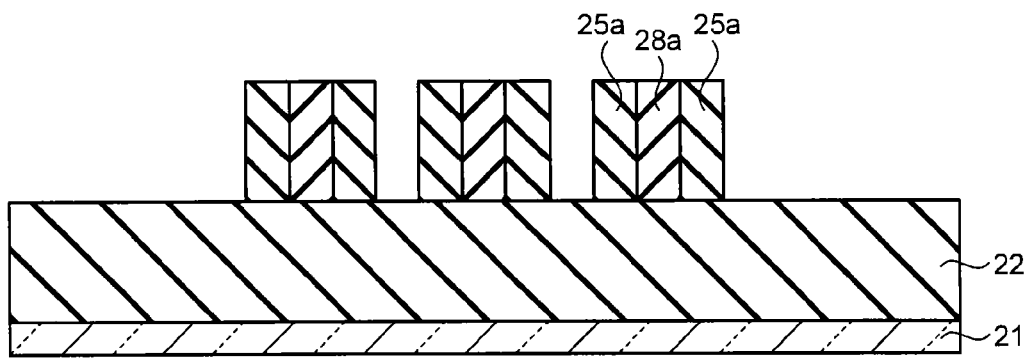

Then, as illustrated in FIGS. 30A to 30C, the formed sidewall film 25 is etched back until the top surface of the resist patterns 28a and 28b and the top surface of the interlayer insulating film 22 are exposed by the anisotropic etching such as RIE process. According to this process, the top surface of the resist patterns 28a and 28b and the top surface of the interlayer insulating film 22 are exposed, and a sidewall pattern 25a that is a loop-shaped sidewall film 25 is left around the resist patterns 28a and 28b.

Figure 31A:
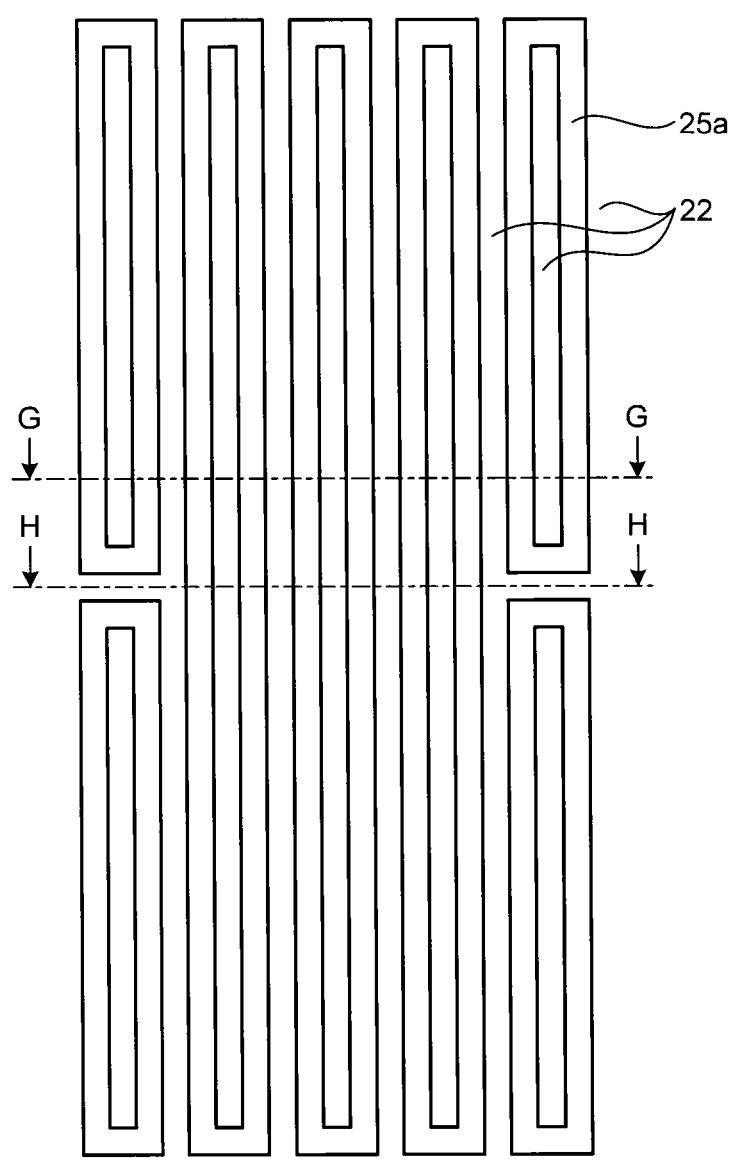
Figure 31B:
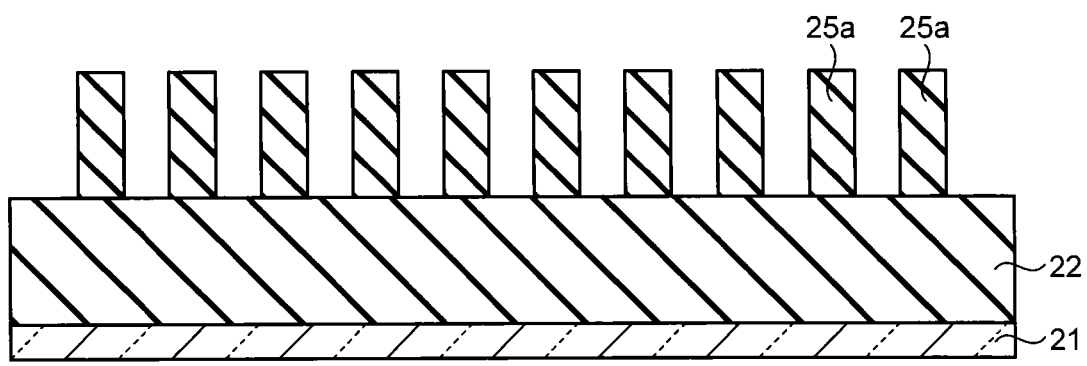
Figure 31C:
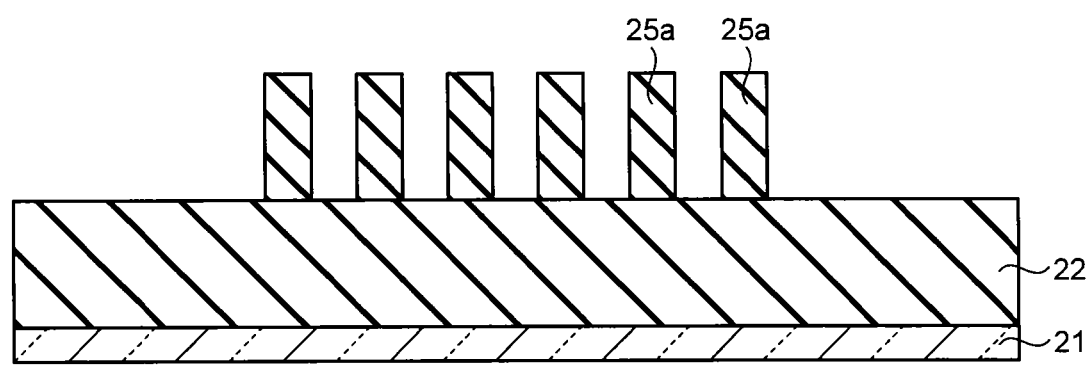
Figure 32A:
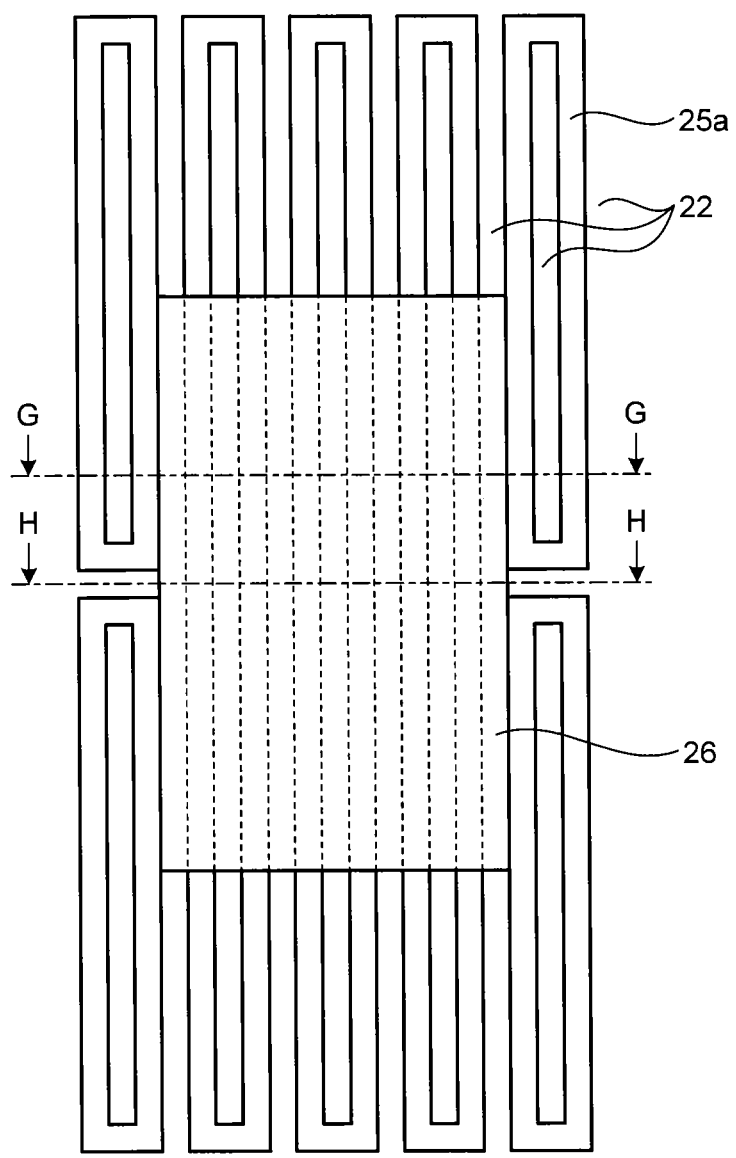
Figure 32B:
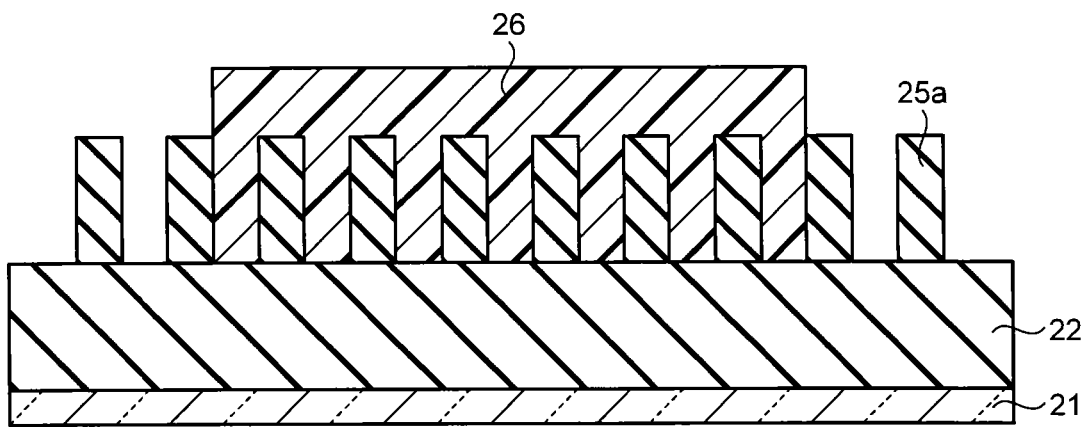
Figure 32C:
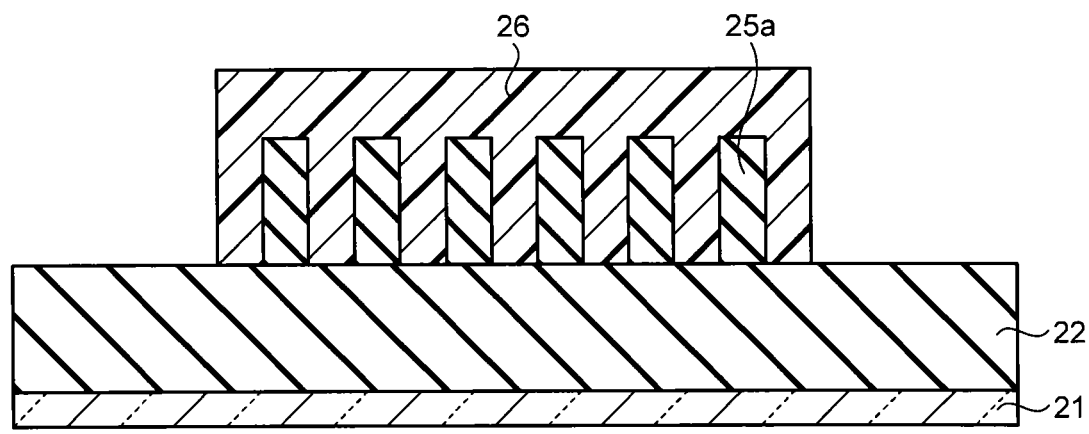

Then, as illustrated in FIGS. 31A to 31C, the resist patterns 28a and 28b are removed by the etching process. Thus, the loop-shaped sidewall pattern 25a is left on the interlayer insulating film 22. As the method of removing the resist patterns 28a and 28b, the wet etching process, the RIE process, or the Asher process can be used.

Then, as illustrated in FIGS. 32A to 32D, a resist film is applied on the interlayer insulating film 22 on which the sidewall pattern 25a is formed, an exposure process is performed by the lithography technique, and a development process is performed. Thus, the resist pattern 26 is formed to cover the sidewall pattern 25a in the region including the position corresponding to the separated line patterns between a pair of separated line patterns. The resist pattern 26 covers the region between a pair of separated sidewall patterns 25a to cover the portion that is to become a metal wiring portion, whereby the metal wiring can be separated.

Figure 33A:
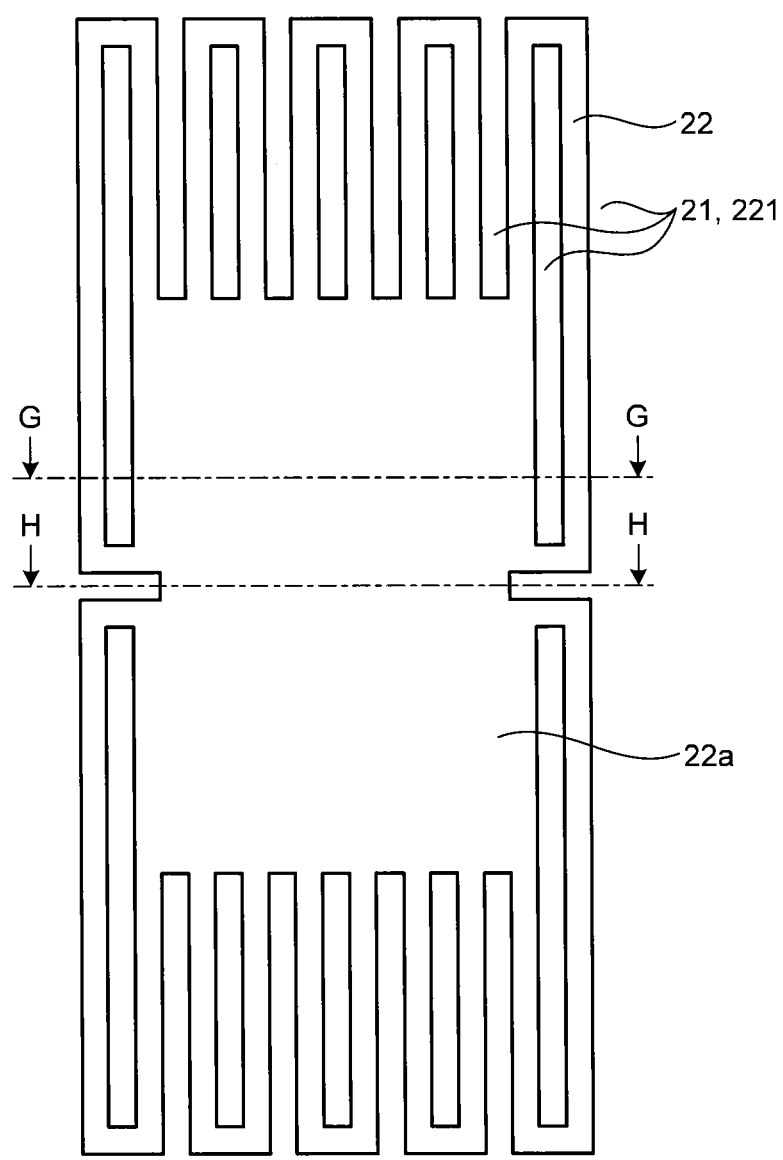
Figure 33B:
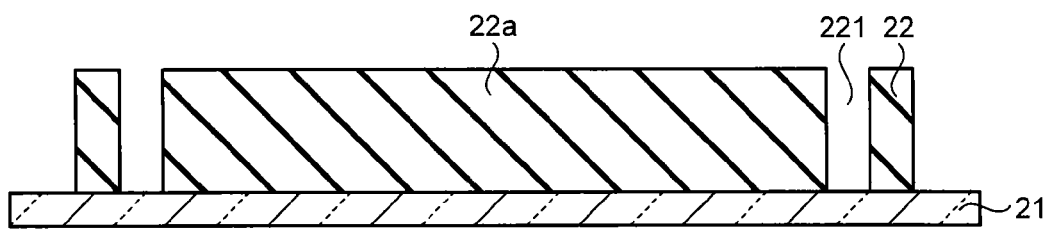
Figure 33C:
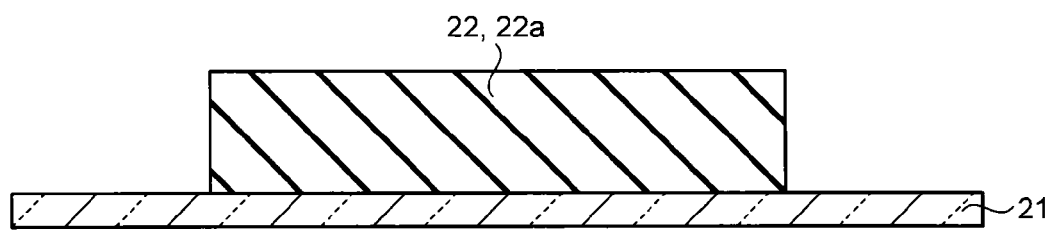

Next, as illustrated in FIGS. 33A to 33C, the interlayer insulating film 22 is etched by using the sidewall pattern 25a and the resist pattern 26 as a mask. According to this process, a wiring-forming channel 221 is formed on the interlayer insulating film 22. A pattern 22a for separating the wiring-forming channel 221 is formed on the position where the resist pattern 26 is formed.

Figure 34A:
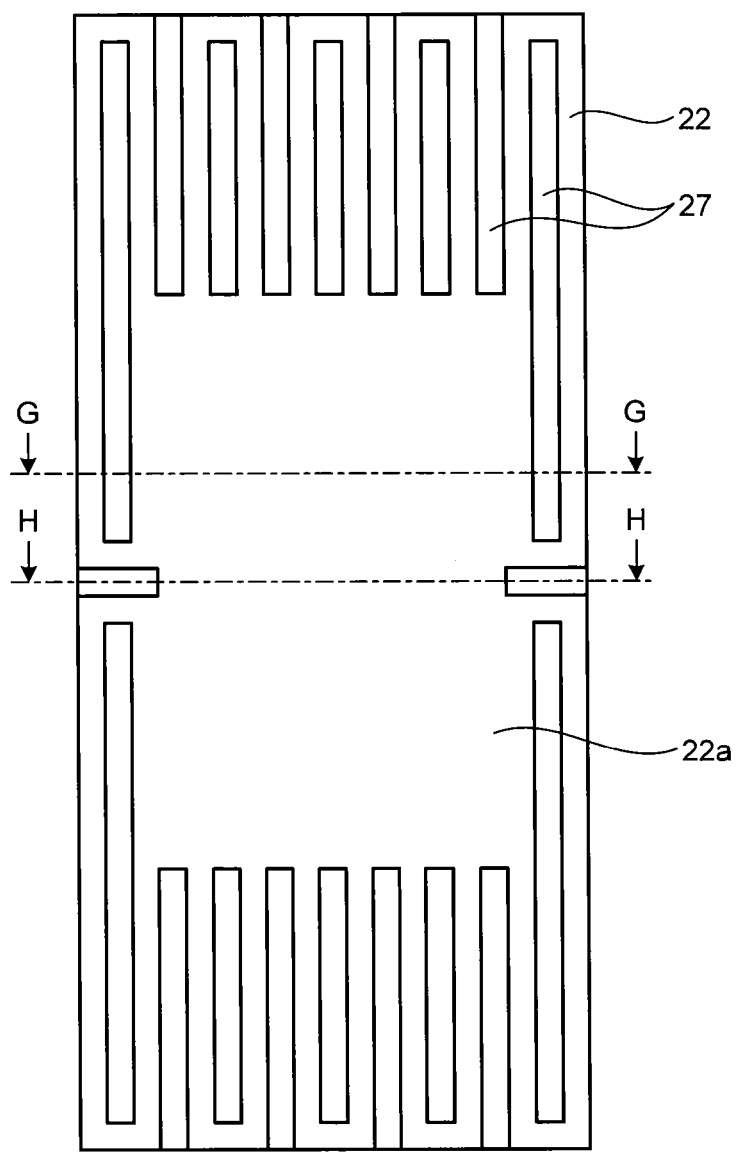
Figure 34B:
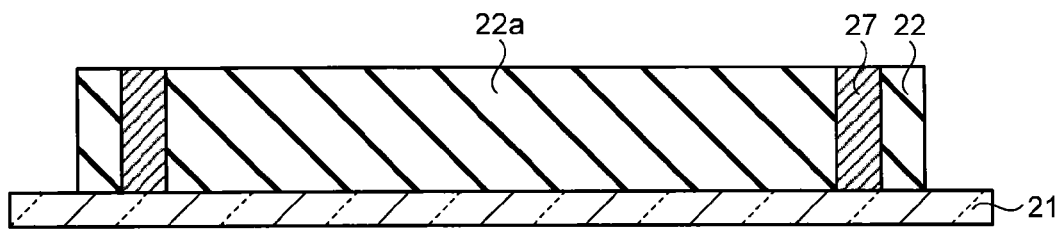
Figure 34C:
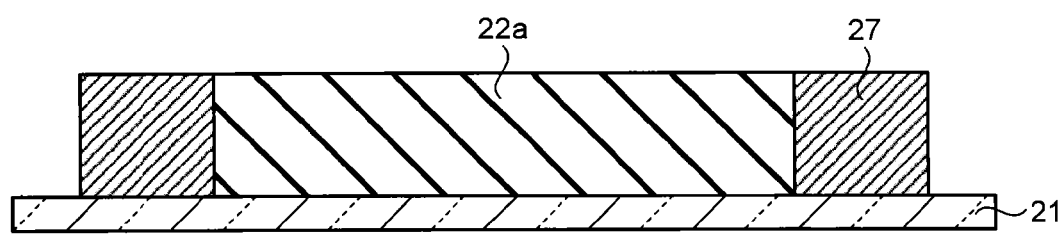

As illustrated in FIGS. 34A to 34C, a barrier metal film for preventing the diffusion of the metal that is to become the metal wiring and a seed film serving as a conductive layer upon a plating process are formed in the wiring-forming channel 221, and then, a metal film is formed by the plating process. Cu, Al, or W can be used as the metal film. The top surface of the metal film is higher than the top surface of the interlayer insulating film 22. Therefore, a metal wiring 27 is formed by an etch-back process so that the metal film is embedded into the wiring-forming channel 221. As described above, the pattern forming method according to the fourth embodiment is finished.

In the description above, the pattern is formed by the method according to the second embodiment. However, the pattern may be formed by the method according to the first embodiment.

In the fourth embodiment, the resist pattern 28 is formed by using the mask in which a pair of line patterns 11a is separated, the pair of line patterns 11a being located on both sides in the direction perpendicular to the extending direction of the line pattern on the region where the metal wiring 27 is to be separated. After the sidewall process is applied, the resist pattern 26 is arranged on the region sandwiched between the sidewall patterns 25a corresponding to the pair of separated line patterns. With this process, the region of the pattern vertical to the line patterns 11 and 11a on the mask is not formed. Therefore, the fourth embodiment brings an effect of further enhancing the margin in the lithography process, compared to the first to third embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask comprising:
   a mask pattern in which line patterns and space patterns are alternately arranged in a crossing direction, the crossing direction being a direction that crosses an extending direction of the line patterns, the mask pattern forming a line-and-space pattern above an object to be processed;
   a separation portion that separates the line patterns in a predetermined region in the mask pattern; and
   a connection pattern arranged in the crossing direction, the connection pattern connecting the separated line patterns, wherein
   the connection pattern is arranged at a position in which ends of the line patterns that are separated by the separation portion project with respect to the connection pattern.

2. The mask according to claim 1, wherein the connection pattern connects either one of non-separated line patterns located in the crossing direction and the separated line pattern, when one line pattern is separated.

3. The mask according to claim 1, wherein the connection pattern also connects the separated line pattern, which is located above the outermost side in the crossing direction, out of the separated line patterns connected by the connection pattern, and a non-separated line pattern located to be adjacent to the line pattern in the crossing direction.

4. The mask according to claim 1, wherein the line patterns and the space patterns are inverted.

5. The mask according to claim 1, wherein, when the mask pattern is transferred by a lithography process, a half pitch of the mask pattern is 80 nm or less.

6. A mask used in lithography, comprising:
   a line-and-space mask pattern; and
   a separation portion that separates a pair of line patterns, which are located on both ends of a region, where one or more line patterns are arranged, in a direction perpendicular to an extending direction of the one or more line patterns, in the line-and-space mask pattern, wherein
   a mask has a mask pattern forming a line-and-space pattern above an object to be processed.

7. The mask according to claim 6, wherein, when the mask pattern is transferred by a lithography process, a half pitch of the line-and-space mask pattern is 80 nm or less.

* * * * *